US012696486B2

(12) United States Patent
Noh et al.

(10) Patent No.: US 12,696,486 B2
(45) Date of Patent: Jul. 28, 2026

(54) INTEGRATED CIRCUIT DEVICE

(71) Applicant: Samsung Electronics Co., Ltd.,
Suwon-si (KR)

(72) Inventors: Hyunho Noh, Suwon-si (KR); Ilgyou Shin, Suwon-si (KR); Sangyong Kim, Suwon-si (KR); Youbin Kim, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 369 days.

(21) Appl. No.: 18/454,112

(22) Filed: Aug. 23, 2023

(65) Prior Publication Data

US 2024/0250135 A1 Jul. 25, 2024

(30) Foreign Application Priority Data

Jan. 19, 2023 (KR) ........................ 10-2023-0008101

(51) Int. Cl.
H10D 30/67 (2025.01)
H10D 30/01 (2025.01)
(Continued)

(52) U.S. Cl.
CPC ....... H10D 30/6729 (2025.01); H10D 30/014 (2025.01); H10D 30/43 (2025.01);
(Continued)

(58) Field of Classification Search
CPC .. H10D 30/6729; H10D 30/014; H10D 30/43; H10D 30/6735; H10D 62/121;
(Continued)

(56) References Cited

U.S. PATENT DOCUMENTS 7,282,444 B2 10/2007 Tanida et al.
10,734,412 B2 8/2020 Glass et al.
(Continued)

FOREIGN PATENT DOCUMENTS

JP      2005-167093 A      6/2005
KR      10-2022-0029302 A      3/2022
KR      10-2022-0104617 A      7/2022

*Primary Examiner* — Allison Bernstein
(74) *Attorney, Agent, or Firm* — Wolf, Greenfield & Sacks, P.C.

(57) ABSTRACT

An integrated circuit device includes an insulating structure, a source/drain region on the insulating structure, a pair of bottom semiconductor sheets being spaced apart from each other with the source/drain region therebetween in a first horizontal direction, a pair of channel regions spaced apart from the insulating structure with the bottom semiconductor sheets therebetween, a pair of gate lines respectively extending on the pair of channel regions on the bottom semiconductor sheets and extending longitudinally in a second horizontal direction perpendicular to the first horizontal direction, and a backside contact structure extending through the insulating structure to contact a bottom surface of the source/drain region, the backside contact structure including a first contact portion that has a width in the first horizontal direction increasing toward the source/drain region and a second contact portion that has a width in the first horizontal direction decreasing toward the source/drain region.

19 Claims, 61 Drawing Sheets

100

(51) Int. Cl.
  *H10D 30/43* (2025.01)
  *H10D 62/10* (2025.01)
  *H10D 64/01* (2025.01)
  *H10W 20/41* (2026.01)

(52) U.S. Cl.
  CPC ....... *H10D 30/6735* (2025.01); *H10D 62/121*
    (2025.01); *H10D 64/01* (2025.01); *H10D*
    *64/017* (2025.01); *H10W 20/427* (2026.01)

(58) Field of Classification Search
  CPC .. H10D 64/01; H10D 64/017; H10D 30/6757;
    H10D 30/797; H10D 62/151; H10D
    62/822; H10D 64/251; H10D 64/254;
    H10D 64/256; H10D 62/118; H10D
    62/124; H10D 64/20; H10D 84/834;
    H01L 23/5286; H01L 21/76897; H01L
    23/528; H01L 23/5226; H01L 23/5283;
    H10W 20/427; H10W 20/069; H10W
    20/43; H10W 20/42; H10W 20/435
  See application file for complete search history.

(56)                    References Cited

U.S. PATENT DOCUMENTS

| 11,233,005 | B1 * | 1/2022 | Chen | ................. | H10D 84/0158 |
| 11,437,480 | B2 * | 9/2022 | Chen | ................... | H10D 30/014 |
| 11,588,050 | B2 | 2/2023 | Yu et al. | | |
| 2021/0111115 | A1 | 4/2021 | Morrow et al. | | |
| 2021/0313391 | A1 | 10/2021 | Kumar et al. | | |
| 2021/0351303 | A1 | 11/2021 | Ju et al. | | |
| 2021/0399099 | A1 | 12/2021 | Chu et al. | | |
| 2022/0230947 | A1 | 7/2022 | Park et al. | | |

* cited by examiner

X1 – X1'

Y2 – Y2'

X1 – X1'

X1 – X1'

Y1 – Y1'

Y1 – Y1'

X1 – X1'

Y1 – Y1'

Y1 – Y1'

X1 – X1'

Y1 – Y1'

Y2 – Y2'

X1 – X1'

Y1 – Y1'

X1 − X1'

Y2 – Y2'

X1 – X1'

Y2 – Y2'

X1 – X1'

Y1 – Y1'

Y2 – Y2'

X1 − X1'

Y1 – Y1'

Y2 − Y2'

X1 – X1'

Y1 – Y1'

Y2 – Y2'

X1 – X1'

Y1 – Y1'

X1 – X1'

Y1 − Y1'

X1 – X1'

Y1 – Y1'

INTEGRATED CIRCUIT DEVICE

CROSS-REFERENCE TO RELATED APPLICATION

This application is based on and claims priority under 35 U.S.C. § 119 to Korean Patent Application No. 10-2023-0008101, filed on Jan. 19, 2023, in the Korean Intellectual Property Office, the disclosure of which is incorporated by reference herein in its entirety.

BACKGROUND

The inventive concept relates to an integrated circuit (IC) device, and more particularly, to an IC device including a backside contact structure.

Due to the development of electronics technology, the downscaling of IC devices has rapidly progressed. Because highly downscaled IC devices with both a high operating speed and high operating accuracy are desirable, wiring structures including conductive lines having a stable and optimized arrangement structure within a relatively small area are beneficial.

SUMMARY

The inventive concept provides an integrated circuit (IC) device including a plurality of wiring structures arranged in a reduced area with the downscaling trend. The IC device may have a structure capable of reducing or inhibiting a parasitic capacitance from occurring by ensuring a sufficient insulation distance between respective wiring structures and may have a structure in which wirings configured to supply power and/or signals to source/drain regions of the IC device may be easily formed.

According to an aspect of the inventive concept, there is provided an IC device including an insulating structure, a source/drain region on the insulating structure, a pair of bottom semiconductor sheets on the insulating structure, the pair of bottom semiconductor sheets being spaced apart from each other with the source/drain region therebetween in a first horizontal direction, a pair of channel regions spaced apart from the insulating structure with the pair of bottom semiconductor sheets therebetween, a pair of gate lines respectively extending on (e.g., respectively surrounding) the pair of channel regions on the pair of bottom semiconductor sheets, the pair of gate lines extending longitudinally in a second horizontal direction, wherein the second horizontal direction is perpendicular to the first horizontal direction, and a backside contact structure extending through the insulating structure in a vertical direction and contacting a bottom surface of the source/drain region, the backside contact structure including a first contact portion that has a width in the first horizontal direction increasing toward the source/drain region and a second contact portion that has a width in the first horizontal direction decreasing toward the source/drain region.

According to another aspect of the inventive concept, there is provided an IC device including an insulating structure, a plurality of bottom semiconductor sheets on the insulating structure, the plurality of bottom semiconductor sheets being spaced apart from each other, a plurality of channel regions on the plurality of bottom semiconductor sheets, the plurality of channel regions overlapping the plurality of bottom semiconductor sheets in a vertical direction, respectively, a plurality of source/drain regions respectively on a pair of bottom semiconductor sheets, which are selected from the plurality of bottom semiconductor sheets and are adjacent to each other in a first horizontal direction, and each of the plurality of source/drain regions being in contact with a respective one of channel region of the plurality of channel regions, a plurality of gate lines extending on (e.g., surrounding) the plurality of channel regions, and a backside contact structure extending through the insulating structure in the vertical direction and contacting a bottom surface of a first source/drain region of the plurality of source/drain regions, the backside contact structure including a first contact portion that has a width in the first horizontal direction increasing toward the first source/drain region and a second contact portion that has a width in the first horizontal direction decreasing toward the first source/drain region.

According to another aspect of the inventive concept, there is provided an IC device including an insulating structure, a plurality of source/drain regions on the insulating structure, a plurality of nanosheet stacks, each of the plurality of nanosheet stacks including at least one nanosheet connected to at least one source/drain region of the plurality of source/drain regions, a plurality of bottom semiconductor sheets between the insulating structure and the plurality of nanosheet stacks, the plurality of bottom semiconductor sheets being spaced apart from each other, a plurality of gate lines on the plurality of bottom semiconductor sheets, each of the plurality of gate lines extending on (e.g., surrounding) the at least one nanosheet, and a backside contact structure passing through the insulating structure in a vertical direction, the backside contact structure being in contact with a bottom surface of a first source/drain region of the plurality of source/drain regions, and the backside contact structure including a first contact portion that has a width in a first horizontal direction increasing toward the first source/drain region and a second contact portion that has a width in the first horizontal direction decreasing toward the source/drain region, wherein a bottom surface of a second source/drain region that is one of the plurality of source/drain regions and is spaced apart from the first source/drain region is in contact with the insulating structure.

BRIEF DESCRIPTION OF THE DRAWINGS

Example embodiment of the inventive concept will be more clearly understood from the following detailed description taken in conjunction with the accompanying drawings in which:

FIGS. 11A to 29B are diagrams illustrating a method of manufacturing an IC device, according to some embodiments, wherein FIGS. 11A, 12A, 13A, 15A, 16A, 17A, 18A, 19A, 20A, 21A, 24A, 25A, 26A, 27A, 28A, and 29A are cross-sectional views of a portion corresponding to the cross-section taken along line X1-X1' of FIG. 2, FIGS. 11B, 12B, 13B, 14, 15B, 16B, 17B, 18B, 19B, 20B, 21B, 22, 23, 24B, 25B, 26B, 27B, 28B, and 29B are cross-sectional views of a portion corresponding to the cross-section taken along line Y1-Y1' of FIG. 2, FIGS. 13C, 15C, 16C, 17C, 18C, 20C, 21C, 24C, 25C, 26C, and 27C are cross-sectional views of a portion corresponding to the cross-section taken along line Y2-Y2' of FIG. 2, and FIGS. 12C, 21D, and 24D are plan views of a backside of portion "BSX" of FIG. 2.

DETAILED DESCRIPTION

Figure 1:
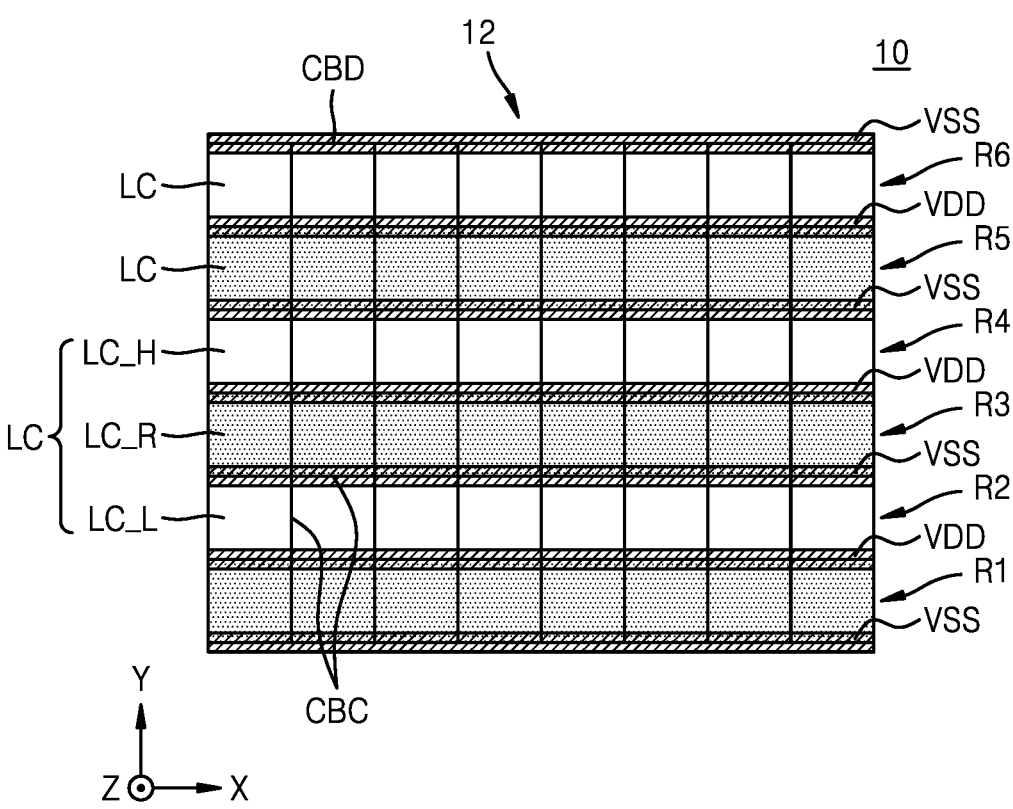
FIG. 1 is a plan layout diagram of a cell block of an integrated circuit (IC) device according to some embodiments.

Hereinafter, example embodiments will be described in detail with reference to the accompanying drawings. The same reference numerals are used to denote the same elements in the drawings, and repeated descriptions thereof are omitted.

FIG. 1 is a plan layout diagram of a cell block 12 of an integrated circuit (IC) device 10 according to some embodiments.

Referring to FIG. 1, the cell block 12 of the IC device 10 may include a plurality of logic cells LC, which include circuit patterns configured to constitute various circuits. The plurality of logic cells LC may be arranged in a matrix form in a widthwise direction (e.g., X direction of FIG. 1, also referred to as a first horizontal direction or a first lateral direction) and a height direction (e.g., Y direction of FIG. 1, also referred to as a second horizontal direction or a second lateral direction) in the cell block 12. In some embodiments, the widthwise direction may be perpendicular to the height direction.

Each of the plurality of logic cells LC may include a circuit pattern having a layout designed according to a place-and-route (PnR) technique to perform at least one logic function. The plurality of logic cells LC may perform various logic functions. In some embodiments, the plurality of logic cells LC may respectively include a plurality of standard cells. In some embodiments, at least some of the plurality of logic cells LC may perform the same logic function. In some other embodiments, at least some of the plurality of logic cells LC may perform different logic functions.

The plurality of logic cells LC may include various kinds of logic cells including a plurality of circuit elements. For example, each of the plurality of logic cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of logic cells LC that form one row R1, R2, R3, R4, R5, or R6 in the widthwise direction (e.g., X direction of FIG. 1) may have the same width as each other. Also, at least some of the plurality of logic cells LC that form one row R1, R2, R3, R4, R5, or R6 may have the same height as each other. However, the inventive concept is not limited to the illustration in FIG. 1, and at least some of the plurality of logic cells LC that form one row R1, R2, R3, R4, R5, or R6 may have different widths and heights from each other.

An area of each of the plurality of logic cells LC included in the cell block 12 of the IC device 10 may be defined by a cell boundary CBD. A cell boundary contact portion CBC where respective cell boundaries CBD of two logic cells LC that are adjacent to each other in the widthwise direction (e.g., X direction of FIG. 1) or the height direction (e.g., Y direction of FIG. 1), from among the plurality of logic cells LC, meet each other may be between the two adjacent logic cells LC.

In some embodiments, from among the plurality of logic cells LC that form one row R1, R2, R3, R4, R5, or R6, two logic cells LC that are adjacent to each other in the widthwise direction may contact each other at the cell boundary contact portion CBC without a space therebetween. In some other embodiments, from among the plurality of logic cells LC that form one row R1, R2, R3, R4, R5, or R6, two logic cells LC that are adjacent to each other in the widthwise direction may be spaced apart from each other by a predetermined distance.

In some embodiments, from among the plurality of logic cells LC that form one row R1, R2, R3, R4, R5, or R6, two adjacent logic cells LC may perform the same function as each other. In this case, the two adjacent logic cells LC may have the same structure as each other. In some other embodiments, from among the plurality of logic cells LC that form one row R1, R2, R3, R4, R5, or R6, two adjacent logic cells may perform different functions from each other.

In some embodiments, one logic cell LC, which is selected from the plurality of logic cells LC included in the cell block 12 of the IC device 10, may have a symmetrical structure to another logic cell LC, which is adjacent to the selected logic cell LC in the height direction (e.g., Y direction of FIG. 1), about the cell boundary contact portion CBC therebetween. For example, a reference logic cell LC_R in the third row R3 may have a symmetrical structure with a lower logic cell LC_L in the second row R2 about the cell boundary contact portion CBC therebetween. Also, the reference logic cell LC_R in the third row R3 may have a symmetrical structure with an upper logic cell LC_H in the fourth row R4 about the cell boundary contact portion CBC therebetween.

Although FIG. 1 illustrates an example in which the cell block 12 includes six rows R1, R2, . . . , and R6, the inventive concept is not limited thereto. The cell block 12 may include various numbers of rows, which are selected as needed, and one row may include various numbers of logic cells, which are selected as needed.

A selected one of a plurality of ground lines VSS and a plurality of power lines VDD may be between a plurality of rows (e.g., R1, R2, R3, R4, R5, and R6), each of which includes a plurality of logic cells LC arranged in a line in the widthwise direction (e.g., X direction of FIG. 1). The plurality of ground lines VSS and the plurality of power lines VDD may each extend in the widthwise direction (e.g., X direction of FIG. 1) and may be alternately arranged and spaced apart from each other in the height direction (e.g., Y direction of FIG. 1). Accordingly, the plurality of ground lines VSS and the plurality of power lines VDD may each overlap the cell boundary CBD of the logic cell LC in the height direction (e.g., Y direction). As used herein, "an element A extends in a direction X" (or similar language) may mean that the element A extends longitudinally in the direction X.

Figure 2:
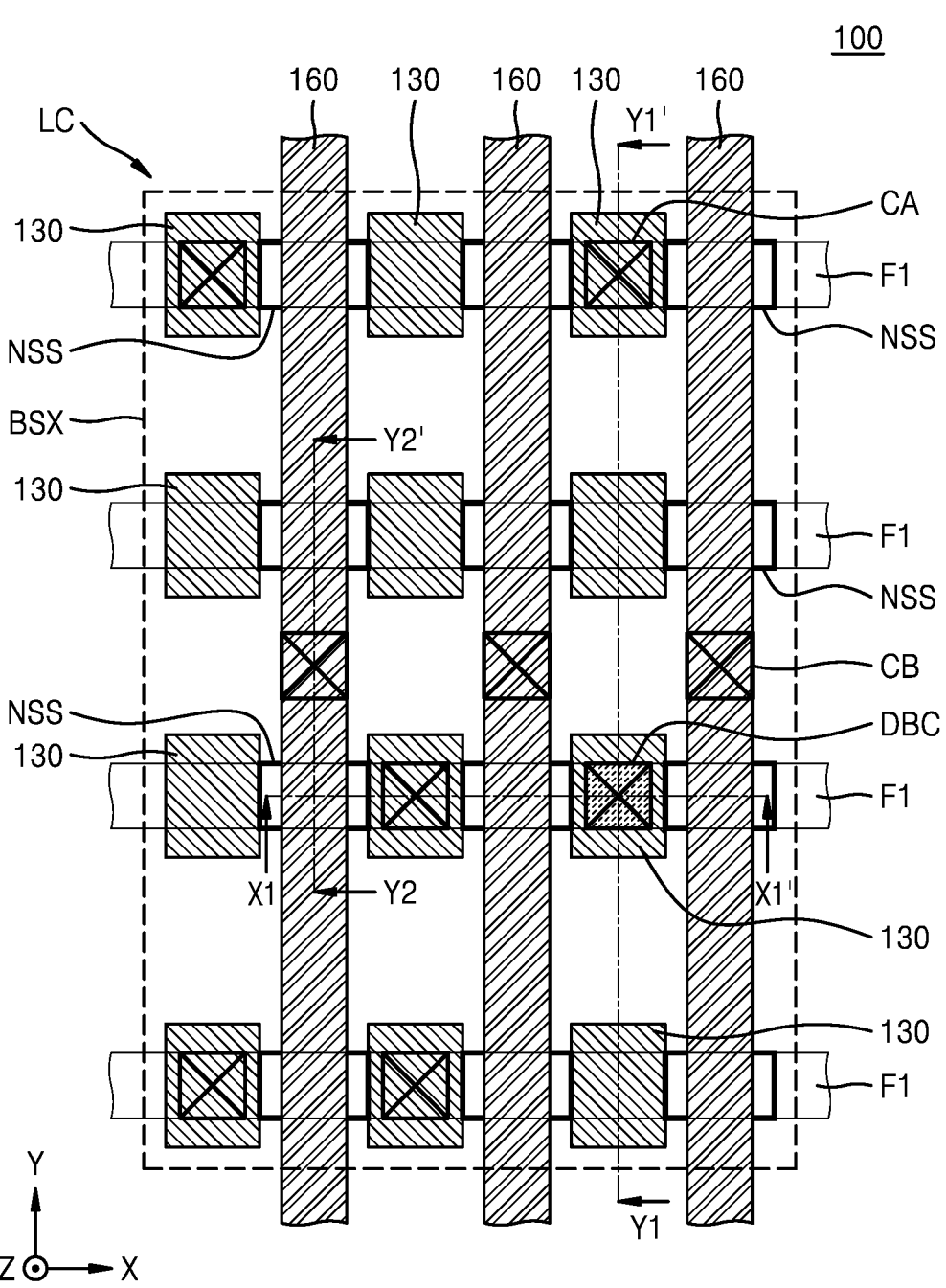
FIG. 2 is a plan layout diagram of an IC device according to some embodiments.
Figure 3A:
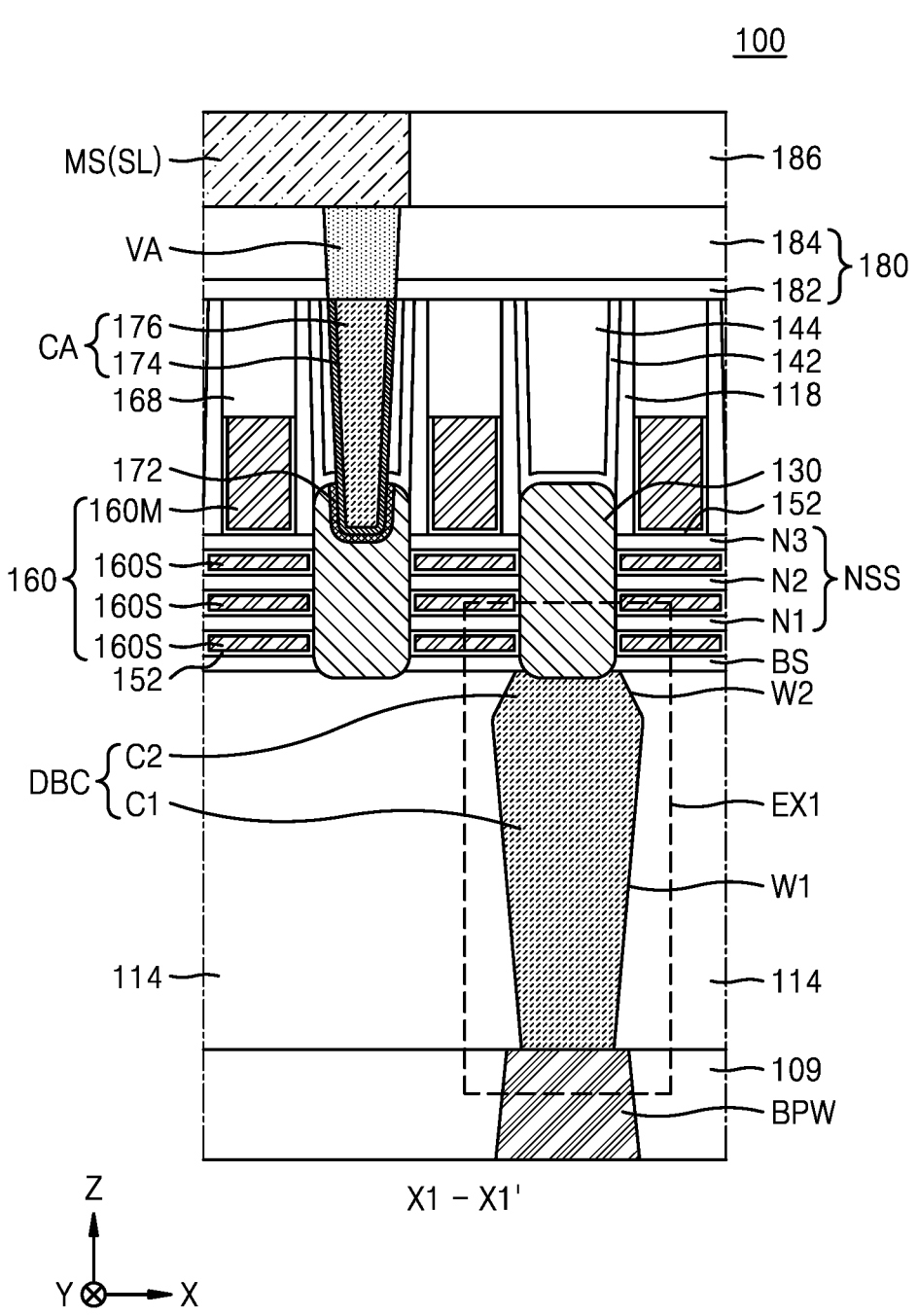
FIG. 3A is a cross-sectional view taken along line X1-X1' of FIG. 2 according to some embodiments.
Figure 3B:
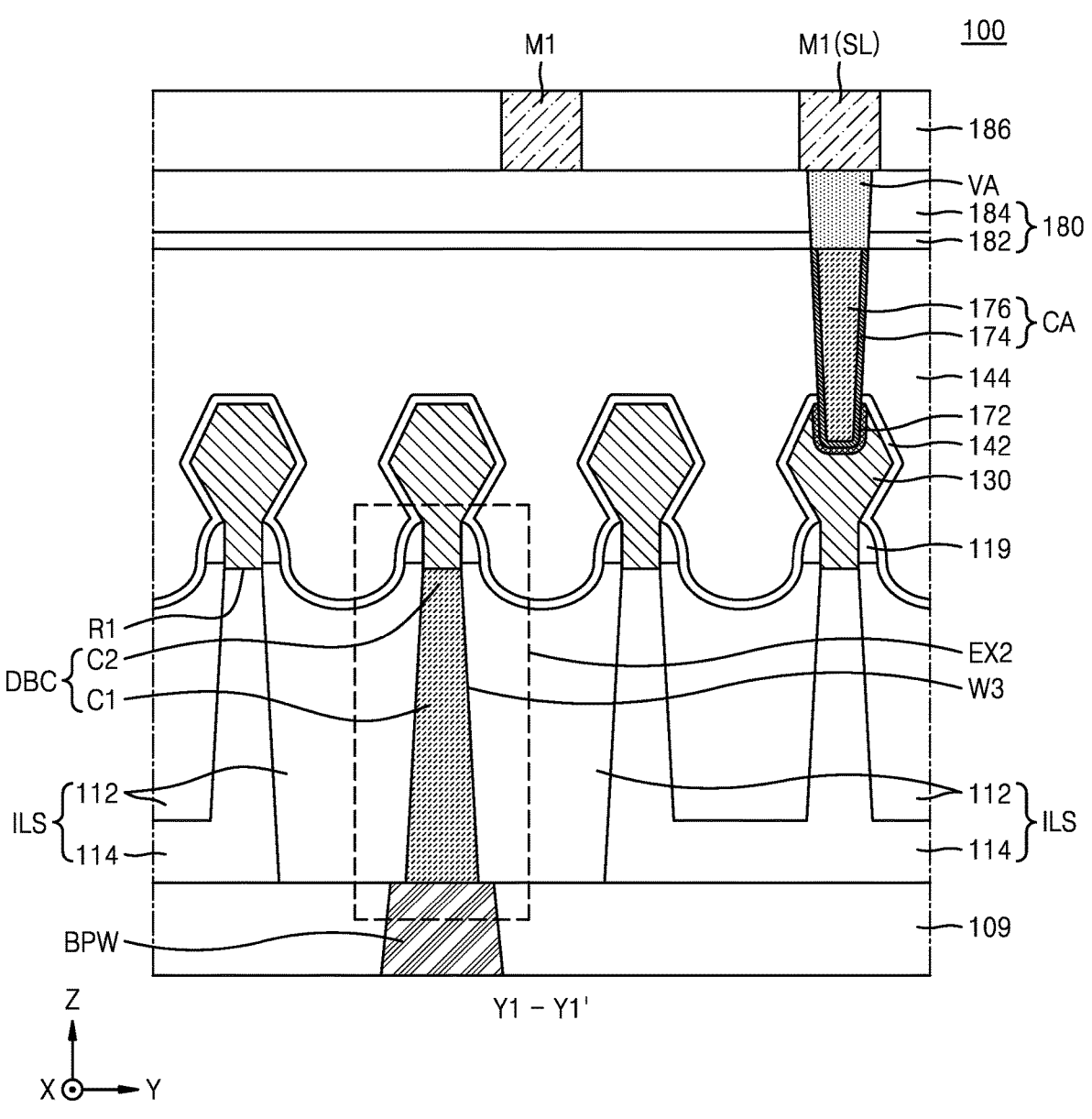
FIG. 3B is a cross-sectional view taken along line Y1-Y1' of FIG. 2 according to some embodiments.
Figure 3C:
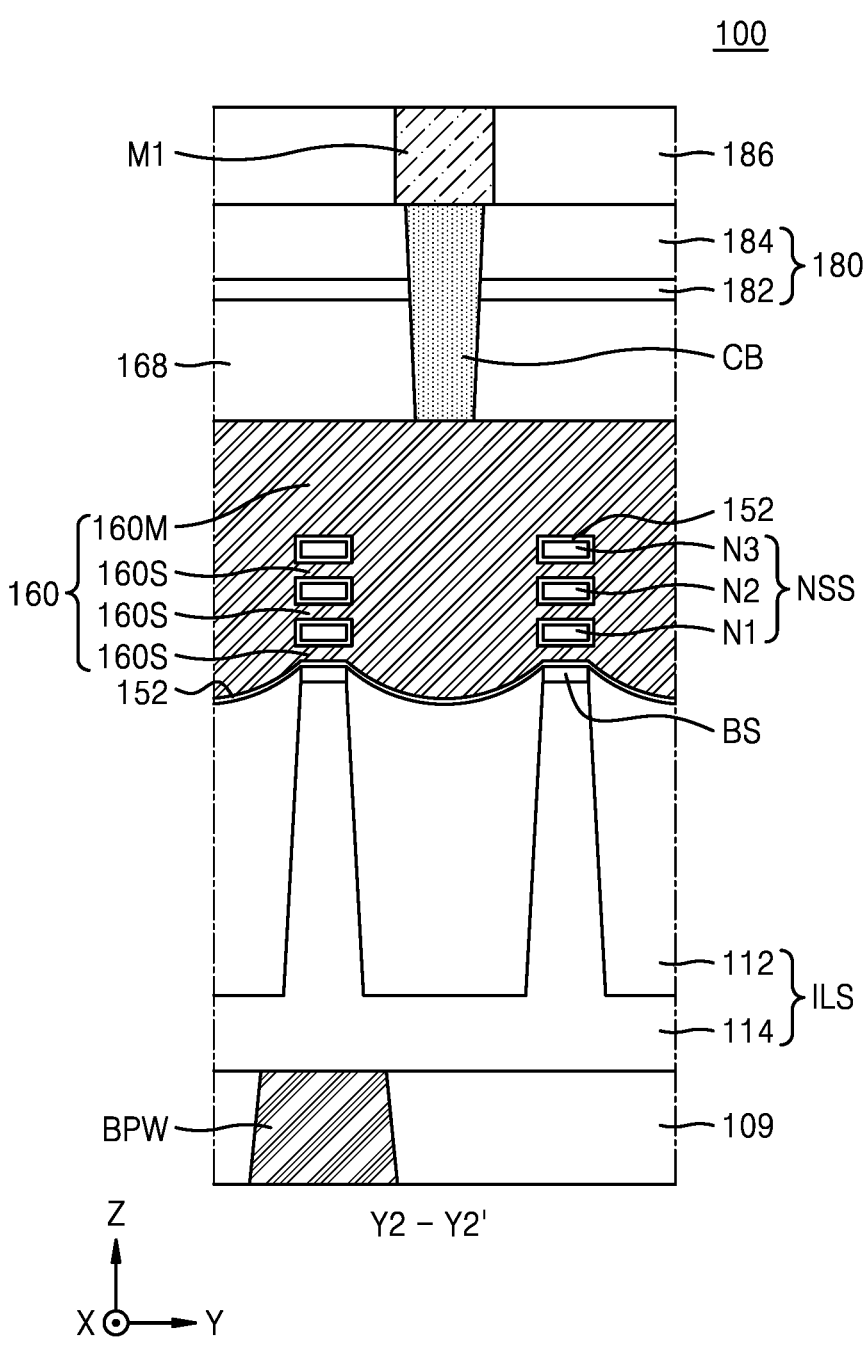
FIG. 3C is a cross-sectional view taken along line Y2-Y2' of FIG. 2 according to some embodiments.
Figure 4:
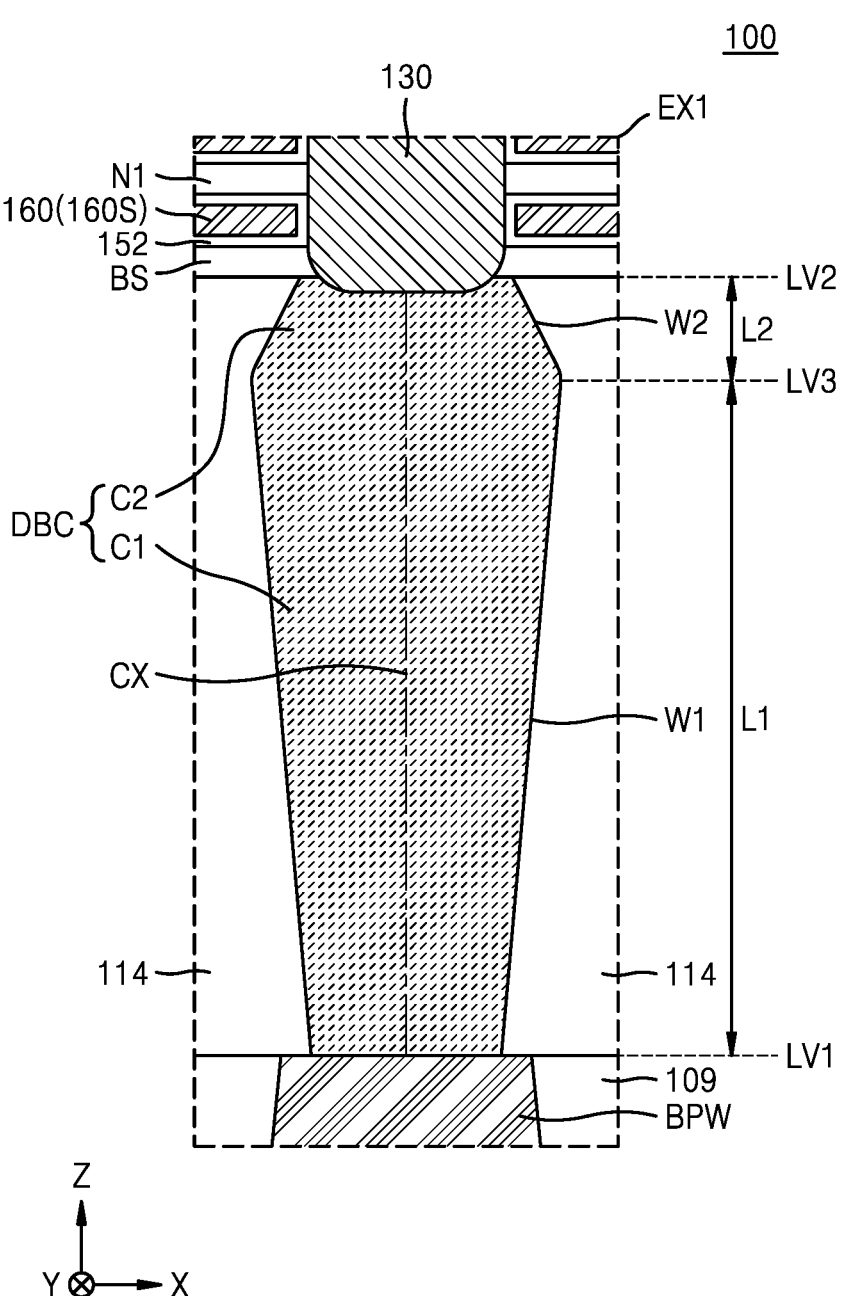
FIG. 4 is an enlarged cross-sectional view of portion "EX1" of FIG. 3A according to some embodiments.
Figure 5:
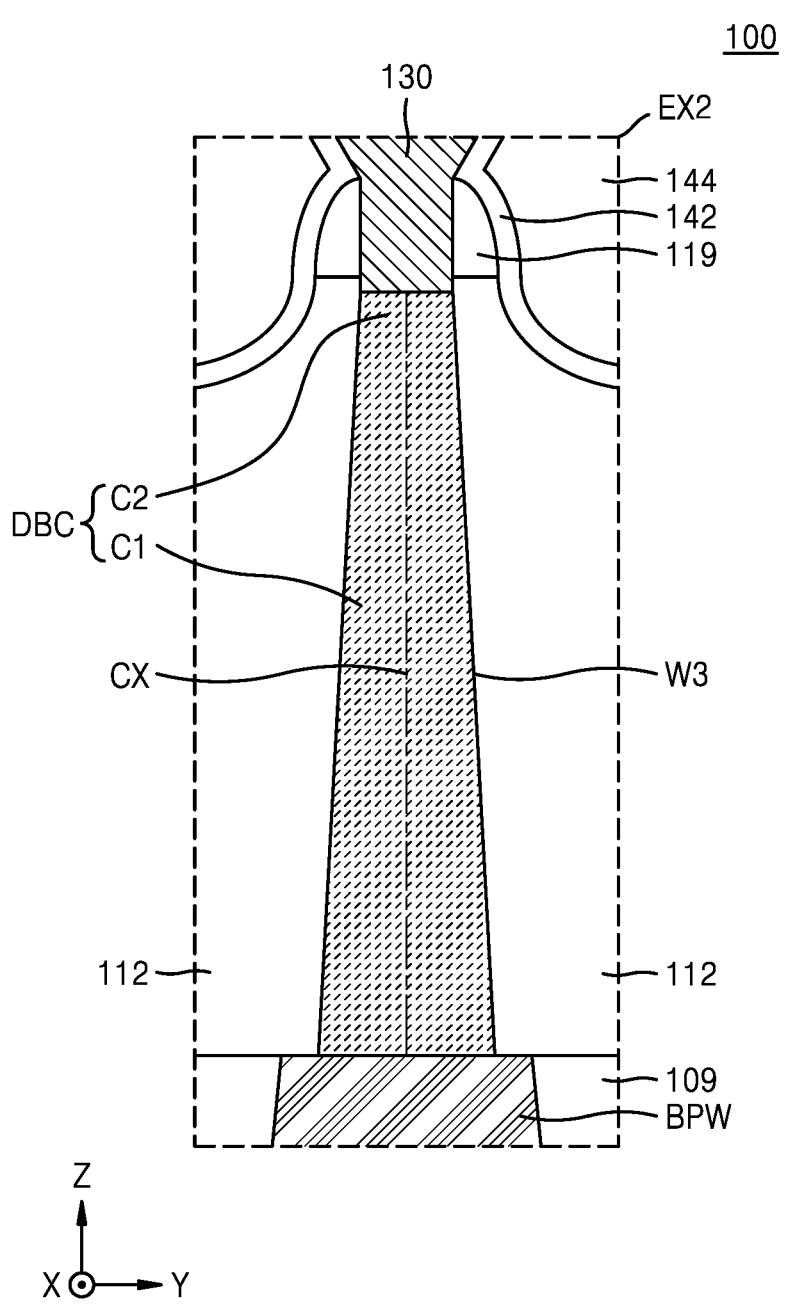
FIG. 5 is an enlarged cross-sectional view of portion "EX2" of FIG. 3B according to some embodiments.

FIG. 2 is a plan layout diagram of an IC device 100 according to some embodiments. FIG. 3A is a cross-sectional view taken along line X1-X1' of FIG. 2 according to some embodiments. FIG. 3B is a cross-sectional view taken along line Y1-Y1' of FIG. 2 according to some embodiments. FIG. 3C is a cross-sectional view taken along line Y2-Y2' of FIG. 2 according to some embodiments. FIG. 4 is an enlarged cross-sectional view of portion "EX1" of FIG. 3A according to some embodiments. FIG. 5 is an enlarged cross-sectional view of portion "EX2" of FIG. 3B according to some embodiments. The IC device 100 including a field-effect transistor (FET) having a gate-all-around structure including an active region of a nanowire or nanosheet type and a gate surrounding the active region is described with reference to FIGS. 2 to 5. The IC device 100 may constitute some of the plurality of logic cells LC shown in FIG. 1.

Referring to FIGS. 2 to 5, the IC device 100 may include an insulating structure ILS, a plurality of source/drain regions 130 on the insulating structure ILS, a plurality of bottom semiconductor sheets BS on the insulating structure ILS, a plurality of gate lines 160 on the plurality of bottom semiconductor sheets BS, and a backside contact structure DBC in (e.g., extending through) the insulating structure ILS in a vertical direction (e.g., Z direction). In some embodiments, the vertical direction may be perpendicular to the first and second horizontal directions.

The insulating structure ILS may include a plurality of first isolation insulating films 112 and a plurality of second isolation insulating films 114. The plurality of second isolation insulating films 114 may include portions, which protrude in the vertical direction (e.g., Z direction) toward a series of bottom semiconductor sheets BS, which are selected from the plurality of bottom semiconductor sheets BS and arranged in a line in a first lateral direction (e.g., X direction), and extend longitudinally in the first lateral direction (e.g., X direction). The plurality of first isolation insulating films 112 may include portions, which are respectively between the plurality of second isolation insulating films 114, and portions between portions of the plurality of second isolation insulating films 114, which extend longitudinally in the first lateral direction (e.g., X direction). In some embodiments, the plurality of first isolation insulating films 112 and the plurality of second isolation insulating films 114 may include the same material as each other. For example, the plurality of first isolation insulating films 112 and the plurality of second isolation insulating films 114 may include a silicon oxide film. In some other embodiments, the plurality of first isolation insulating films 112 and the plurality of second isolation insulating films 114 may include the same oxide film, and the density of the oxide film included in the plurality of first isolation insulating films 112 may be different from the density of the oxide film included in the plurality of second isolation insulating films 114. In still some other embodiments, the plurality of first isolation insulating films 112 and the plurality of second isolation insulating films 114 may include different materials from each other. For example, the plurality of first isolation insulating films 112 may include a silicon oxide film, and the plurality of second isolation insulating films 114 may include a silicon oxycarbide (SiOC) film, a silicon oxycarbonitride (SiOCN) film, a silicon oxynitride (SiON) film, a silicon nitride (SiN) film, or a combination thereof. As used herein, each of the terms "SiOC," "SiOCN," "SiON," and "SiN" refers to a material including elements included therein, without referring to a chemical formula representing a stoichiometric relationship. However, a constituent material of each of the plurality of first isolation insulating films 112 and the plurality of second isolation insulating films 114 is not limited to the examples described above and may be variously modified.

As shown in FIGS. 3A and 4, the plurality of second isolation insulating films 114 may include a pair of second isolation insulating films 114, which are in contact with both sidewalls of the backside contact structure DBC in the first lateral direction (e.g., X direction). Each of the pair of second isolation insulating films 114 may include a portion that extends longitudinally in a straight line in the first lateral direction (e.g., X direction). A top surface of each of the pair of second isolation insulating films 114 may be in contact with bottom surfaces of a series of bottom semiconductor sheets BS, which are selected from the plurality of bottom semiconductor sheets BS and arranged in a line in the first lateral direction (e.g., X direction).

As shown in FIGS. 3B and 5, the plurality of first isolation insulating films 112 may include a pair of first isolation insulating films 112, which are in contact with both sidewalls of the backside contact structure DBC in a second lateral direction (e.g., Y direction).

The plurality of bottom semiconductor sheets BS may be spaced apart from each other in a lateral direction (e.g., the first lateral direction (e.g., X direction) or the second lateral direction (e.g., Y direction)) and be arranged in a matrix form in a view from above (e.g., on an X-Y plane). The plurality of bottom semiconductor sheets BS may include a doped semiconductor material or an undoped semiconductor material. In some embodiments, the plurality of bottom semiconductor sheets BS may include doped silicon or undoped silicon.

One source/drain region 130 may be between two adjacent ones of the plurality of bottom semiconductor sheets BS in the first lateral direction (e.g., X direction). The one source/drain region 130 may be in contact with a pair of bottom semiconductor sheets BS, which are, respectively, adjacent to opposing sides to the one source/drain region 130 in the first lateral direction (e.g., X direction).

The backside contact structure DBC may be in contact with a bottom surface of a selected one of the plurality of source/drain regions 130. From among the plurality of source/drain regions 130, a bottom surface of the source/drain region 130, which is not in contact with the backside contact structure DBC, may be in contact with the insulating structure ILS. Portions of the insulating structure ILS, which are in contact with bottom surfaces of the plurality of source/drain regions 130, may include a second isolation insulating film 114. As used herein, from among the plurality of source/drain regions 130, a source/drain region 130 in contact with the backside contact structure DBC may be referred to as a first source/drain region, and a source/drain region 130 that is not in contact with the backside contact structure DBC may be referred to as a second source/drain region.

As illustrated in FIGS. 3A and 4, the backside contact structure DBC may include a first contact portion C1 that has a width in the first lateral direction (e.g., X direction) increasing toward the source/drain region 130 and a second contact portion C2 that has a width in the first lateral direction (e.g., X direction) decreasing toward the source/drain region 130. In the backside contact structure DBC, the first contact portion C1 may be integrally connected to the second contact portion C2. The second contact portion C2 may be in contact with a selected one of the plurality of source/drain regions 130. In the vertical direction (e.g., Z direction), the first contact portion C1 may be spaced apart from the source/drain region 130 with the second contact portion C2 therebetween. In some embodiments, the second contact portion C2 may be between the selected one of the plurality of source/drain regions 130 and the first contact portion C1 and may contact both the selected one of the plurality of source/drain regions 130 and the first contact portion C1. As used herein, "an element A integrally connected to an element B" (or similar language) may means that the element A and B directly contact each other without an intervening portion/element and may have a portion of an interface therebetween, which is not visible. Further, the element A and B may be formed through the same process (e.g., the same deposition process) and may include, respectively, portions of a single monolithic layer.

As shown in FIGS. 3A and 4, in the backside contact structure DBC, the first contact portion C1 may have a first sidewall W1 that is in contact with the second insolation insulating film 114 of the insulating structure ILS in the first lateral direction (e.g., X direction). The first sidewall W1 may include an inclined surface. A distance between the inclined surface of the first sidewall W1 and a central axis CX of the backside contact structure DBC, which extends in the vertical direction (e.g., Z direction), in the X direction may increase toward the source/drain region 130. As used herein, the inclined surface of the first sidewall W1 may be referred to as a first inclined surface. The second contact portion C2 may have a second sidewall W2 that is in contact with the second isolation insulating film 114 of the insulating structure ILS in the first lateral direction (e.g., X direction). The second sidewall W2 may include an inclined surface. A distance between the inclined surface of the second sidewall W2 and the central axis CX of the backside contact structure DBC in the X direction may decrease toward the source/drain region 130. As used herein, the inclined surface of the second sidewall W2 may be referred to as a second inclined surface. For brevity, in FIGS. 4 and 5, a position of the central axis CX of the backside contact structure DBC is indicated by an alternating long-short dashed line.

As shown in FIGS. 3B and 5, a width of each of the first contact portion C1 and the second contact portion C2 in the second lateral direction (e.g., Y direction) may decrease toward the source/drain region 130. The first contact portion C1 and the second contact portion C2 of the backside contact structure DBC may have a third sidewall W3 in contact with the first isolation insulating film 112 of the insulating structure ILS in the second lateral direction (e.g., Y direction). The third sidewall W3 may include an inclined surface. A distance between the inclined surface of the third sidewall W3 and the central axis CX of the backside contact structure DBC in the Y direction may decrease toward the source/drain region 130.

As shown in FIG. 4, a bottom surface of the backside contact structure DBC, which is farthest from the source/drain region 130, may be coplanar with a bottom surface of the insulating structure ILS and may be at a first vertical level LV1. A top surface of the backside contact structure DBC, which is adjacent to the source/drain region 130, may be at a second vertical level LV2, which is equal or similar to a vertical level of a top surface of the insulating structure ILS. In the vertical direction (e.g., Z direction), a distance L1 from the first vertical level LV1 of the bottom surface of the backside contact structure DBC to a third vertical level LV3 of an interface (e.g., a contact point) between the first sidewall W1 and the second sidewall W2 of the backside contact structure DBC may be greater (e.g., longer) than a distance L2 from the second vertical level LV2 of the top surface of the backside contact structure DBC to the third vertical level LV3 of the contact point.

A plurality of nanosheet stacks NSS may be on the plurality of bottom semiconductor sheets BS. Each of the plurality of nanosheet stacks NSS may include at least one nanosheet, which is spaced apart from a top surface of the bottom semiconductor sheet BS in the vertical direction (e.g., Z direction) and faces the top surface of the bottom semiconductor sheet BS. As used herein, the term "nanosheet" refers to a conductive structure having a cross-section that is substantially perpendicular to a direction in which current flows. The nanosheet may be interpreted as including a nanowire. As used herein, each of the nanosheet and the nanosheet stack NSS may be referred to as a channel region.

As shown in FIGS. 3A and 3C, each of the plurality of nanosheet stacks NSS may include a first nanosheet N1, a second nanosheet N2, and a third nanosheet N3, which overlap each other in the vertical direction (e.g., Z direction). The first nanosheet N1, the second nanosheet N2, and the third nanosheet N3 may be at different vertical distances (e.g., Z-direction distances) from the top surface of the bottom semiconductor sheet BS. As used herein, "an element A overlapping an element B in a direction X" (or similar language) means that there is at least one line that extends in the direction X and intersects both the elements A and B.

Each of the plurality of nanosheet stacks NSS may face the top surface of the insulating structure ILS with the one bottom semiconductor sheet BS therebetween. In the vertical direction (e.g., Z direction), each of the plurality of nanosheet stacks NSS may overlap a portion of the second isolation insulating film 114, which protrudes from the bottom semiconductor sheet BS in the vertical direction (e.g., Z direction), with the one bottom semiconductor sheet BS therebetween. The plurality of nanosheet stacks NSS may include a pair of nanosheet stacks NSS, which are spaced apart from the insulating structure ILS in the first lateral direction (e.g., X direction) with a pair of bottom semiconductor sheets BS, which are adjacent to each other, therebetween.

The plurality of gate lines 160 may be on the plurality of bottom semiconductor sheets BS. Each of the plurality of gate lines 160 may extend longitudinally in the second lateral direction (e.g., Y direction), which intersects with the first lateral direction (e.g., X direction). Each of the plurality of gate lines 160 may surround the first to third nanosheets N1, N2, and N3 included in the nanosheet NSS.

Each of the first nanosheet N1, the second nanosheet N2, and the third nanosheet N3 in the nanosheet stack NSS may serve as a channel region. As shown in FIG. 3A, the first nanosheet N1, the second nanosheet N2, and the third nanosheet N3 in one nanosheet stack NSS may have the same size or similar sizes in the first lateral direction (e.g., X direction). In some other embodiments, differently from those shown in FIG. 3A, at least some of the first nanosheet N1, the second nanosheet N2, and the third nanosheet N3 in one nanosheet stack NSS may have different sizes in the first lateral direction (e.g., X direction). The present embodiment pertains to an example in which each of the plurality of nanosheet stacks NSS includes three nanosheets, but the inventive concept is not limited thereto. For instance, the nanosheet stack NSS may include at least one nanosheet, and the number of nanosheets in the nanosheet stack NSS is not specifically limited.

In some embodiments, the first nanosheet N1, the second nanosheet N2, and the third nanosheet N3 may substantially have the same thickness in the vertical direction (e.g., Z direction). In some other embodiments, at least some of the first nanosheet N1, the second nanosheet N2, and the third nanosheet N3 may have different thicknesses from each other in the vertical direction (e.g., Z direction). In some embodiments, each of the first nanosheet N1, the second nanosheet N2, and the third nanosheet N3 in the nanosheet stack NSS may include a Si layer, a SiGe layer, or a combination thereof.

In some embodiments, in the vertical direction (e.g., Z direction), each of the plurality of bottom semiconductor sheets BS may substantially have the same thickness as at least one of the first to third nanosheets N1, N2, and N3 included in the nanosheet stack NSS. In some other embodiments, in the vertical direction (e.g., Z direction), each of the plurality of bottom semiconductor sheets BS may have a different thickness from each of the first to third nanosheets N1, N2, and N3. In the vertical direction (e.g., Z direction), a thickness of each of the plurality of bottom semiconductor sheets BS may be less or greater than a thickness of each of the first to third nanosheets N1, N2, and N3.

As shown in FIGS. 3A and 3C, each of the plurality of gate lines 160 may include a main gate portion 160M and a plurality of sub-gate portions 160S. The main gate portion 160M may cover a top surface of the nanosheet stack NSS and extend in (e.g., extend longitudinally in) the second lateral direction (e.g., Y direction). The plurality of sub-gate portions 160S may be integrally connected to the main gate portion 160M and each be arranged between two adjacent ones of the first to third nanosheets N1, N2, and N3 and between the first nanosheet N1 and the insulating structure ILS. In the vertical direction (e.g., Z direction), a thickness of each of the plurality of sub-gate portions 160S may be less than a thickness of the main gate portion 160M. From among the plurality of sub-gate portions 160S, the sub-gate portion 160S that is closest to the insulating structure ILS may be between one bottom semiconductor sheet BS and the first nanosheet N1.

Each of the plurality of gate lines 160 may include a metal, a metal nitride, a metal carbide, or a combination thereof. The metal may be selected from, for example, titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from, for example, titanium nitride (TiN) and tantalum nitride (TaN). The metal carbide may include, for example, titanium aluminum carbide (TiAlC). However, a material included in the plurality of gate lines 160 is not limited to the examples described above.

A gate dielectric film 152 may be between the nanosheet stack NSS and the gate line 160. The gate dielectric film 152 may include a portion between the gate line 160 and the bottom semiconductor sheet BS. In some embodiments, the gate dielectric film 152 may have a stack structure of an interface dielectric film and a high-k dielectric film. The interface dielectric film may include, for example, a low-k dielectric material film (e.g., a silicon oxide film, a silicon oxynitride film, or a combination thereof), which has a dielectric constant of about 9 or less. In some embodiments, the interface dielectric film may be omitted. The high-k dielectric film may include a material having a higher dielectric constant than a silicon oxide film. For example, the high-k dielectric film may have a dielectric constant of about 10 to about 25. The high-k dielectric film may include, for example, hafnium oxide, without being limited thereto.

Each of the plurality of source/drain regions 130 may be adjacent to at least one gate line 160 selected from the plurality of gate lines 160. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

Each of the plurality of source/drain regions 130 may include an epitaxially grown semiconductor layer. In some embodiments, each of the plurality of source/drain regions 130 may include an epitaxially grown Si layer, an epitaxially grown SiC layer, or an embedded SiGe structure including a plurality of epitaxially grown SiGe layers.

In some embodiments, when the plurality of source/drain regions 130 constitute an NMOS transistor, the plurality of source/drain regions 130 may include, for example, a Si layer doped with an n-type dopant or a SiC layer doped with an n-type dopant and the backside contact structure DBC may be in contact with the Si layer or the SiC layer. The n-type dopant may be selected from, for example, phosphorus (P), arsenic (As), and antimony (Sb).

In some embodiments, when the plurality of source/drain regions 130 constitute a PMOS transistor, the plurality of source/drain regions 130 may include, for example, a SiGe layer doped with a p-type dopant. The p-type dopant may be selected from, for example, boron (B) and gallium (Ga). When the plurality of source/drain regions 130 constitute a PMOS transistor, the plurality of source/drain regions 130 may include a blocking layer in contact with the backside contact structure DBC and a main body layer spaced apart from the backside contact structure DBC with the blocking layer therebetween. The blocking layer may be integrally connected to the main body layer. In some embodiments, the blocking layer and the main body layer may include SiGe layers having different Ge content ratios from each other, and a Ge content ratio of the blocking layer may be less than a Ge content ratio of the main body layer.

In some embodiments, when the plurality of source/drain regions 130 constitute a PMOS transistor, each of the plurality of source/drain regions 130 may include a blocking layer, a buffer layer, and a main body layer, which are sequentially arranged on the top surface of the backside contact structure DBC in the vertical direction (e.g., Z direction) and continuously and integrally formed with each other. The blocking layer, the buffer layer, and the main body layer may each include, for example, a $Si_{1-x}Ge_x$ layer (x>0) doped with a p-type dopant and have different Ge content ratios from each other. In some embodiments, the blocking layer, the buffer layer, and the main body layer may each include a $Si_{1-x}Ge_x$ layer (x>0) doped with a p-type dopant, and a Ge content ratio of the buffer layer may be higher than a Ge content ratio of the blocking layer and lower than a Ge content ratio of the main body layer. For example, each of the blocking layer, the buffer layer, and the main body layer may include a $Si_{1-x}Ge_x$ layer (x>0) doped with a boron (B) element. Each of the blocking layer, the buffer layer, and the main body layer may have a Ge content ratio, which gradually increases in a direction away from the backside contact structure DBC. For instance, the blocking layer may include a $Si_{1-x}Ge_x$ layer (0.05≤x≤0.07) doped with a B element, the buffer layer may include a $Si_{1-x}Ge_x$ layer (0.40≤x≤0.45) doped with a B element, and the main body layer may include a $Si_{1-x}Ge_x$ layer (0.45<x≤0.70) doped with a B element. That is, a Ge content ratio of the blocking layer may be in a range of about 5 atomic percent (at %) to about 7 at %, a Ge content ratio of the buffer layer may be in a range of about 40 at % to about 45 at %, and a Ge content ratio of the main body layer may be more than about 45 at % and equal to or lower than about 60 at %, without being limited thereto.

As illustrated in FIGS. 3A and 3C, a top surface of each of the gate dielectric film 152 and the gate line 160 may be covered by a capping insulating pattern 168. The capping insulating pattern 168 may include, for example, a silicon nitride film.

Both sidewalls of each of the gate line 160 and the capping insulating pattern 168 may be covered by outer insulating spacers 118. The outer insulating spacers 118 may cover both sidewalls of the main gate portion 160M on a top surface of each of the plurality of nanosheet stacks NSS. The outer insulating spacers 118 may be spaced apart from the gate line 160 with the gate dielectric film 152 therebetween.

As shown in FIG. 3B, a plurality of recess-side insulating spacers 119 may be on the first isolation insulating film 112 of the insulating structure ILS. At least some of the plurality of recess-side insulating spacers 119 may cover sidewalls of the source/drain region 130. In some embodiments, each of the plurality of recess-side insulating spacers 119 may be integrally connected to the outer insulating spacers 118 adjacent thereto.

Each of the plurality of outer insulating spacers 118 and the plurality of recess-side insulating spacers 119 may include, for example, silicon nitride, silicon oxide, SiCN, SiBN, SiON, SiOCN, SiBCN, SiOC, or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

The plurality of source/drain regions 130 and the insulating structure ILS may be covered by an insulating liner 142. Of the insulating structure ILS, the first isolation insulating film 112 may be in contact with the insulating liner 142. The insulating liner 142 may cover the plurality of outer insulating spacers 118 and the plurality of recess-side insulating spacers 119. In some embodiments, the insulating liner 142 may be omitted. An inter-gate dielectric film 144 may be on the insulating liner 142. When the insulating liner 142 is omitted, the inter-gate dielectric film 144 may be in contact with the plurality of source/drain regions 130. In some embodiments, the insulating liner 142 may include silicon nitride, SiCN, SiBN, SiON, SiOCN, SiBCN, or a combination thereof, without being limited thereto. The inter-gate dielectric film 144 may include, for example, a silicon oxide film, without being limited thereto.

Both sidewalls of each of the plurality of sub-gate portions 160S in the plurality of gate lines 160 may be spaced apart from the source/drain region 130 with the gate dielectric film 152 therebetween. The gate dielectric film 152 may be between the sub-gate portion 160S included in the gate line 160 and each of the first to third nanosheets N1, N2, and N3, between the sub-gate portion 160S included in the gate line 160 and the source/drain region 130, and between the sub-gate portion 160S included in the gate line 160 and the bottom semiconductor sheet BS.

The plurality of nanosheet stacks NSS may be spaced apart from the bottom semiconductor sheet BS in the vertical direction (e.g., Z direction) and face the top surface of the bottom semiconductor sheet BS. A plurality of nanosheet transistors may be formed in portions where the plurality of bottom semiconductor sheets BS overlap the plurality of gate lines 160 in the vertical direction (e.g., Z direction).

As shown in FIGS. 2, 3A, and 3B, a plurality of front-side contact structures CA may be on the plurality of source/drain regions 130. Each of the plurality of front-side contact structures CA may be electrically connected to selected some of the plurality of source/drain regions 130. Each of the plurality of front-side contact structures CA may be spaced apart from the insulating structure ILS with the source/drain region 130 therebetween in the vertical direction (e.g., Z direction).

A metal silicide film 172 may be between the front-side contact structure CA and the source/drain region 130, which are connected to each other. The metal silicide film 172 may include, for example, a metal, such as titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). For example, the metal silicide film 172 may include titanium silicide, without being limited thereto.

Each of the plurality of front-side contact structures CA may pass through the inter-gate dielectric film 144 and the insulating liner 142 in the vertical direction (e.g., Z direction) and be in contact with the metal silicide film 172. Each of the plurality of front-side contact structures CA may be electrically connectable to selected some of the plurality of source/drain regions 130 through the metal silicide film 172. As shown in FIG. 3A, each of the plurality of front-side contact structures CA may be spaced apart from the main gate portion 160M of the gate line 160 with the outer insulating spacer 118 therebetween in the first lateral direction (e.g., X direction).

As shown in FIGS. 3A and 3B, each of the plurality of front-side contact structures CA may include a conductive barrier pattern 174 and a contact plug 176. The conductive barrier pattern 174 may surround and contact a bottom surface and a sidewall of the contact plug 176. Each of the plurality of front-side contact structures CA may pass through the inter-gate dielectric film 144 and the insulating liner 142 and extend longitudinally in the vertical direction (e.g., Z direction). The conductive barrier pattern 174 may be between the metal silicide film 172 and the contact plug 176. In some embodiments, the conductive barrier pattern 174 may include a metal or a conductive metal nitride. For example, the conductive barrier pattern 174 may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

In some embodiments, the backside contact structure DBC may be electrically connected to the source/drain region 130, which is selected from the plurality of source/drain regions 130 and is not connected to the front-side contact structure CA.

Although not shown, a metal silicide film (not shown) may be between the backside contact structure DBC and the source/drain region 130 connected to the backside contact structure DBC. Details of the metal silicide film may substantially be the same as those of the metal silicide film 172.

The backside contact structure DBC may include, for example, a metal, a conductive metal nitride, or a combination thereof. For example, the backside contact structure DBC may include Mo, Cu, W, Co, Ru, Mn, Ti, Ta, Al, TiN, TaN, WN, WCN, TiSiN, TaSiN, WSiN, a combination thereof, or an alloy thereof, without being limited thereto.

The bottom surface of the insulating structure ILS may be covered by a backside insulating film 109. The backside insulating film 109 may be spaced apart from the plurality of bottom semiconductor sheets BS with the insulating structure ILS therebetween in the vertical direction (e.g., Z direction). In some embodiments, the backside insulating film 109 may include a silicon oxide film, a silicon nitride film, a silicon carbide film, a low-k dielectric film, or a combination thereof. The low-k dielectric film may include, for example, fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

A backside power rail BPW may be connected to the bottom surface of the backside contact structure DBC, which is farthest from the source/drain region 130. The backside power rail BPW may pass through the backside insulating film 109 in the vertical direction (e.g., Z direction) and be in contact with the bottom surface of the backside contact structure DBC. In some embodiments, the backside power rail BPW may include a metal wiring layer and a conductive barrier layer surrounding the metal wiring layer. The metal wiring layer included in the backside power rail BPW may include, for example, ruthenium (Ru), cobalt (Co), tungsten (W), or a combination thereof. The conductive barrier layer included in the backside power rail BPW may include, for example, titanium (Ti), titanium nitride (TiN), tantalum (Ta), tantalum nitride (TaN), or a combination thereof.

As shown in FIGS. 3A to 3D, a top surface of each of the plurality of front-side contact structures CA, the plurality of capping insulating patterns 168, and the inter-gate dielectric film 144 may be covered with an upper insulating structure 180. The upper insulating structure 180 may include an etch stop film 182 and an upper insulating film 184, which are sequentially stacked on each of the plurality of front-side contact structures CA, the plurality of capping insulating patterns 168, and the inter-gate dielectric film 144. The etch stop film 182 may include, for example, silicon carbide (SiC), silicon nitride (SiN), nitrogen-doped silicon carbide (SiC:N), silicon oxycarbide (SiOC), aluminium nitride (AlN), aluminium oxynitride (AlON), aluminium oxide (AlO), aluminium oxycarbide (AlOC), or a combination thereof. The upper insulating film 184 may include, for example, an oxide film, a nitride film, an ultralow-k (ULK) film having an ultralow dielectric constant K of about 2.2 to about 2.4, or a combination thereof. For example, the interlayer insulating film 184 may include, for example, a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 3A and 3B, a plurality of source/drain via contacts VA may be on the plurality of front-side contact structures CA. Each of the plurality of source/drain via contacts VA may pass through the upper insulating structure 180 and be in contact with a top surface of the front-side contact structure CA. From among the plurality of source/ drain regions 130, the source/drain region 130 connected to the front-side contact structure CA may be electrically connected to the source/drain via contact VA through the metal silicide film 172 and the front-side contact structure CA. Each of the plurality of source/drain via contacts VA may include, for example, molybdenum (Mo) or tungsten (W), without being limited thereto.

As shown in FIGS. 2 and 3C, a gate contact CB may be on the gate line 160. The gate contact CB may pass through the upper insulating structure 180 and the capping insulating pattern 168 in the vertical direction (e.g., Z direction) and be connected to the gate line 160. A bottom surface of the gate contact CB may be in contact with the top surface of the gate line 160. The gate contact CB may include a contact plug, which includes, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but a constituent material of the contact plug is not limited thereto. In some embodiments, the gate contact CB may further include a conductive barrier pattern surrounding a portion of the contact plug. The conductive barrier pattern included in the gate contact CB may include, for example, a metal or a metal nitride. For example, the conductive barrier pattern may include Ti, Ta, W, TiN, TaN, WN, WCN, TiSiN, TaSiN, WSiN, or a combination thereof, without being limited thereto.

A top surface of the upper insulating structure 180 may be covered by an interlayer insulating film 186. A constituent material of the interlayer insulating film 186 may substantially be the same as that of the upper insulating film 184. The plurality of upper wiring layers M1 may pass through the interlayer insulating film 186. Each of the plurality of upper wiring layers M1 may be connected to a selected one of the plurality of source/drain via contacts VA located thereunder or a selected one of a plurality of gate contacts CB. In some embodiments, from among the plurality of upper wiring layers M1, the upper wiring layer M1, which is connected to the front-side contact structure CA through the source/drain via contact VA, may be used as a signal line SL. The plurality of upper wiring layers M1 may include, for example, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

As described above with reference to FIGS. 2 to 5, in the IC device 100, the plurality of source/drain regions 130 may be on the insulating structure ILS, and at least one source/drain region 130 selected from the plurality of source/drain regions 130 may be connected to the backside contact structure DBC, which passes through the insulating structure ILS in the vertical direction (e.g., Z direction). Accordingly, in the IC device 100, a sufficient insulation distance between each of the plurality of backside contact structures DBC and each of the plurality of front-side contact structures CA may be ensured, and thus, parasitic capacitance therebetween may be reduced/inhibited. Also, resistances of wirings configured to supply power and/or signals to the source/drain region 130 of the IC device 100 may be reduced. Also, the backside contact structure DBC may be easily aligned at a desired position without applying strict design rules to the backside contact structure DBC. Accordingly, during the process of manufacturing the IC device 100, the backside contact structure DBC may be easily formed by using a simplified process. Therefore, the IC device 100 according to some embodiments of the inventive concept may provide a stable and optimized wiring structure even within a reduced area with the downscaling trend, and the integration density and reliability of the IC device 100 may be improved.

Figure 6:
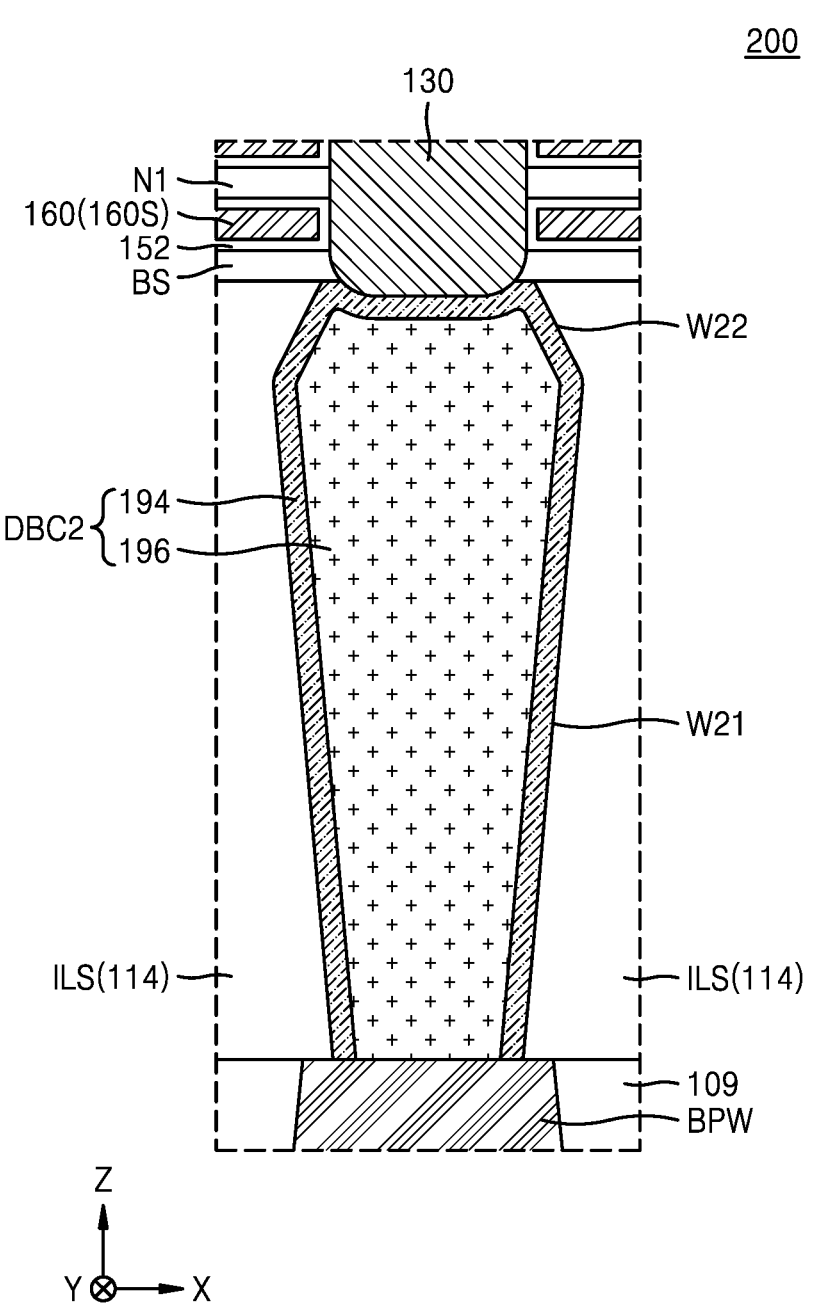
FIG. 6 is a cross-sectional view of an IC device according to some embodiments.

FIG. 6 is a cross-sectional view of an IC device 200 according to some embodiments. FIG. 6 illustrates an enlarged cross-sectional configuration of a portion corresponding to portion "EX1" of FIG. 3A. In FIG. 6, the same reference numerals are used to denote the same elements as in FIGS. 2 to 5, and repeated descriptions thereof are omitted here.

Referring to FIG. 6, the IC device 200 may have the substantially same configuration as the IC device 100 described with reference to FIGS. 2 to 5. However, the IC device 200 may include a backside contact structure DBC2 instead of the backside contact structure DBC.

The backside contact structure DBC2 may substantially have the same configuration as the backside contact structure DBC described with reference to FIGS. 2 to 5. However, the backside contact structure DBC2 may include a conductive barrier pattern 194 and a contact plug 196. The conductive barrier pattern 194 may surround the contact plug 196. The conductive barrier pattern 194 may be in contact with a source/drain region 130, and the contact plug 196 may be spaced apart from the source/drain region 130 with the conductive barrier pattern 194 therebetween. The conductive barrier pattern 194 may be in contact with an insulating structure ILS, and the contact plug 196 may be spaced apart from the insulating structure ILS with the conductive barrier pattern 194 therebetween.

The backside contact structure DBC2 may include a portion that has a width in a first lateral direction (e.g., X direction) increasing toward the source/drain region 130 and a portion that has a width in the first lateral direction (e.g., X direction) decreasing toward the source/drain region 130. The backside contact structure DBC2 may have a first sidewall W21 and a second sidewall W22, which are in contact with the second isolation insulating film 114 of the insulating structure ILS. The first sidewall W21 may include an inclined surface. A distance between the inclined surface of the first sidewall W21 and a central axis of the backside contact structure DBC2, which extends in the vertical direction (e.g., Z direction), in the X direction may increase toward the source/drain region 130. The second sidewall W22 may include an inclined surface. A distance between the inclined surface of the second sidewall W22 and the central axis of the backside contact structure DBC2 in the X direction may decrease toward the source/drain region 130. A position of the central axis of the backside contact structure DBC2 may correspond to the position of the central axis CX shown in FIG. 4.

In some embodiments, a metal silicide film (not shown) may be between the source/drain region 130 and the conductive barrier pattern 194. Detailed descriptions of constituent materials of the conductive barrier pattern 194 and the contact plug 196 may substantially be the same as those of the conductive barrier pattern 174 and the contact plug 176 of the front-side contact structure CA, which have been described with reference to FIGS. 3A and 3B.

Figure 7:
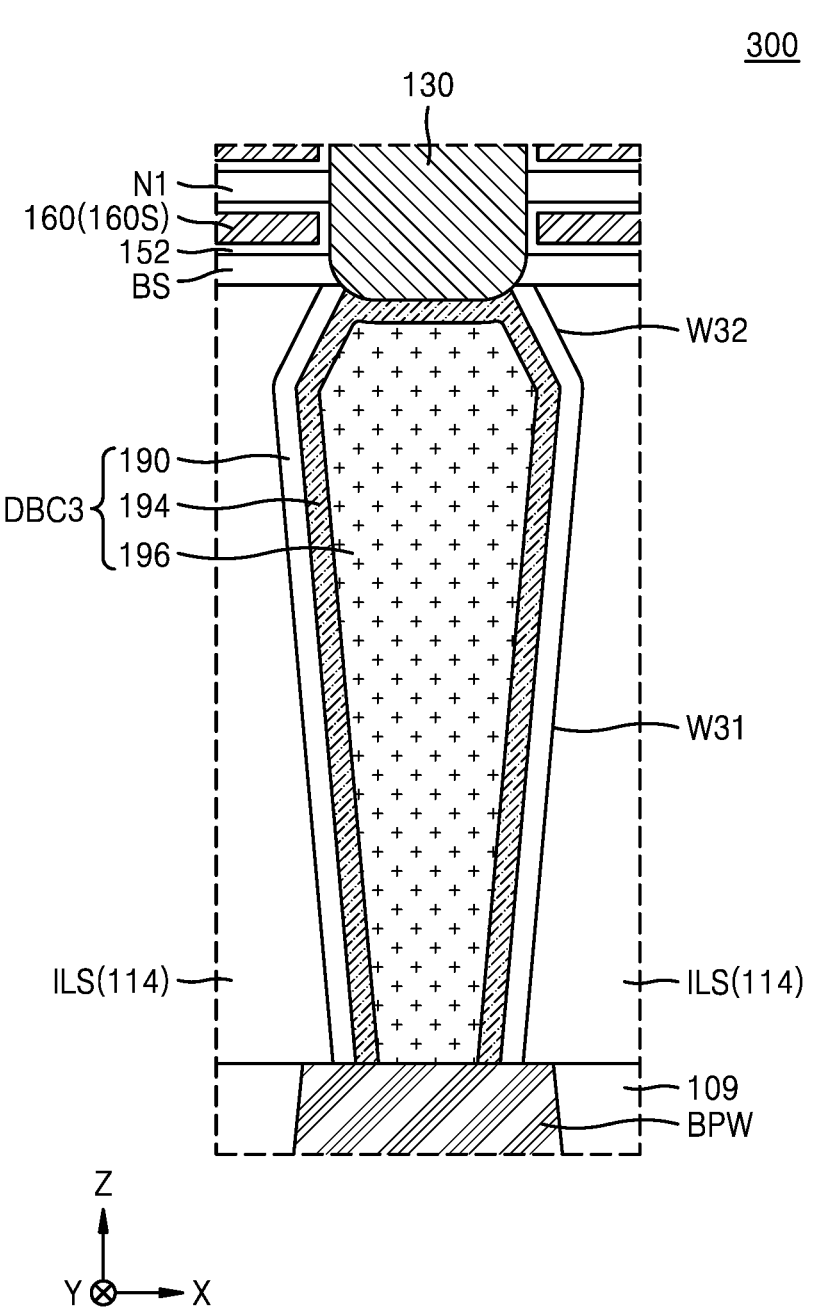
FIG. 7 is a cross-sectional view of an IC device according to some embodiments.

FIG. 7 is a cross-sectional view of an IC device 300 according to some embodiments. FIG. 7 illustrates an enlarged cross-sectional configuration of a portion corresponding to portion "EX1" of FIG. 3A. In FIG. 7, the same reference numerals are used to denote the same elements as in FIGS. 2 to 6, and repeated descriptions thereof are omitted here.

Referring to FIG. 7, the IC device 300 may substantially have the same configuration as the IC device 200 described with reference to FIG. 6. However, the IC device 300 may include a backside contact structure DBC3 instead of the backside contact structure DBC2.

The backside contact structure DBC3 may have the substantially same configuration as the backside contact structure DBC2 described with reference to FIG. 6. However, the backside contact structure DBC3 may further include an insulating spacer 190 between a conductive barrier pattern 194 and an insulating structure ILS. The conductive barrier pattern 194 and a contact plug 196 may be surrounded by the insulating spacer 190. The insulating spacer 190 may be in contact with the insulating structure ILS and a bottom semiconductor sheet BS that is adjacent to the backside contact structure DBC3, from among a plurality of bottom semiconductor sheets BS. The backside contact structure DBC3 may be spaced apart from the bottom semiconductor sheet BS, which is adjacent to the backside contact structure DBC3, with the insulating spacer 190 therebetween. The insulating spacer 190 may include, for example, a silicon oxide film, a silicon oxynitride film, a silicon nitride film, or a combination thereof, without being limited thereto.

The backside contact structure DBC3 may include a portion that has a width in a first lateral direction (e.g., X direction) increasing toward the source/drain region 130 and a portion that has a width in the first lateral direction (e.g., X direction) decreasing toward the source/drain region 130. The backside contact structure DBC3 may have a first sidewall W31 and a second sidewall W32, which are in contact with the second isolation insulating film 114 of the insulating structure ILS. The first sidewall W31 may include an inclined surface. A distance between the inclined surface of the first sidewall W31 and a central axis of the backside contact structure DBC3, which extends in the vertical direction (e.g., Z direction), in the X direction may increase toward the source/drain region 130. The second sidewall W32 may include an inclined surface. A distance between the inclined surface of the second sidewall W32 and the central axis of the backside contact structure DBC3 in the X direction may decrease toward the source/drain region 130. A position of the central axis of the backside contact structure DBC3 may correspond to the position of the central axis CX shown in FIG. 4.

Figure 8:
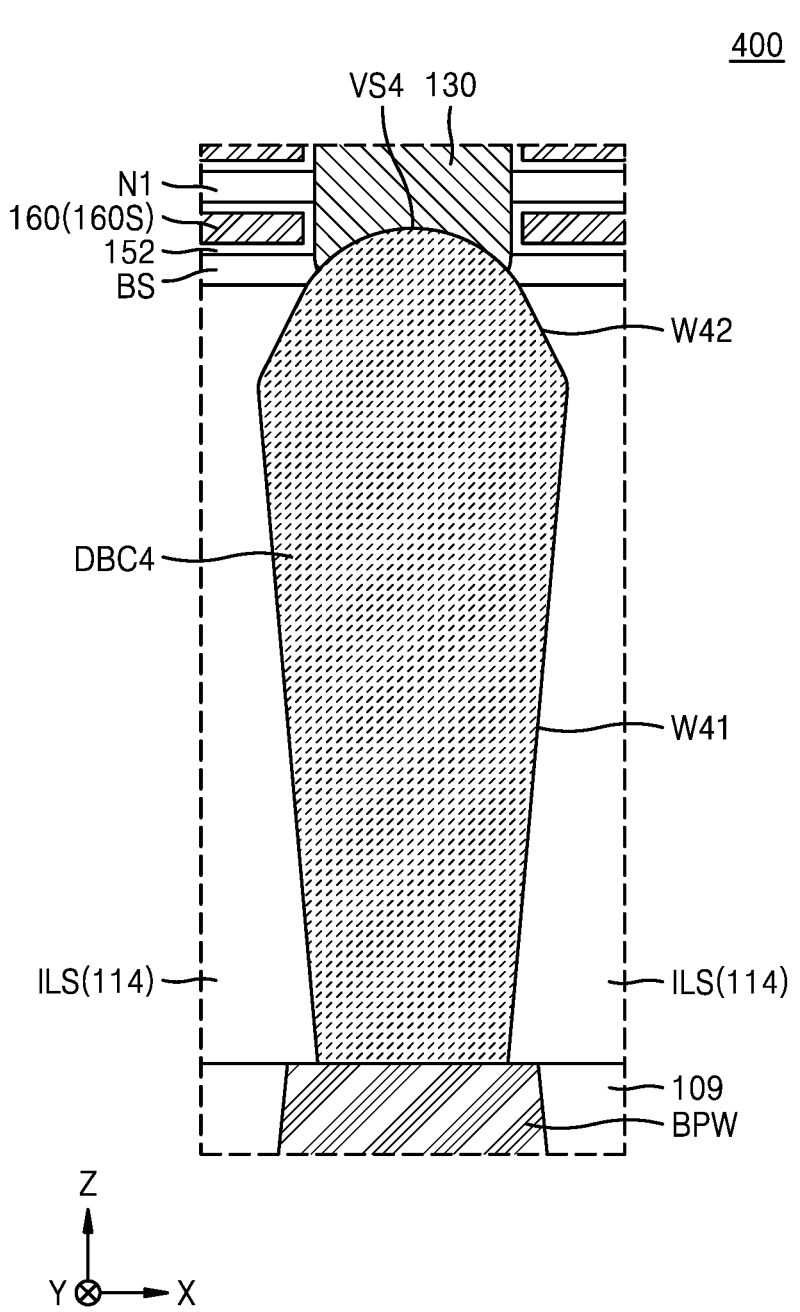
FIG. 8 is a cross-sectional view of an IC device according to some embodiments.

FIG. 8 is a cross-sectional view of an IC device 400 according to some embodiments. FIG. 8 illustrates an enlarged cross-sectional configuration of a portion corresponding to portion "EX1" of FIG. 3A. In FIG. 8, the same reference numerals are used to denote the same elements as in FIGS. 2 to 5, and repeated descriptions thereof are omitted here.

Referring to FIG. 8, the IC device 400 may have the substantially same configuration as the IC device 100 described with reference to FIGS. 2 to 5. However, the IC device 400 may include a backside contact structure DBC4 instead of the backside contact structure DBC.

The backside contact structure DBC4 may have the substantially same configuration as the backside contact structure DBC described with reference to FIGS. 2 to 5. However, the backside contact structure DBC4 may have a contact surface VS4, which is in contact with a source/drain region 130 and is convex toward the source/drain region 130.

The backside contact structure DBC4 may include a portion that has a width in a first lateral direction (e.g., X direction) increasing toward the source/drain region 130 and a portion that has a width in the first lateral direction (e.g., X direction) decreasing toward the source/drain region 130.

The backside contact structure DBC4 may have a first sidewall W41 and a second sidewall W42, which are in contact with a second isolation insulating film 114 of an insulating structure ILS. The first sidewall W41 may include an inclined surface. A distance between the inclined surface of the first sidewall W41 and a central axis of the backside contact structure DBC4, which extends in the vertical direction (e.g., Z direction), in the X direction may increase toward the source/drain region 130. The second sidewall W42 may include an inclined surface. A distance between the inclined surface of the second sidewall W42 and the central axis of the backside contact structure DBC4 in the X direction may decrease toward the source/drain region 130. A position of the central axis of the backside contact structure DBC4 may correspond to the position of the central axis CX shown in FIG. 4.

In some embodiments, a metal silicide film (not shown) may be between the source/drain region 130 and the backside contact structure DBC4.

Figure 9:
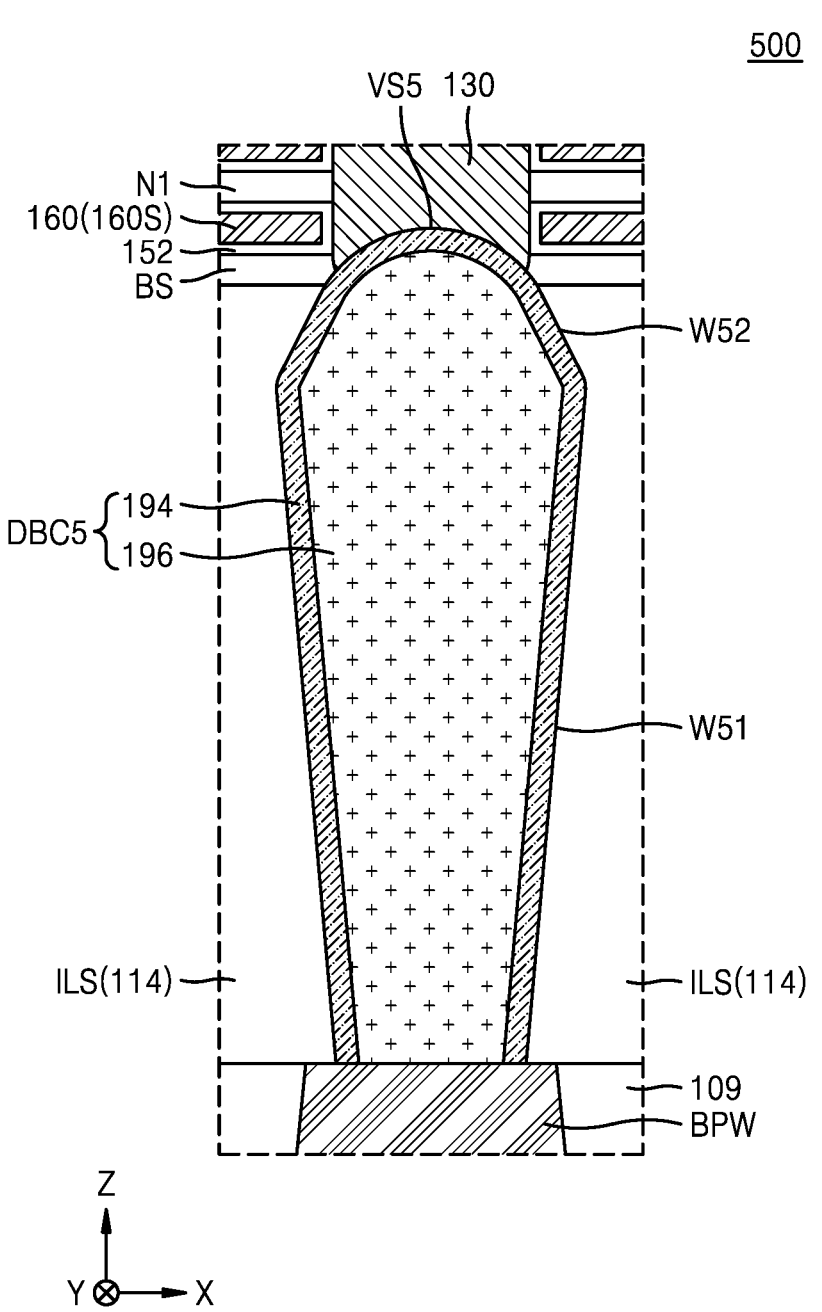
FIG. 9 is a cross-sectional view of an IC device according to some embodiments.

FIG. 9 is a cross-sectional view of an IC device 500 according to some embodiments. FIG. 9 illustrates an enlarged cross-sectional configuration of a portion corresponding to portion "EX1" of FIG. 3A. In FIG. 9, the same reference numerals are used to denote the same elements as in FIGS. 2 to 6, and repeated descriptions thereof are omitted here.

Referring to FIG. 9, the IC device 500 may have the substantially same configuration as the IC device 100 described with reference to FIGS. 2 to 5. However, the IC device 500 may include a backside contact structure DBC5 instead of the backside contact structure DBC.

The backside contact structure DBC5 may have the substantially same configuration as the backside contact structure DBC described with reference to FIG. 1. However, the backside contact structure DBC5 may have a contact surface VS5, which is in contact with a source/drain region 130 and is convex toward the source/drain region 130. Also, the backside contact structure DBC5 may include a conductive barrier pattern 194 and a contact plug 196. Details of the conductive barrier pattern 194 and the contact plug 196 may be the same as those described with reference to FIG. 6.

The backside contact structure DBC5 may include a portion that has a width in a first lateral direction (e.g., X direction) increasing toward the source/drain region 130 and a portion that has a width in the first lateral direction (e.g., X direction) decreasing toward the source/drain region 130. The backside contact structure DBC5 may have a first sidewall W51 and a second sidewall W52, which are in contact with a second isolation insulating film 114 of an insulating structure ILS. The first sidewall W51 may include an inclined surface. A distance between the inclined surface of the first sidewall W51 and a central axis of the backside contact structure DBC5, which extends in the vertical direction (e.g., Z direction), in the X direction may increase toward the source/drain region 130. The second sidewall W52 may include an inclined surface. A distance between the inclined surface of the second sidewall W52 and the central axis of the backside contact structure DBC5 in the X direction may decrease toward the source/drain region 130. A position of the central axis of the backside contact structure DBC5 may correspond to the position of the central axis CX shown in FIG. 4.

Figure 10:
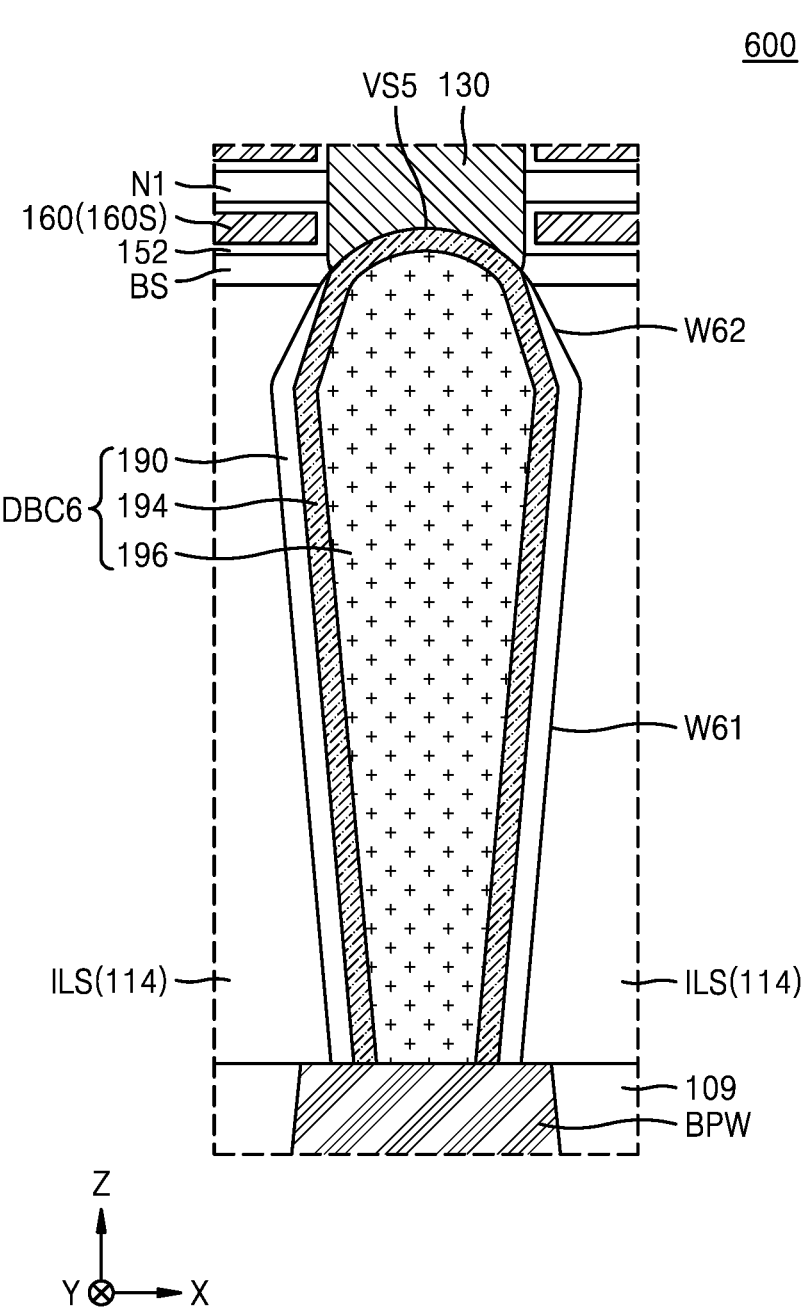
FIG. 10 is a cross-sectional view of an IC device according to some embodiments.

FIG. 10 is a cross-sectional view of an IC device 600 according to some embodiments. FIG. 10 illustrates an enlarged cross-sectional configuration of a portion corresponding to portion "EX1" of FIG. 3A. In FIG. 10, the same reference numerals are used to denote the same elements as in FIGS. 2 to 9, and repeated descriptions thereof are omitted here.

Referring to FIG. 10, the IC device 600 may have the substantially same configuration as the IC device 500 described with reference to FIG. 9. However, the IC device 600 may include a backside contact structure DBC6 instead of the backside contact structure DBC5.

The backside contact structure DBC6 may have the substantially same configuration as the backside contact structure DBC5 described with reference to FIG. 9. However, the backside contact structure DBC6 may further include an insulating spacer 190 between a conductive barrier pattern 194 and an insulating structure ILS. The backside contact structure DBC6 may be spaced apart from the bottom semiconductor sheet BS, which is adjacent to the backside contact structure DBC6, with the insulating spacer 190 therebetween. Details of the insulating spacer 190 may be the same as those described with reference to FIG. 7.

The backside contact structure DBC6 may include a portion that has a width in a first lateral direction (e.g., X direction) increasing toward a source/drain region 130 and a portion that has a width in the first lateral direction (e.g., X direction) decreasing toward the source/drain region 130. The backside contact structure DBC6 may have a first sidewall W61 and a second sidewall W62, which are in contact with the second isolation insulating film 114 of the insulating structure ILS. The first sidewall W61 may include an inclined surface. A distance between the inclined surface of the first sidewall W61 and a central axis of the backside contact structure DBC6, which extends in the vertical direction (e.g., Z direction), in the X direction may increase toward the source/drain region 130. The second sidewall W62 may include an inclined surface. A distance between the inclined surface of the second sidewall W62 and the central axis of the backside contact structure DBC6 in the X direction may decrease toward the source/drain region 130. A position of the central axis of the backside contact structure DBC6 may correspond to the position of the central axis CX shown in FIG. 4.

Similar to the IC device 100 described with reference to FIGS. 2 to 5, the IC device 200, 300, 400, 500, or 600 described with reference to FIGS. 6 to 10 may include the backside contact structure DBC2, DBC3, DBC4, DBC5, or DBC6, which passes through the insulating structure ILS in the vertical direction (e.g., Z direction) and is connected to at least one selected from the plurality of source/drain regions 130. Thus, a sufficient insulation distance between the backside contact structures DBC2, DBC3, DBC4, DBC5, or DBC6 and each of the plurality of front-side contact structures CA may be ensured, and accordingly, parasitic capacitance therebetween may be reduced or inhibited. Also, resistances of wirings configured to supply power and/or signals to the source/drain region 130 of the IC device 200, 300, 400, 500, or 600 may be reduced. Also, the backside contact structures DBC2, DBC3, DBC4, DBC5, and DBC6 may be easily aligned at desired positions without applying strict design rules to the backside contact structures DBC2, DBC3, DBC4, DBC5, and DBC6 Accordingly, during the processes of manufacturing the IC devices 200, 300, 400, 500, and 600, the backside contact structures DBC2, DBC3, DBC4, DBC5, and DBC6 may be easily formed by using a simplified process. Therefore, the IC devices 200, 300, 400, 500, and 600 according to some embodiments of the inventive concept may provide a stable and optimized wiring structure even within a reduced area with the downscaling trend, and the integration density and reliability of the IC devices 200, 300, 400, 500, and 600 may be improved.

Next, a method of manufacturing an IC device, according to some embodiments, is described in detail.

FIGS. 11A to 29B are diagrams illustrating a method of manufacturing an IC device, according to some embodiments. More specifically, FIGS. 11A, 12A, 13A, 15A, 16A, 17A, 18A, 19A, 20A, 21A, 24A, 25A, 26A, 27A, 28A, and 29A are cross-sectional views of a portion corresponding to the cross-section taken along line X1-X1' of FIG. 2. In some embodiments, processes may be performed sequentially as illustrated in FIGS. 11A through 29A. FIGS. 11B, 12B, 13B, 14, 15B, 16B, 17B, 18B, 19B, 20B, 21B, 22, 23, 24B, 25B, 26B, 27B, 28B, and 29B are cross-sectional views of a portion corresponding to the cross-section taken along line Y1-Y1' of FIG. 2. In some embodiments, processes may be performed sequentially as illustrated in FIGS. 11B through 29B. FIGS. 13C, 15C, 16C, 17C, 18C, 20C, 21C, 24C, 25C, 26C, and 27C are cross-sectional views of a portion corresponding to the cross-section taken along line Y2-Y2' of FIG. 2. In some embodiments, processes may be performed sequentially as illustrated in FIGS. 13C through 27C. FIGS. 12C, 21D, and 24D are plan views of a backside of portion "BSX" of FIG. 2 In some embodiments, processes may be performed sequentially as illustrated in FIGS. 12C, 21D, and 24D.

An example method of manufacturing the IC device 100 described with reference to FIGS. 2 to 5 is described with reference to FIGS. 11A to 29B. In FIGS. 11A to 29B, the same reference numerals are used to denote the same elements as in FIGS. 2 to 5, and repeated descriptions thereof are omitted here.

Figure 11A:
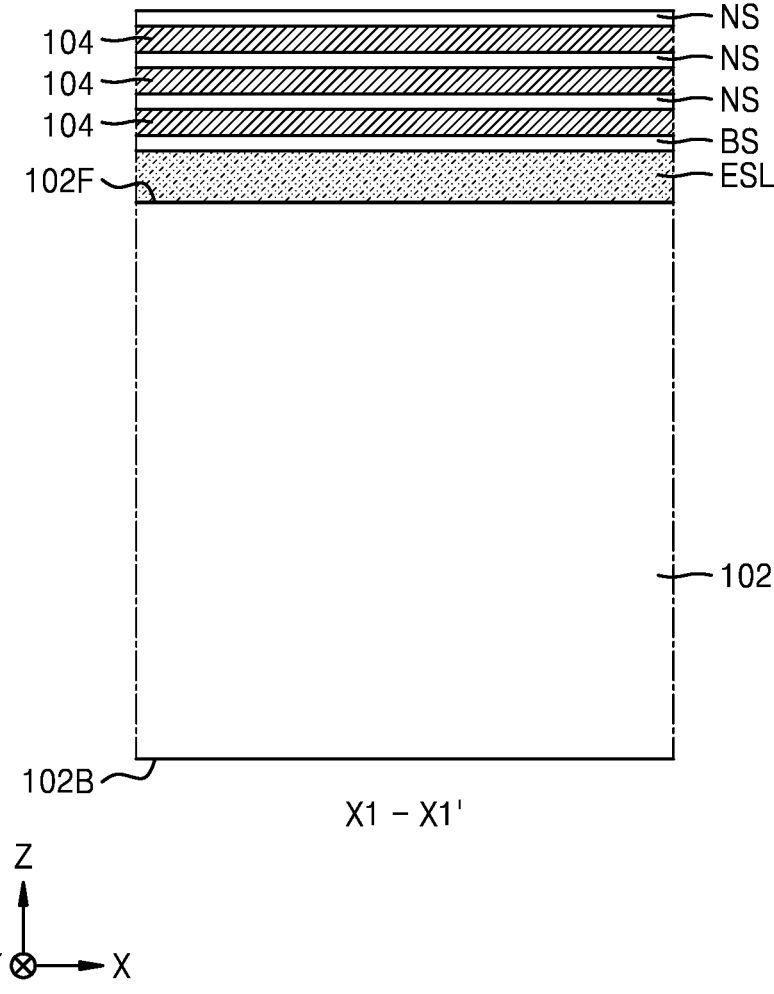
Figure 11B:
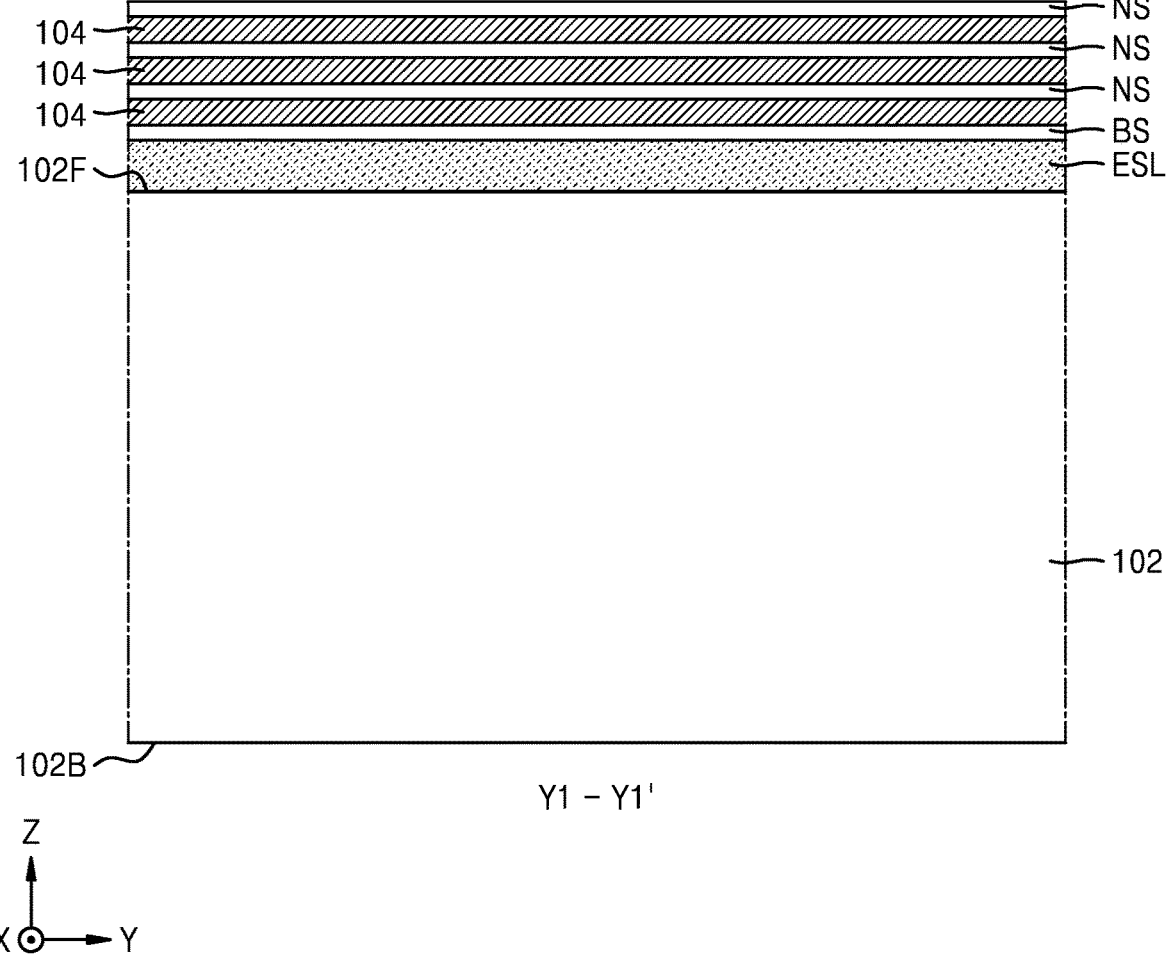

Referring to FIGS. 11A and 11B, a substrate 102 having a backside surface 102B and a front-side surface 102F may be prepared, and an etch stop layer ESL and a bottom semiconductor sheet BS may be sequentially formed on the front-side surface 102F of the substrate 102. A plurality of sacrificial semiconductor layers 104 and a plurality of nanosheet semiconductor layers NS may be alternately stacked one-by-one one on the bottom semiconductor sheet BS.

The substrate 102 may include, for example, an element semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). For example, the substrate 102 may include silicon (Si).

The etch stop layer ESL may include, for example, a material having a different etch selectivity from an etch selectivity of a constituent material of each of the substrate 102 and the bottom semiconductor sheet BS. For example, the substrate 102 and the bottom semiconductor sheet BS may include a Si layer, and the etch stop layer ESL may include a $Si_{1-x}Ge_x$ layer (x>0). In some embodiments, the etch stop layer ESL may include a $Si_{1-x}Ge_x$ layer (here, $0.25 \le x \le 0.70$). That is, the etch stop layer ESL may include a SiGe layer having a Ge content ratio of about 25 at % to about 70 at %.

The plurality of sacrificial semiconductor layers 104 and the plurality of nanosheet semiconductor layers NS may include semiconductor materials having different etch selectivities from each other. In some embodiments, the plurality of nanosheet semiconductor layers NS may include a Si layer, and the plurality of sacrificial semiconductor layers 104 may include a SiGe layer. In some embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 50 at %, for example, about 10 at % to about 40 at %. The Ge content of the SiGe layer included in the plurality of sacrificial semiconductor layers 104 may be variously selected as needed.

Figure 12A:
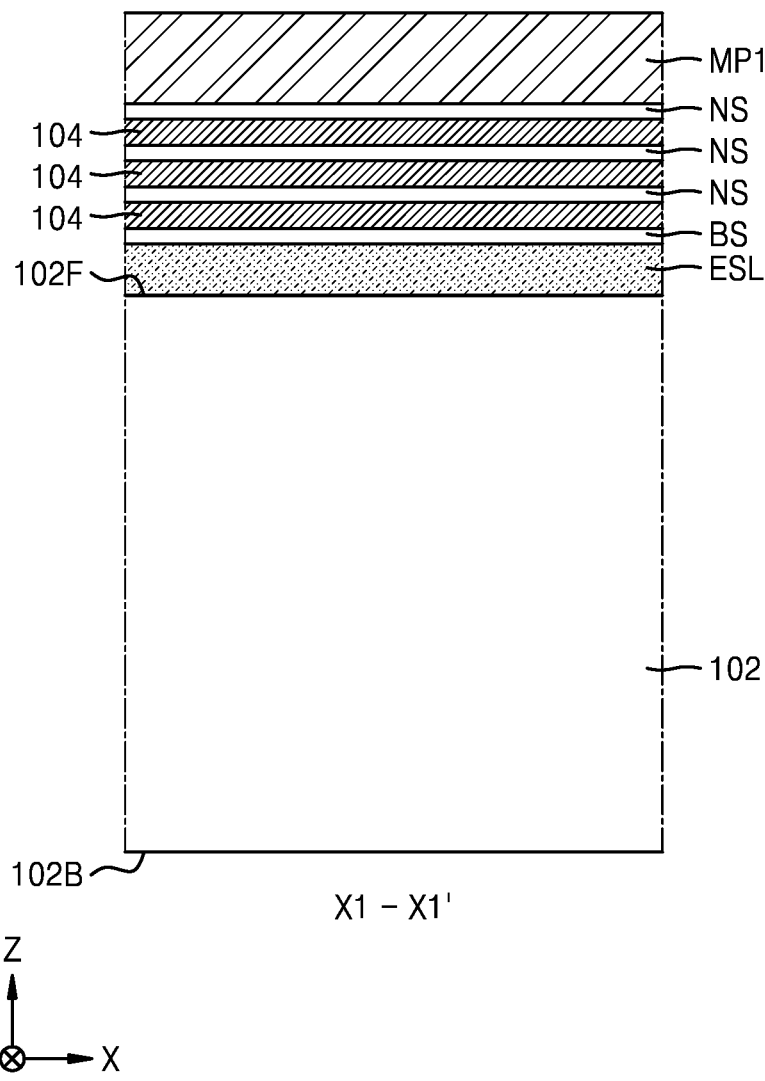
Figure 12B:
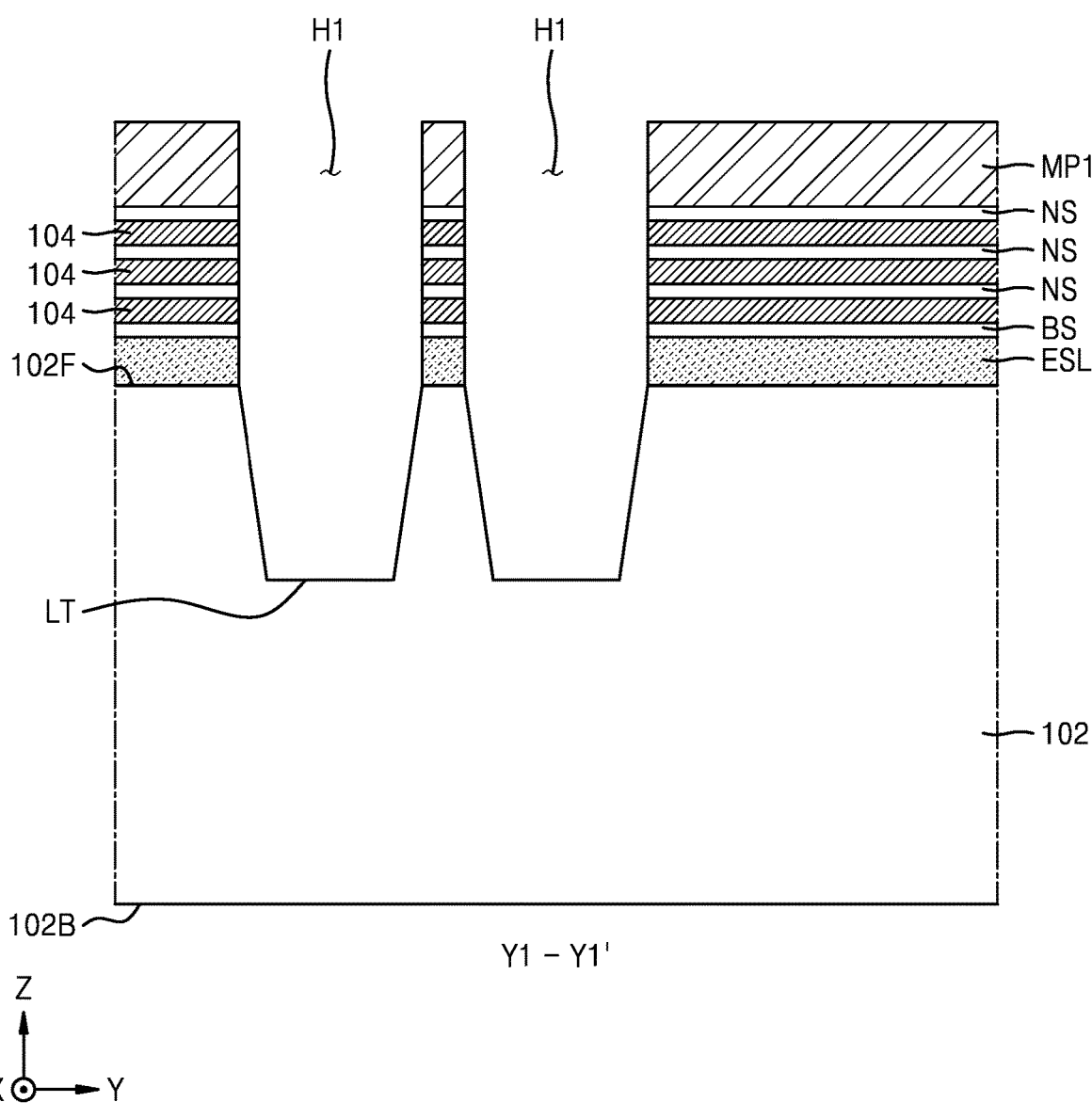
Figure 12C:
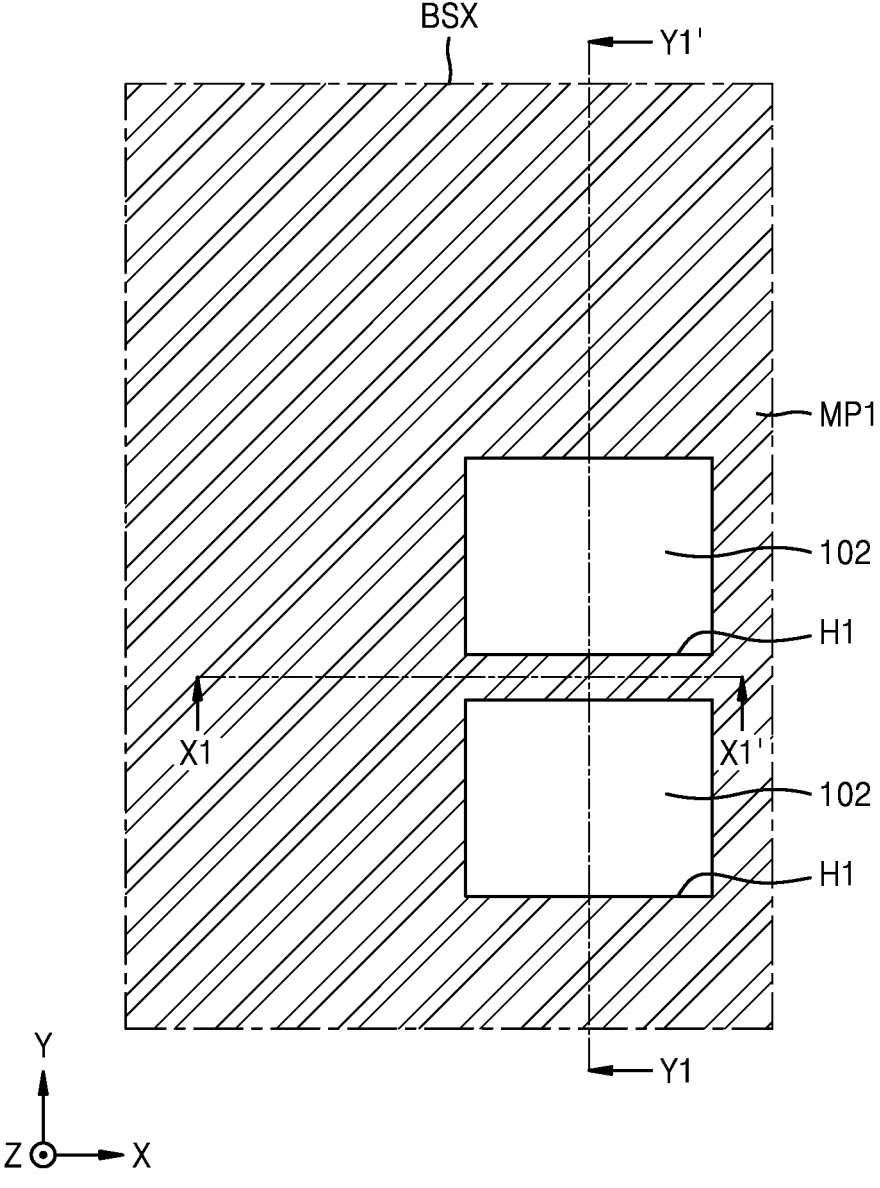

Referring to FIGS. 12A, 12B, and 12C, a first mask pattern MP1 having a plurality of openings H1 may be formed on the resultant structure of FIGS. 11A and 11B. The plurality of openings H1 may include a pair of openings H1, which are adjacent to each other in a second lateral direction (e.g., Y direction). Thereafter, by using the first mask pattern MP1 as an etch mask, a portion of each of the plurality of sacrificial semiconductor layers 104, the plurality of nanosheet semiconductor layers NS, the bottom semiconductor sheet BS, the etch stop layer ESL, and the substrate 102 may be etched from the exposed portion of the resultant structure of FIGS. 11A and 11B through the plurality of openings H1. Thus, a plurality of local trenches LT may be formed in the substrate 102 in positions corresponding to positions of the plurality of openings H1.

Figure 13A:
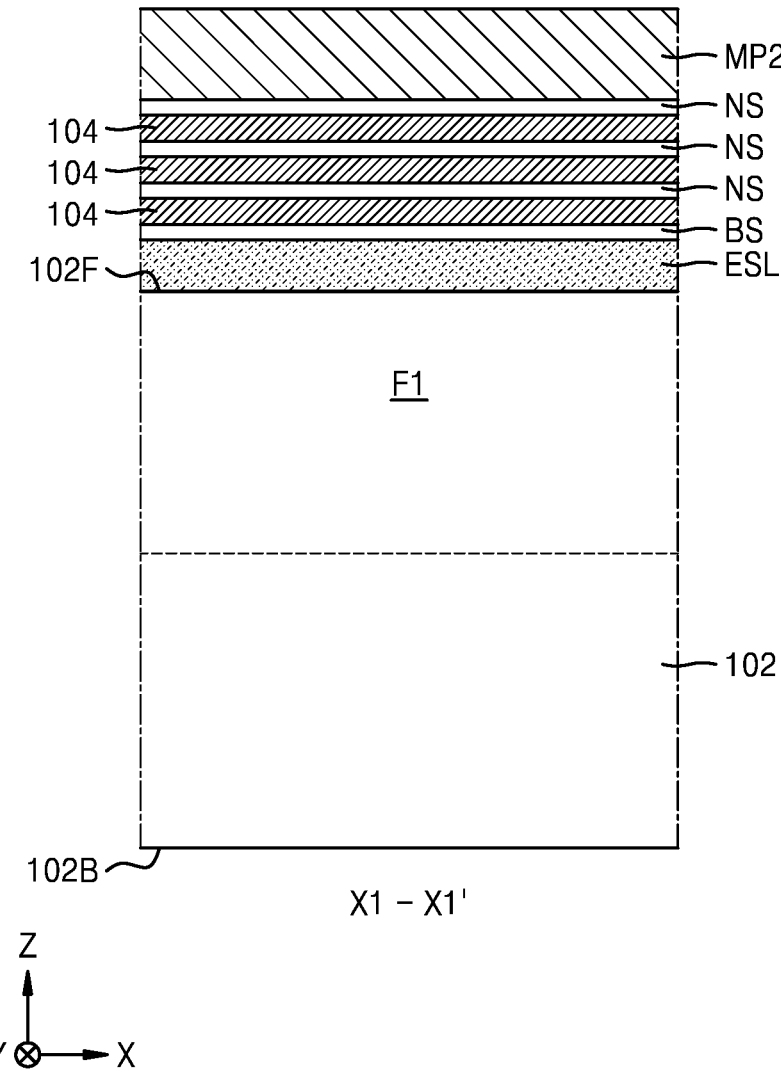
Figure 13B:
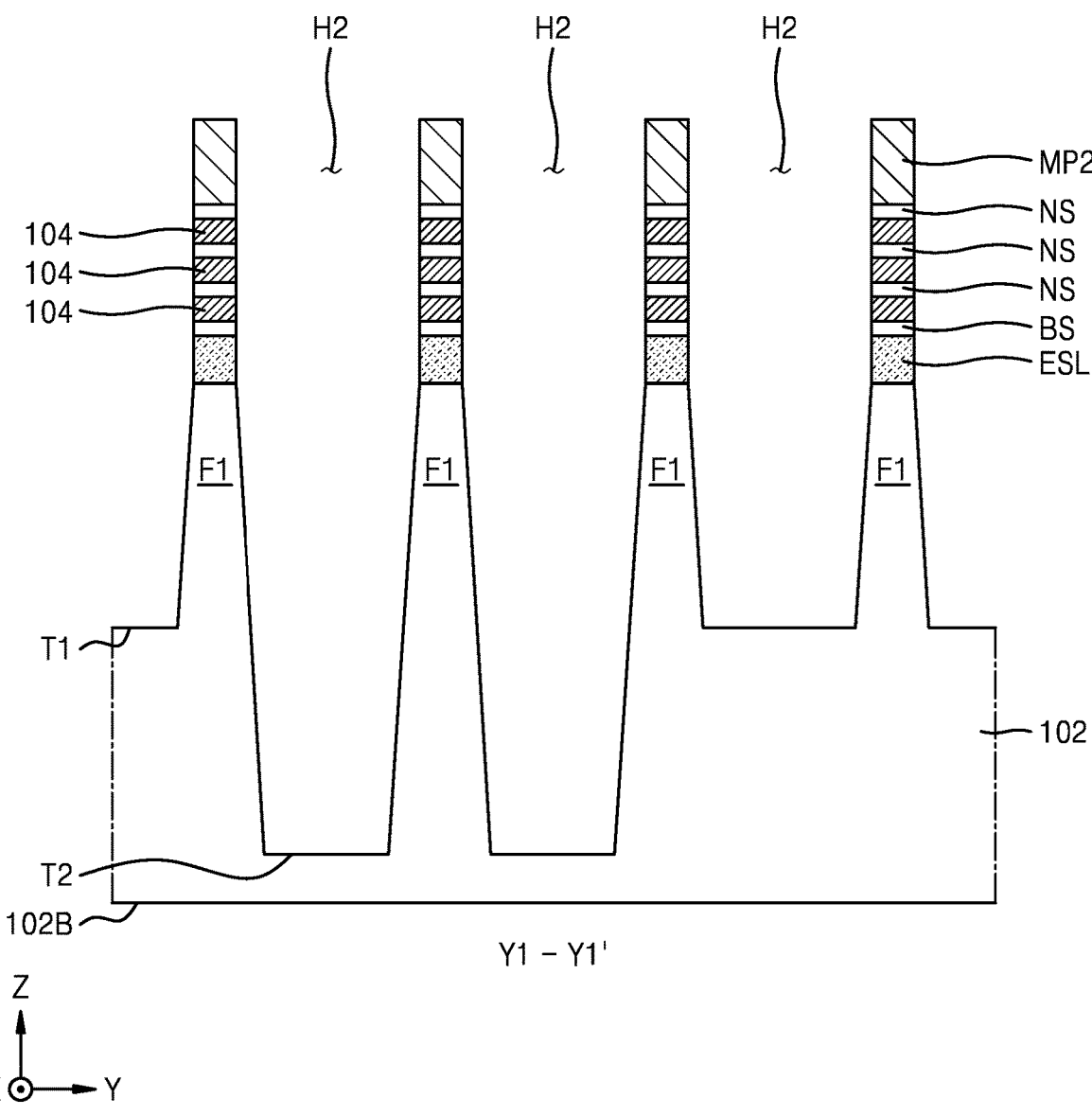
Figure 13C:
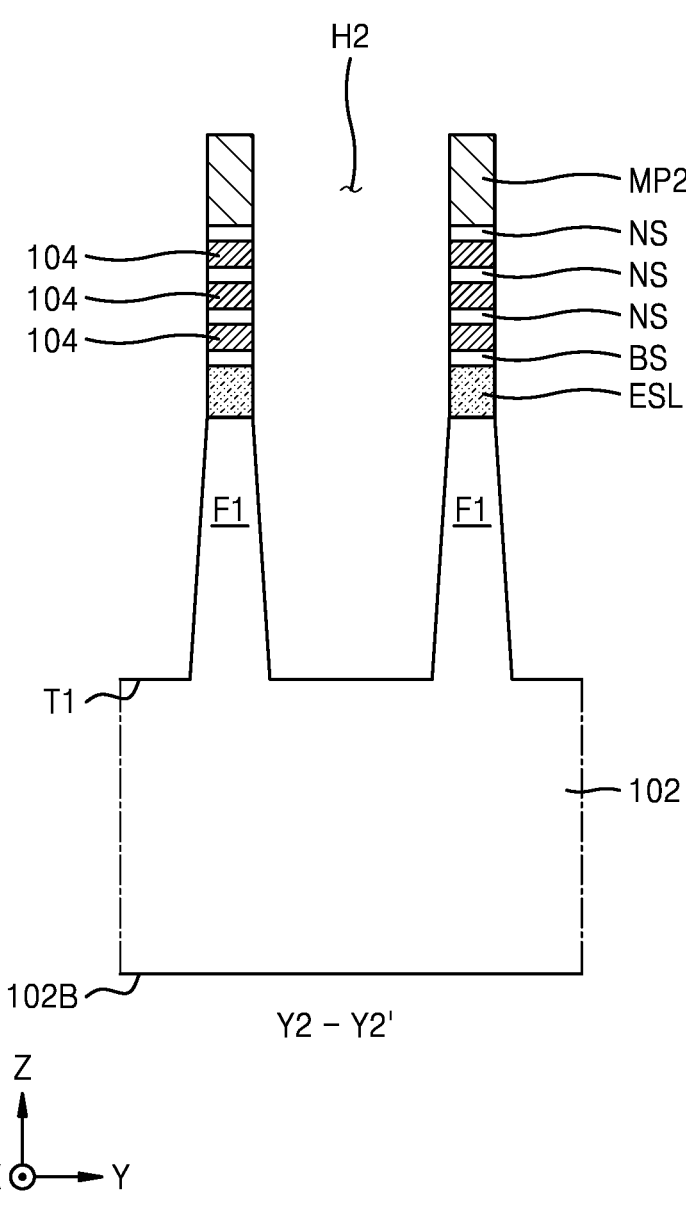

Referring to FIGS. 13A, 13B, and 13C, the first mask pattern MP1 may be removed from the resultant structure of FIGS. 12A, 12B, and 12C, and a second mask pattern MP2 having a plurality of openings H2 may be then formed. In a view from an X-Y plane, partial regions of the plurality of openings H2 included in the second mask pattern MP2 may correspond to positions of the plurality of openings H1 included in the first mask pattern MP1 illustrated in FIG. 12C.

Afterwards, by using the second mask pattern MP2 as an etch mask, a portion of each of the plurality of sacrificial semiconductor layers 104, the plurality of nanosheet semiconductor layers NS, the bottom semiconductor sheet BS, the etch stop layer ESL, and the substrate 102 may be etched through the plurality of openings H2. As a result, a plurality of fin regions F1 may be formed in the substrate 102, and a plurality of first trench regions T1 and a plurality of second trench regions T2 may be formed to correspond to positions of the plurality of openings H2. Widths of the plurality of first trench regions T1 and the plurality of second trench regions T2 in the first lateral direction (e.g., X direction) may be defined by the plurality of fin regions F1.

Positions of the plurality of second trench regions T2 may correspond to positions of the plurality of local trenches LT shown in FIG. 12B and positions of the plurality of openings H1 included in the first mask pattern MP1 shown in FIG. 12C. Because the plurality of second trench regions T2 are obtained by additionally etching the substrate 102 in the resultant structure in which the plurality of local trenches LT shown in FIG. 12B are already formed, a vertical level of a bottom surface of each of the plurality of second trench regions T2 may be closer to the backside surface 102B of the substrate 102 than a vertical level of a bottom surface of each of the plurality of first trench regions T1.

After the plurality of fin regions F1 are formed, a stack structure of the etch stop layer ESL, the bottom semiconductor sheet BS, the plurality of sacrificial semiconductor layers 104, and the plurality of nanosheet semiconductor layers NS may remain on a top surface of each of the plurality of fin regions F1.

Figure 14:
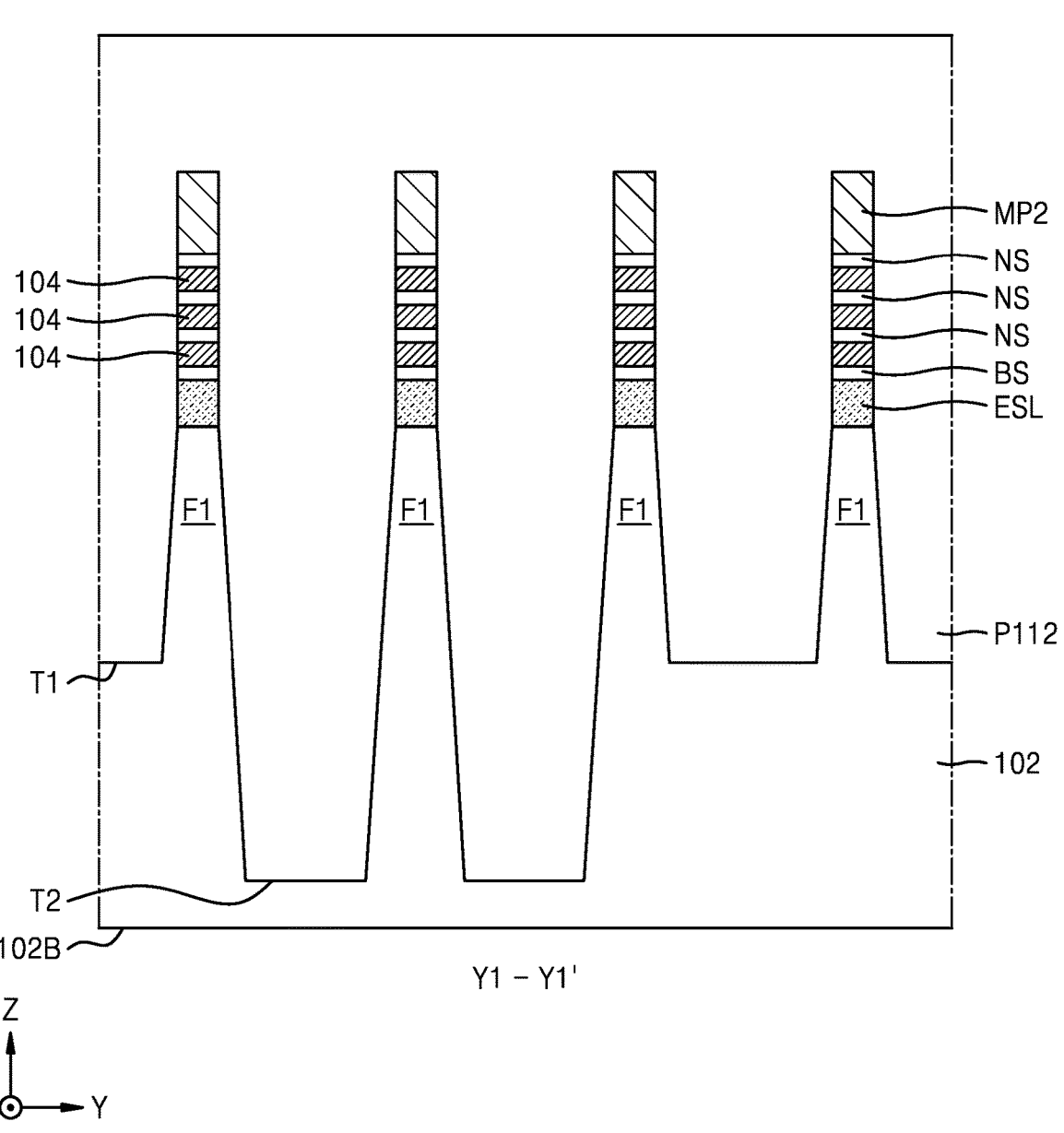

Referring to FIG. 14, in the resultant structure of FIGS. 13A, 13B, and 13C, a preliminary first isolation insulating film P112 may be formed to fill the plurality of first trench regions T1 and the plurality of second trench regions T2 and cover a top surface of the second mask pattern MP2.

In some embodiments, the preliminary first isolation insulating film P112 may include a silicon oxide film, without being limited thereto. The preliminary first isolation insulating film P112 may be formed by using, for example, a plasma-enhanced chemical vapor deposition (PECVD) process, a high density plasma (HDP) CVD process, an inductively coupled plasma (ICP) CVD process, a capacitor coupled plasma (CCP) CVD process, a flowable CVD (FCVD) process, or a spin coating process.

Figure 15A:
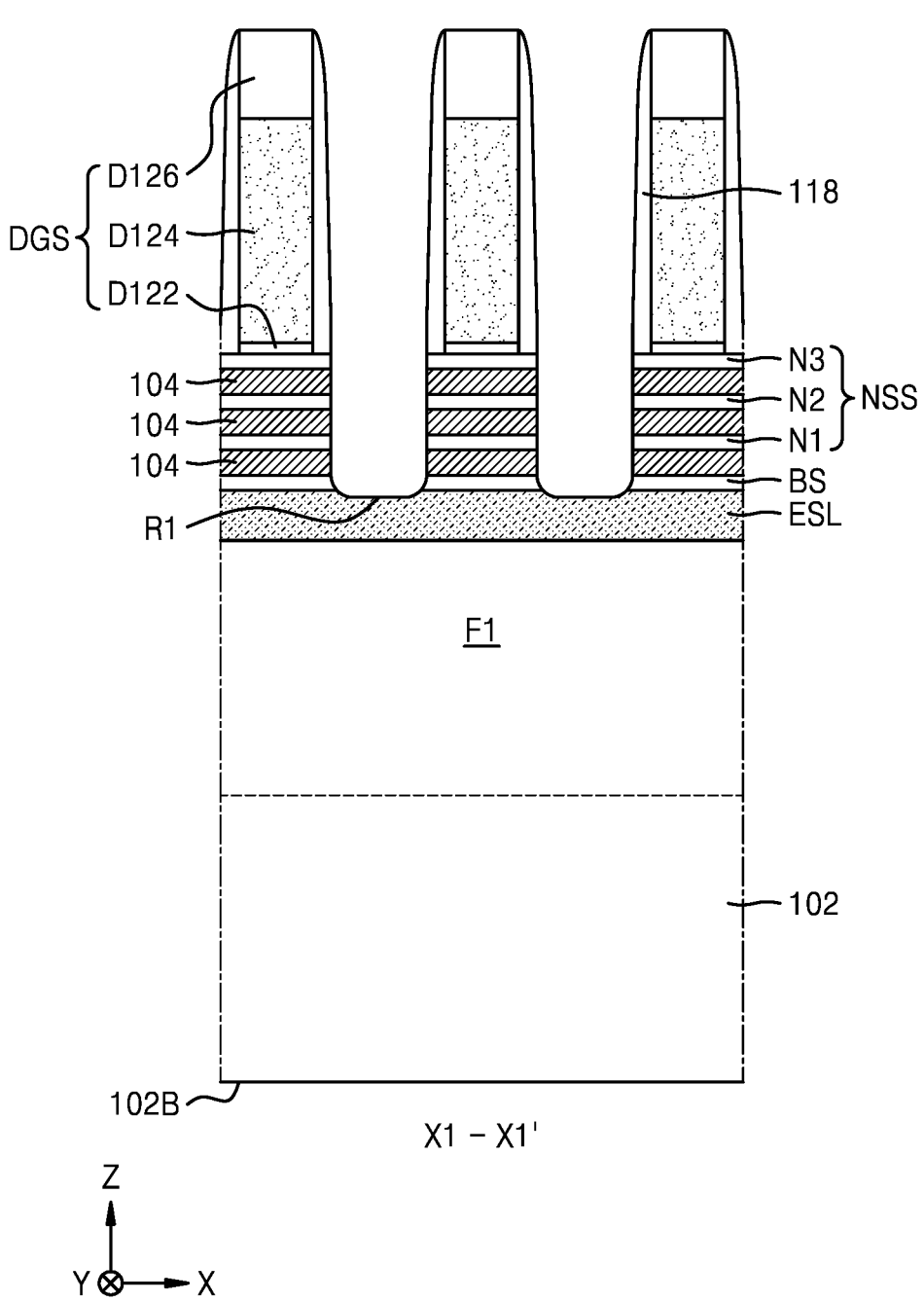
Figure 15B:
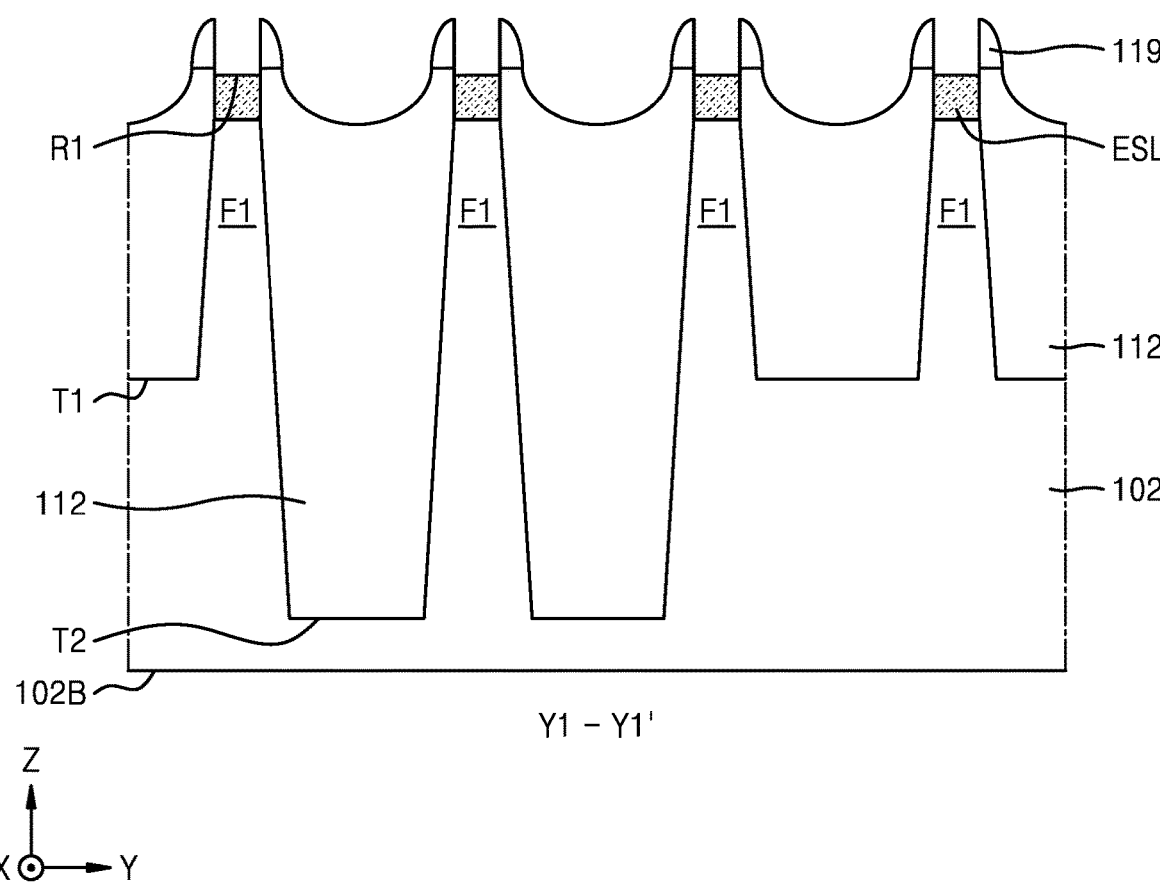
Figure 15C:
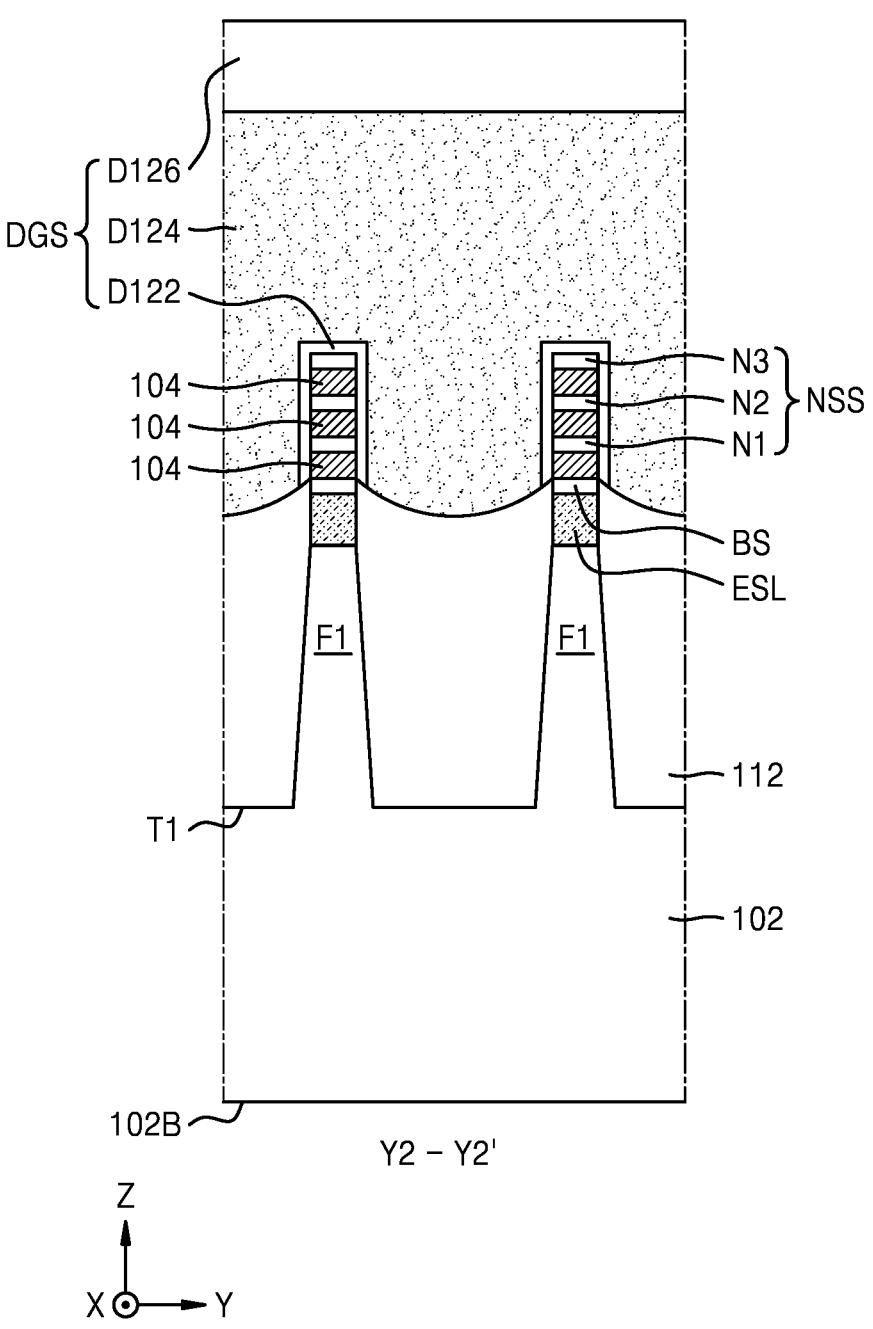

Referring to FIGS. 15A, 15B, and 15C, the resultant structure of FIG. 14 may be planarized to expose a top surface of the second mask pattern MP2. Thereafter, the second mask pattern MP2, which is exposed, may be removed, and a recess process for removing a portion of the preliminary first isolation insulating film P112 may be performed. Thus, a first isolation insulating film 112 including the remaining portion of the preliminary first isolation insulating film P112 may be formed. As a result, the plurality of sacrificial semiconductor layers 104 and the plurality of nanosheet semiconductor layers (refer to NS in FIG. 14) may protrude over a top surface of the first isolation insulating film 112.

The preliminary first isolation insulating film P112 may be recessed by using, for example, a dry etching process, a wet etching process, or a combination thereof. In this case, a wet etching process using, for example, $NH_4OH$, tetramethyl ammonium hydroxide (TMAH), or potassium hydroxide (KOH) as an etchant or a dry etching process, such as an inductively coupled plasma (ICP) process, a transformer coupled plasma (TCP) process, an electron cyclotron resonance (ECR) process, a reactive ion etch (RIE) process, may be employed. When the preliminary first isolation insulating film P112 is recessed by using a dry etching process, a fluorine-containing gas (e.g., $CF_4$), a chlorine-containing gas ($Cl_2$), or hydrogen bromide (HBr) may be used as an etch gas.

Thereafter, a plurality of dummy gate structures DGS may be formed on the stack structure of the plurality of sacrificial semiconductor layers 104 and the plurality of nanosheet semiconductor layers NS. Each of the plurality of dummy gate structures DGS may be formed to extend longitudinally in the second lateral direction (e.g., Y direction). Each of the plurality of dummy gate structures DGS may have a structure in which an oxide film D122, a dummy gate layer D124, and a capping layer D126 are sequentially stacked. In some embodiments, the oxide film D122 may be a film obtained by oxidizing a surface of each of the plurality of sacrificial semiconductor layers (refer to 104 in FIG. 16A) and the plurality of nanosheet semiconductor layers (refer to NS in FIG. 16A). The dummy gate layer D124 may include, for example, polysilicon, and the capping layer D126 may include, for example, a silicon nitride film.

After a plurality of outer insulating spacers 118 are respectively formed to cover both sidewalls of the plurality of dummy gate structures DGS, a portion of each of the plurality of sacrificial semiconductor layers 104 and the plurality of nanosheet semiconductor layers NS, a portion of the bottom semiconductor sheet BS, and a portion of the etch stop layer ESL may be etched by using the plurality of dummy gate structures DGS and the plurality of outer insulating spacers 118 as etch masks. As a result, the plurality of nanosheet semiconductor layers NS may be divided into a plurality of nanosheet stacks NSS, each of which includes a first nanosheet N1, a second nanosheet N2, and a third nanosheet N3. In addition, only portions of the bottom semiconductor sheet BS, which are covered by the plurality of nanosheet stacks NSS, may be left, and a plurality of recesses R1 may be formed in an upper portion of the etch stop layer ESL. The plurality of recesses R1 may be formed by using, for example, a dry etching process, a wet etching process, or a combination thereof. After the plurality of recesses R1 are formed, a plurality of recess-side insulating spacers 119 may be formed adjacent to the plurality of recesses R1 on both sides of each of the fin regions F1 on the first isolation insulating film 112.

Figure 16A:
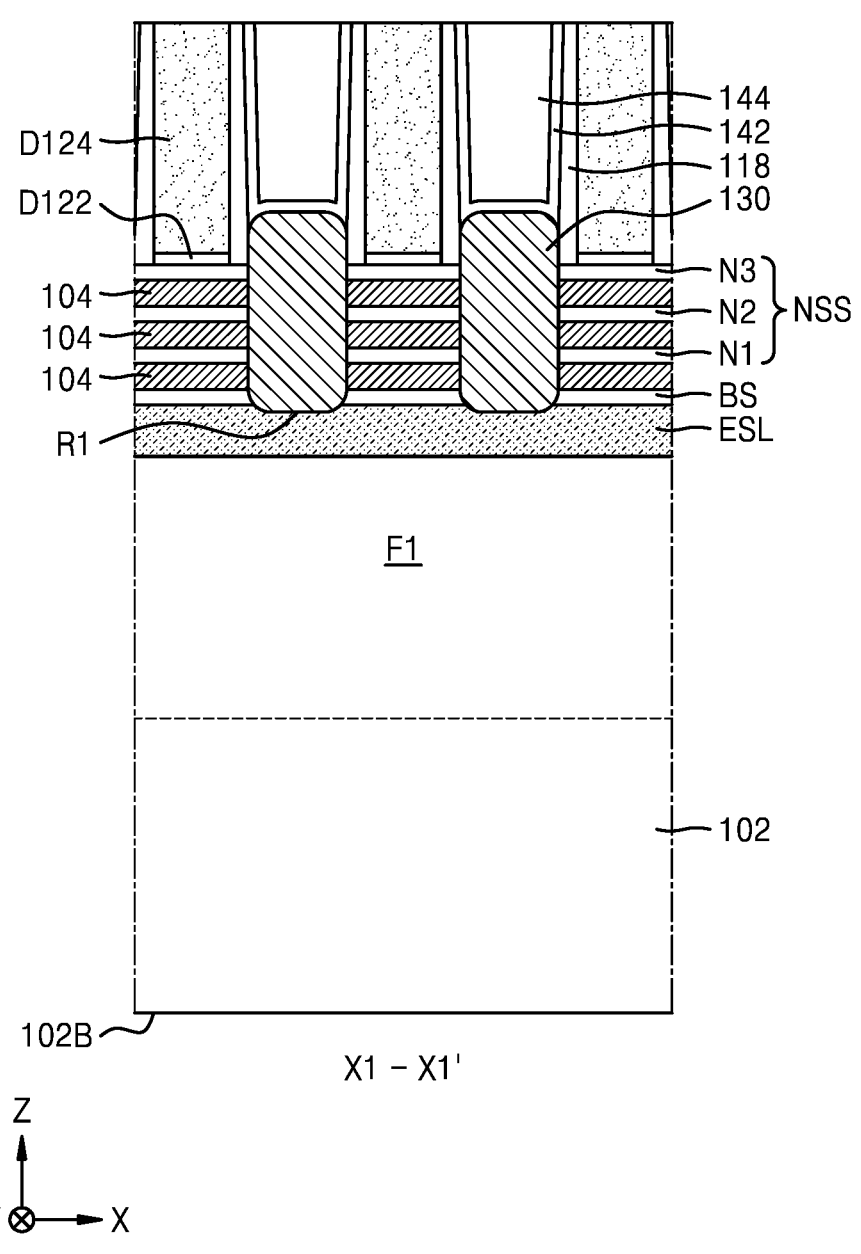
Figure 16B:
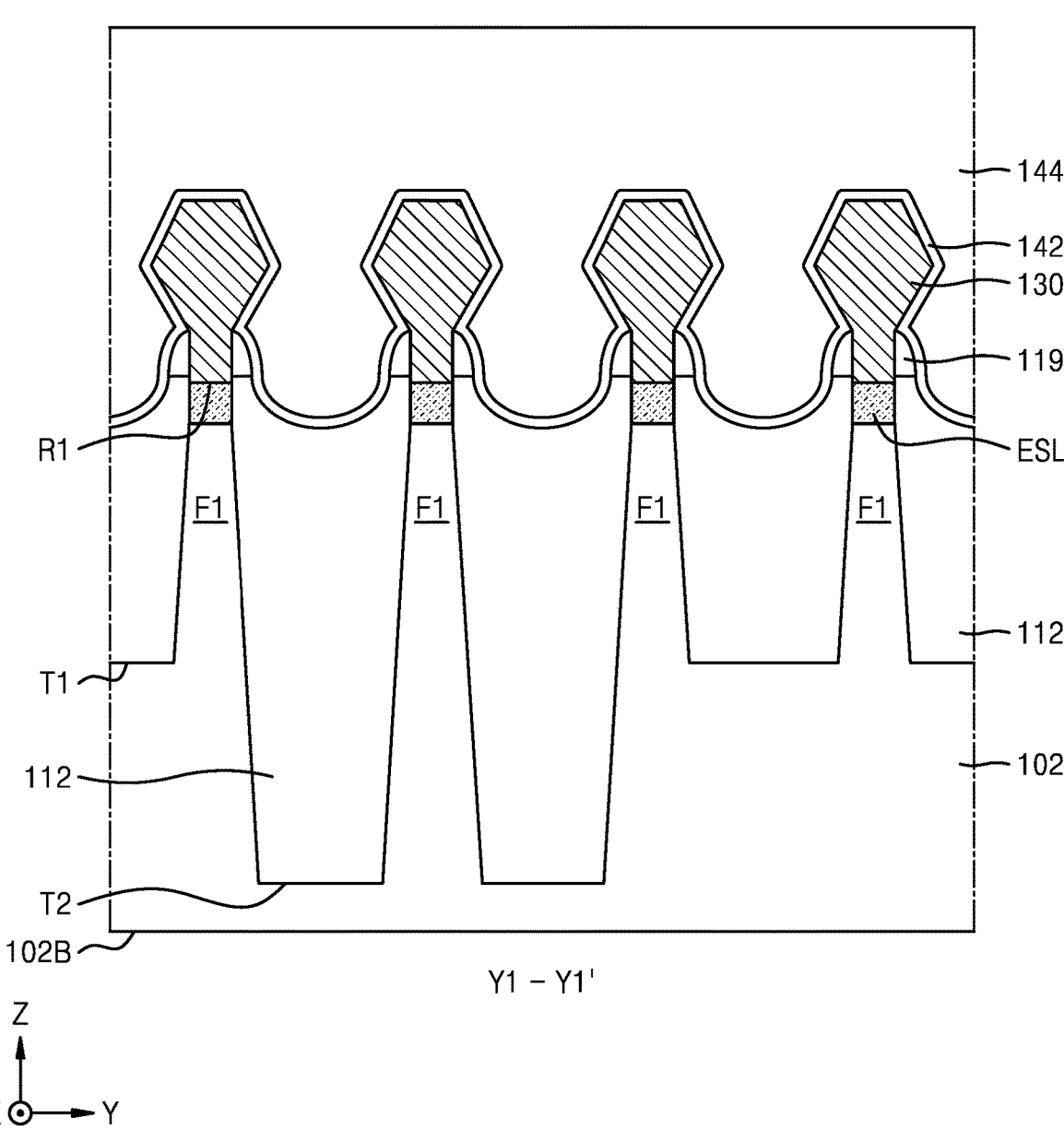
Figure 16C:
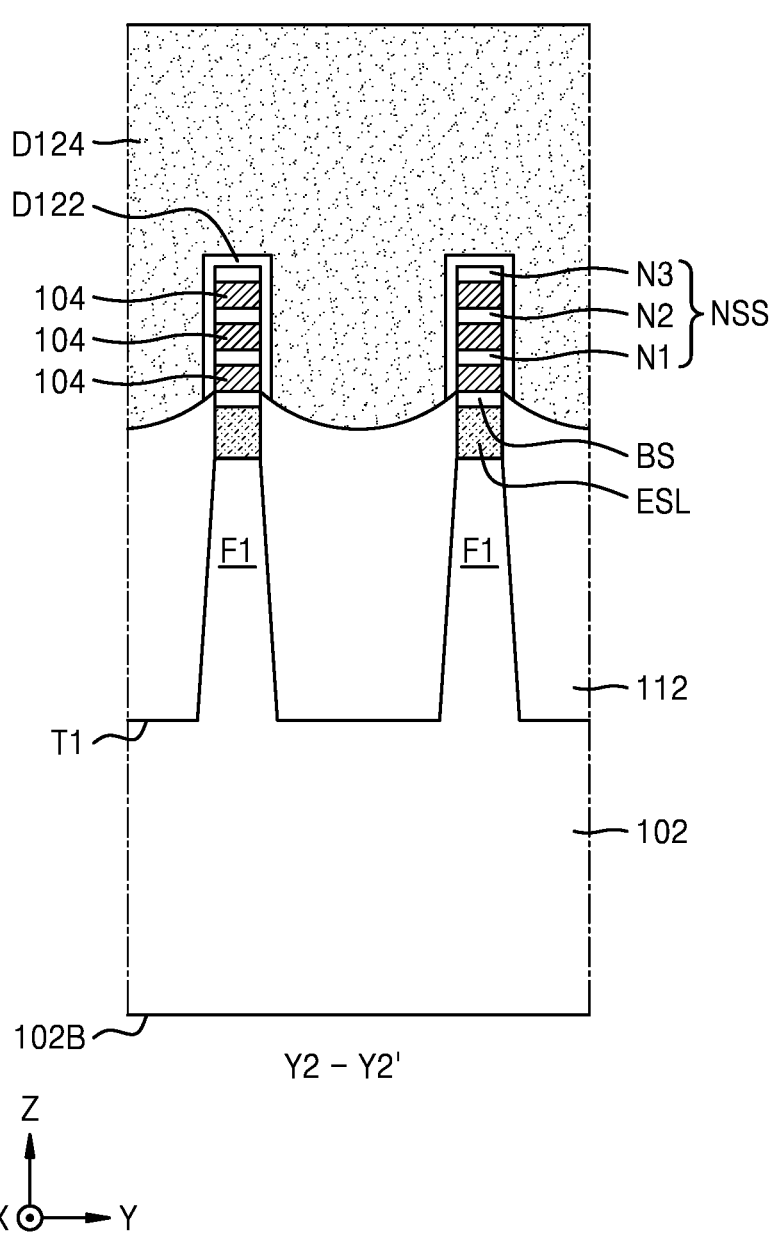

As shown in FIGS. 16A, 16B, and 16C, in the resultant structure of FIGS. 15A, 15B, and 15C, a plurality of source/drain regions 130 may be formed to fill the plurality of recesses R1. To form the plurality of source/drain regions 130, a semiconductor material may be epitaxially grown from a sidewall of each of the first to third nanosheets N1, N2, and N3 included in the nanosheet stack NSS exposed in the plurality of recesses R1, a sidewall of the bottom semiconductor sheet BS, and a surface of the etch stop layer ESL.

In some embodiments, when the plurality of source/drain regions 130 constitute an NMOS transistor, the plurality of source/drain regions 130 may include a Si layer doped with an n-type dopant or a SiC layer doped with an n-type dopant, and the Si layer or the SiC layer included in the plurality of source/drain regions 130 may be in contact with the etch stop layer ESL.

In some embodiments, when the plurality of source/drain regions 130 constitute a PMOS transistor, the plurality of source/drain regions 130 may include a SiGe layer doped with a p-type dopant, and the SiGe layer may include a blocking layer in contact with the etch stop layer ESL and a main body layer apart from a backside contact structure DBC with the blocking layer therebetween. A Ge content ratio of the blocking layer may be lower than a Ge content ratio of the etch stop layer ESL. For example, the etch stop layer ESL may include a $Si_{1-x}Ge_x$ layer ($0.25 \leq x \leq 0.70$), and the blocking layer may include a $Si_{1-x}Ge_x$ layer ($0.05 \leq x \leq 0.07$) doped with a B element.

Afterwards, an insulating liner 142 may be formed to cover the resultant structure including the plurality of source/drain regions 130, and an inter-gate dielectric film 144 may be formed on the insulating liner 142. Thereafter, a portion of each of the insulating liner 142 and the inter-gate dielectric film 144 may be etched to expose top surfaces of a plurality of capping layers D126. Thereafter, the dummy gate layer D124 may be exposed by removing the plurality of capping layers D126, and the insulating liner 142 and the inter-gate dielectric film 144 may be partially removed such that a top surface of the inter-gate dielectric film 144 and a top surface of the dummy gate layer D124 become at the substantially same level as each other.

Figure 17A:
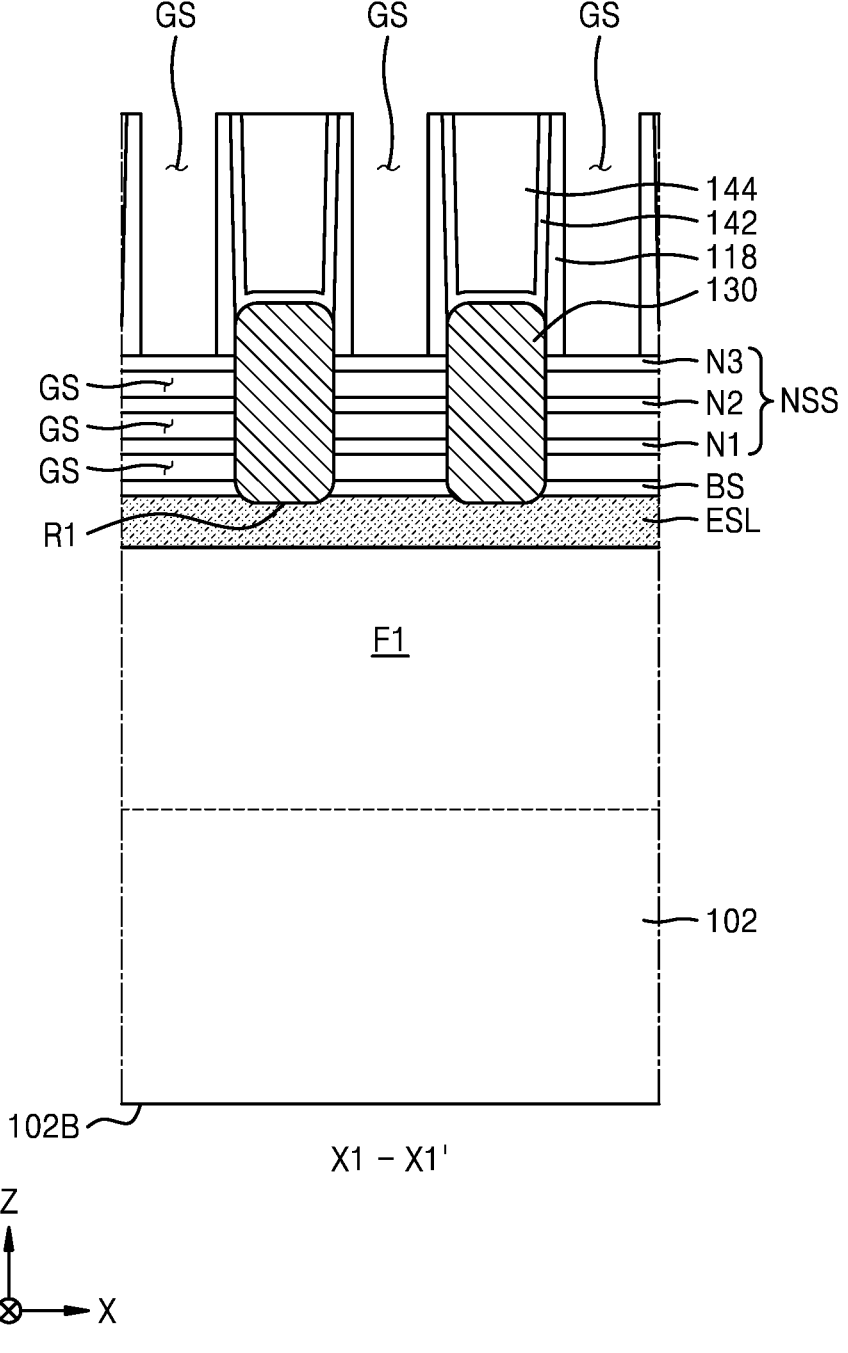
Figure 17B:
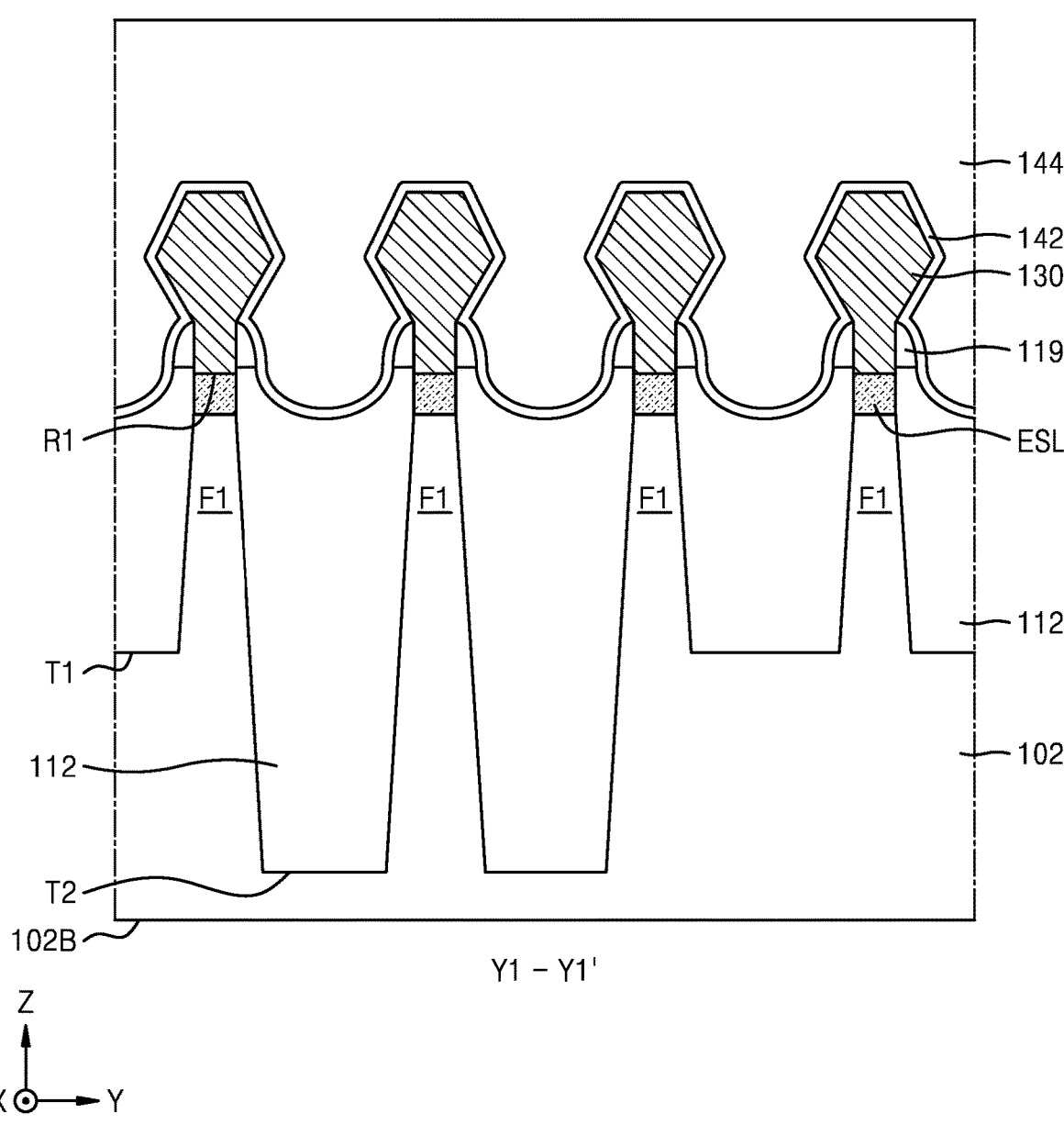
Figure 17C:
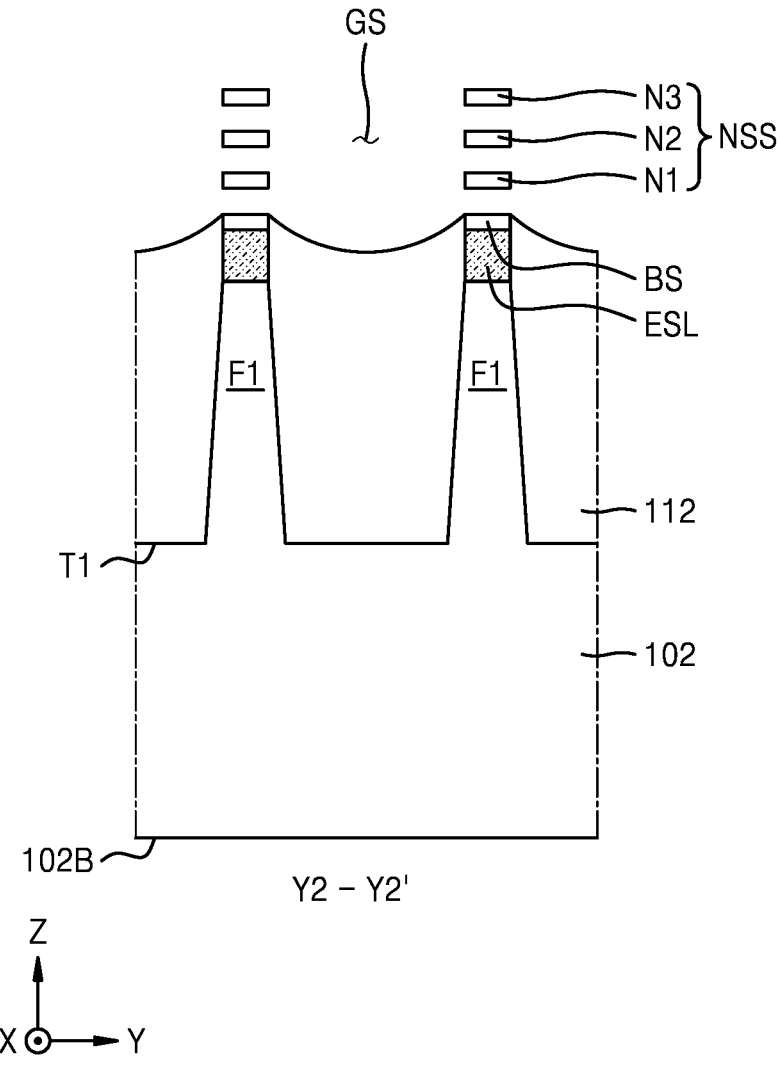

Referring to FIGS. 17A, 17B, and 17C, a gate space GS may be prepared by removing the dummy gate layer D124 and the oxide film D122 located thereunder from the resultant structure of FIGS. 16A, 16B, and 16C, and the plurality of nanosheet stacks NSS may be exposed through the gate space GS. Afterwards, the plurality of sacrificial semiconductor layers 104 remaining on the fin region F1 may be removed through the gate space GS, and thus, the gate space GS may extend to respective spaces between the first to third nanosheets N1, N2, and N3 and a space between the first nanosheet N1 and the bottom semiconductor sheet BS. In some embodiments, to selectively remove the plurality of sacrificial semiconductor layers 104, etch selectivities of the first to third nanosheets N1, N2, and N3 and the bottom semiconductor sheet BS with respect to the plurality of sacrificial semiconductor layers 104 may be used.

A liquid or gaseous etchant may be used to selectively remove the plurality of sacrificial semiconductor layers 104. In some embodiments, to selectively remove the plurality of sacrificial semiconductor layers 104, a CH$_3$COOH-based etchant, for example, an etchant including a mixture of CH$_3$COOH, HNO$_3$, and HF or an etchant including a mixture of CH$_3$COOH, H$_2$O$_2$, and HF may be used, without being limited thereto.

Figure 18A:
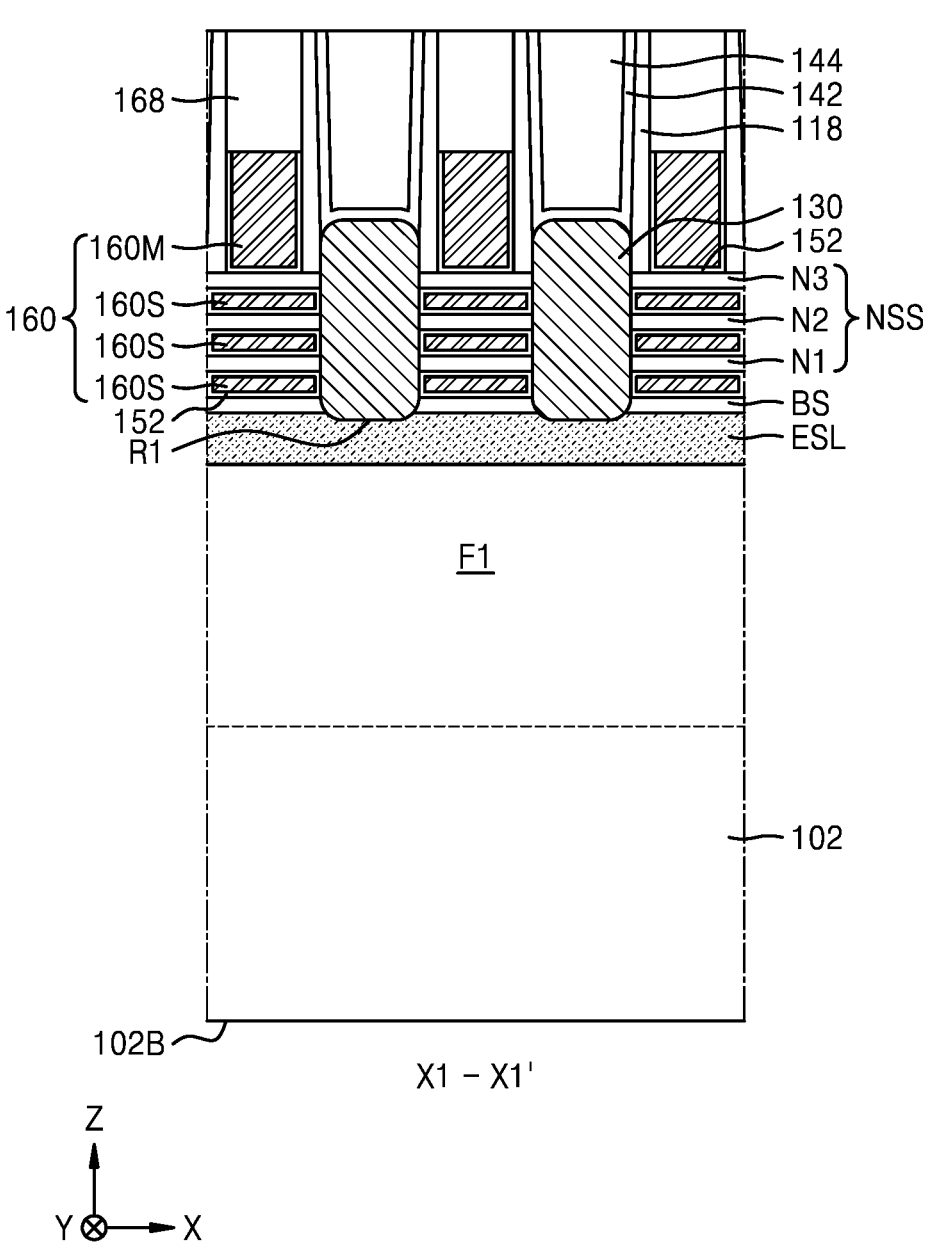
Figure 18B:
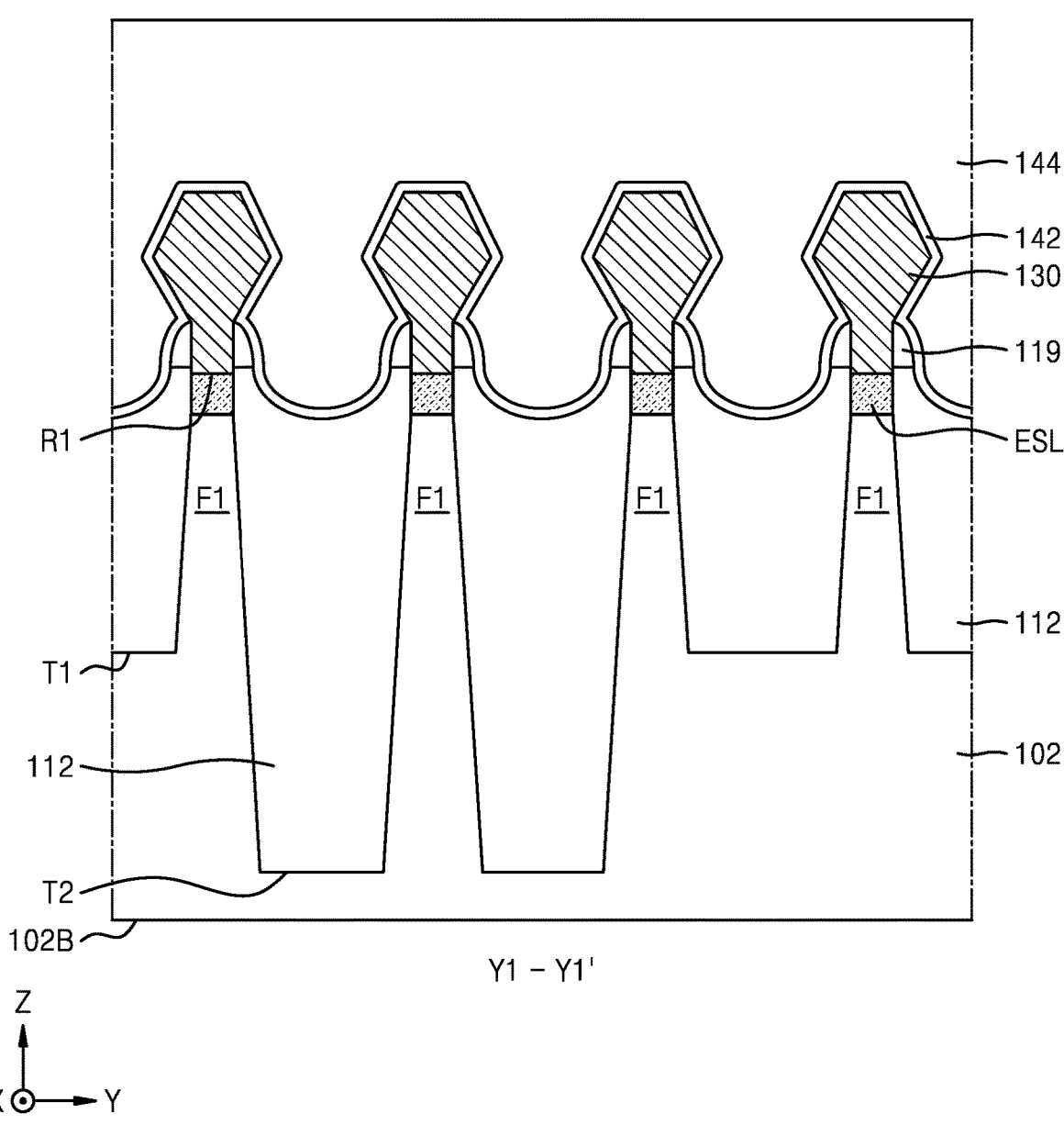
Figure 18C:
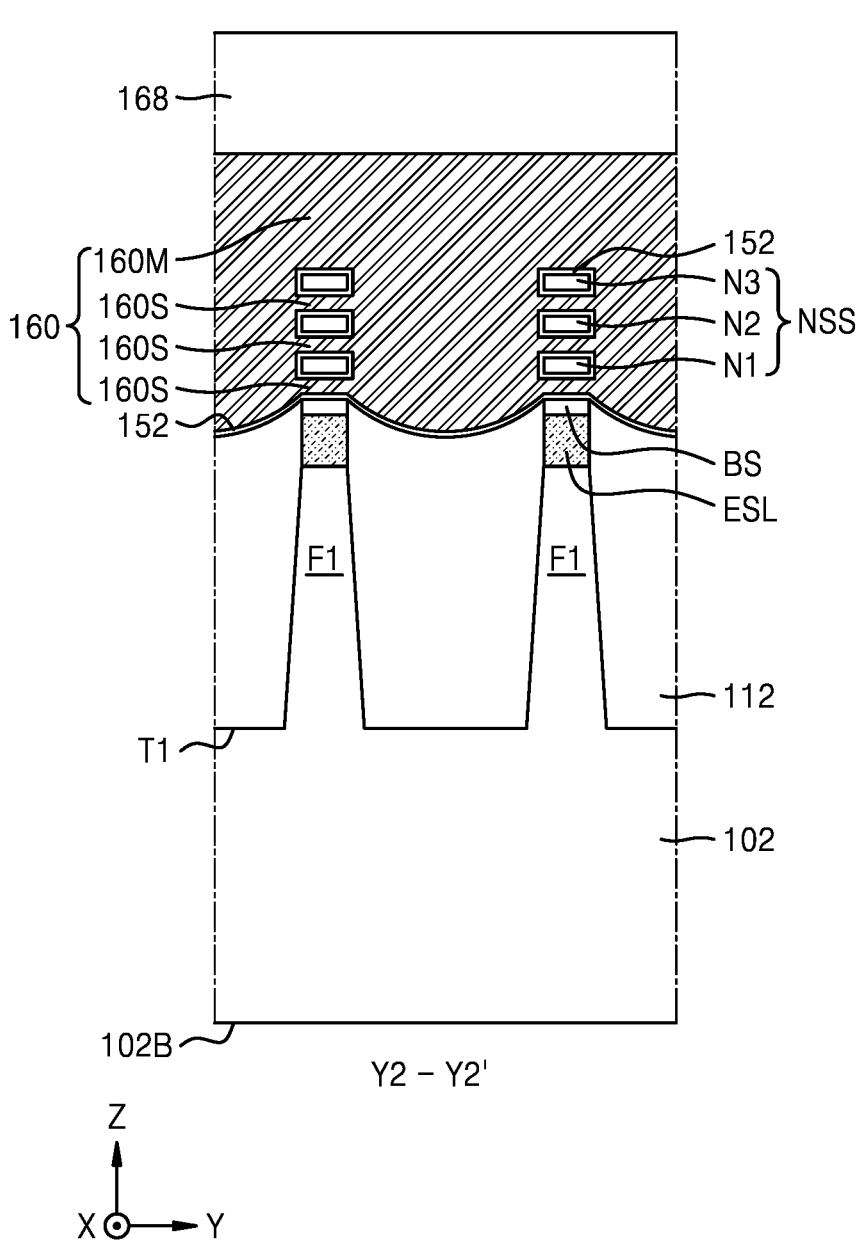

Referring to FIGS. 18A, 18B, and 18C, in the resultant structure of FIGS. 17A, 17B, and 17C, a gate dielectric film 152 may be formed to cover respective exposed surfaces of the first to third nanosheets N1, N2, and N3, the bottom semiconductor sheet BS, and the first isolation insulating film 112. The gate dielectric film 152 may be formed by using, for example, an atomic layer deposition (ALD) process.

Thereafter, a gate line 160 and a capping insulating pattern 168 may be formed. The gate line 160 may fill the gate space (refer to GS in FIGS. 17A and 17C) on the gate dielectric film 152. The capping insulating pattern 168 may cover a top surface of each of the gate line 160 and the gate dielectric film 152 in the gate space GS.

Figure 19A:
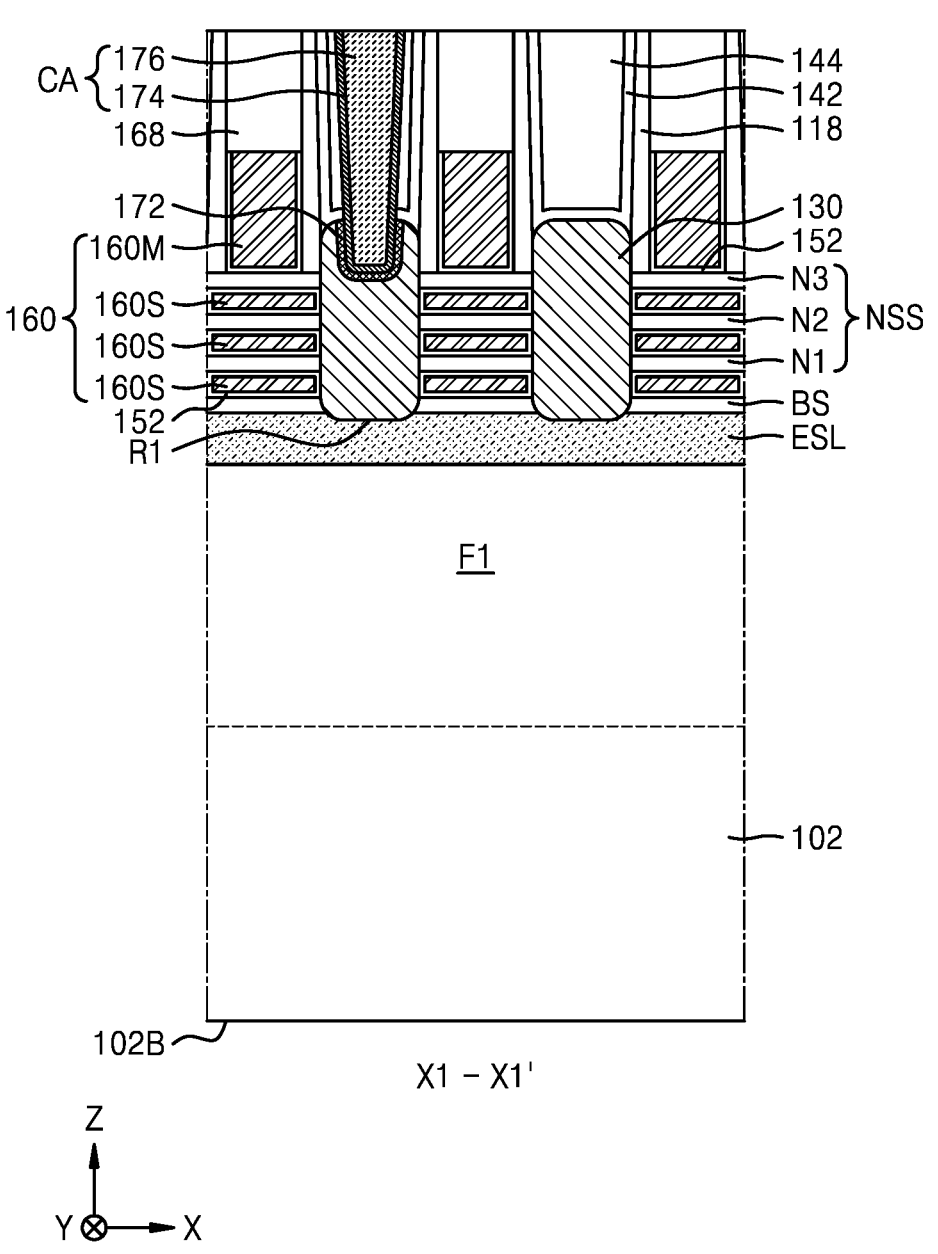
Figure 19B:
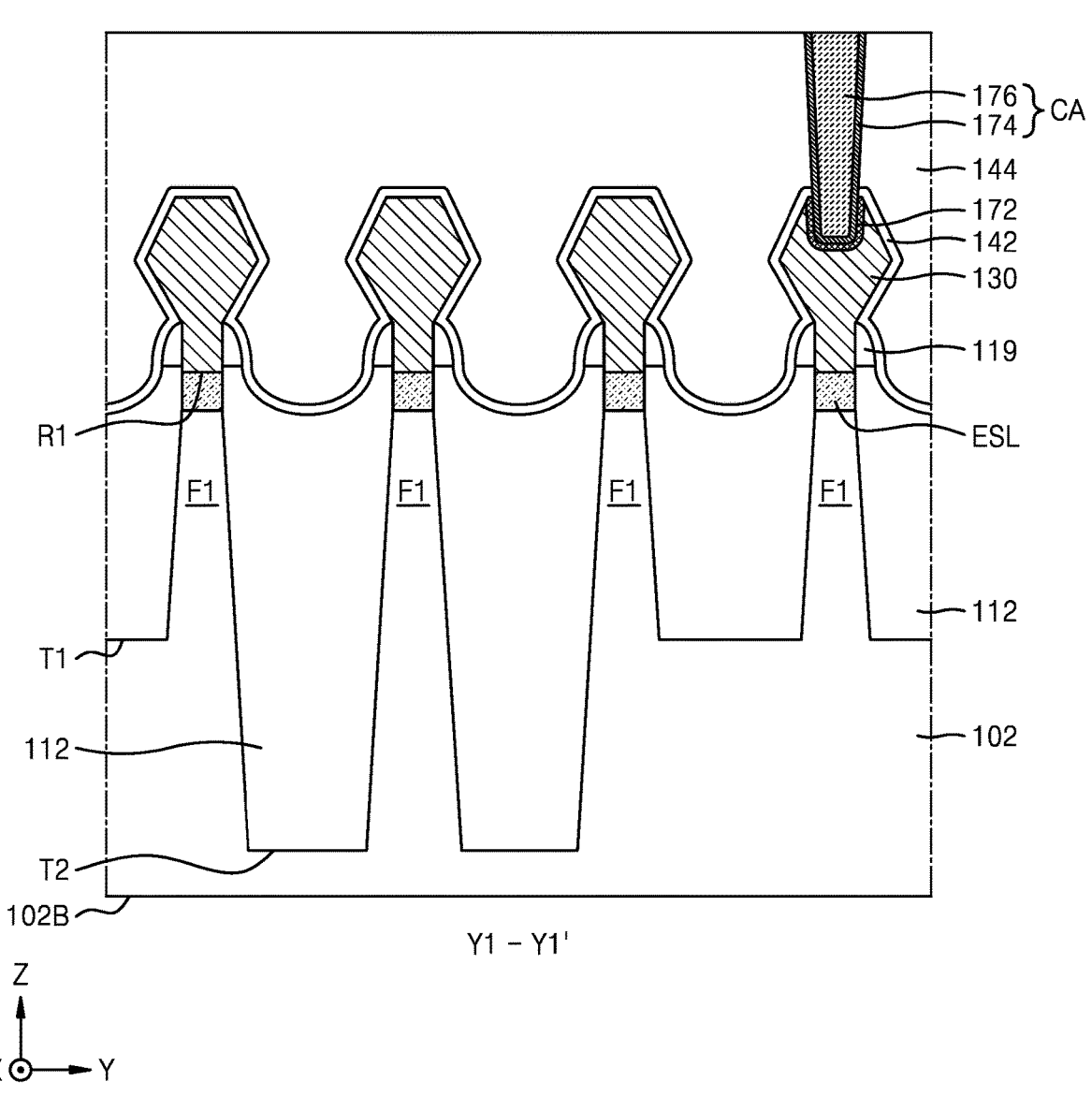

Referring to FIGS. 19A and 19B, in the resultant structure of FIGS. 18A, 18B, and 18C, a plurality of source/drain contact holes exposing the source/drain region 130 may be formed to pass through the inter-gate dielectric film 144 and the insulating liner 142. Thereafter, a partial region of the source/drain region 130 may be removed by using, for example, an anisotropic etching process through the plurality of source/drain contact holes, and thus, the plurality of source/drain contact holes may extend in a longer manner toward the substrate 102. Afterwards, a metal silicide film 172 may be formed on the source/drain region 130 exposed at each of the plurality of source/drain contact holes. In some embodiments, the formation of the metal silicide film 172 may include forming a metal liner (not shown) conformally covering the exposed surface of the source/drain region 130 and annealing the metal liner to induce a reaction of the source/drain region 130 with a metal included in the metal liner. After the metal silicide film 172 is formed, the remaining portion of the metal liner may be removed. A portion of the source/drain region 130 may be consumed during the formation of the metal silicide film 172. In some embodiments, when the metal silicide film 172 includes a titanium silicide film, the metal liner may include a titanium (Ti) film. Thereafter, a front-side contact structure CA including a conductive barrier pattern 174 and a contact plug 176 may be formed inside each of the plurality of source/drain contact holes.

Figure 20A:
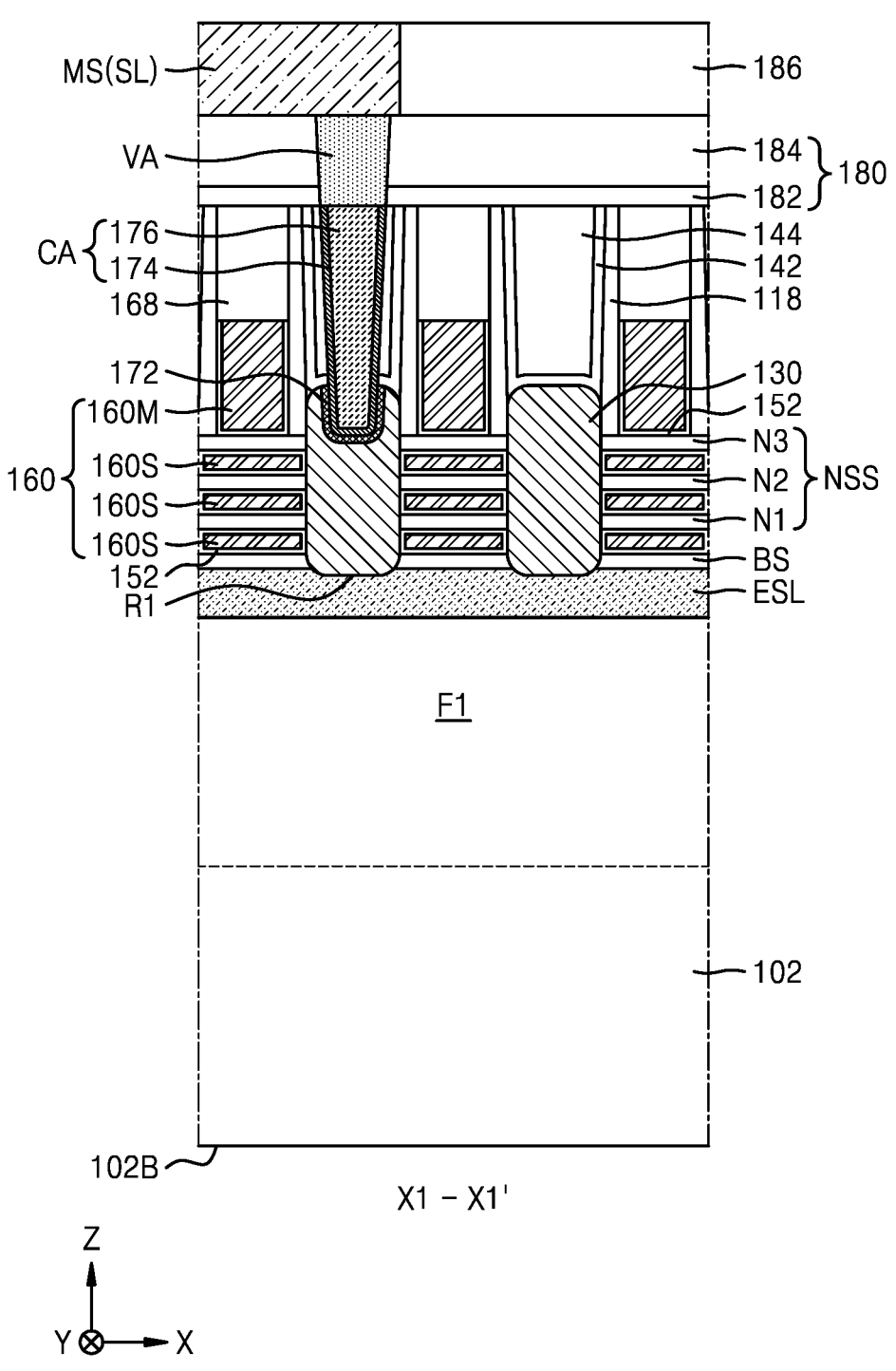
Figure 20B:
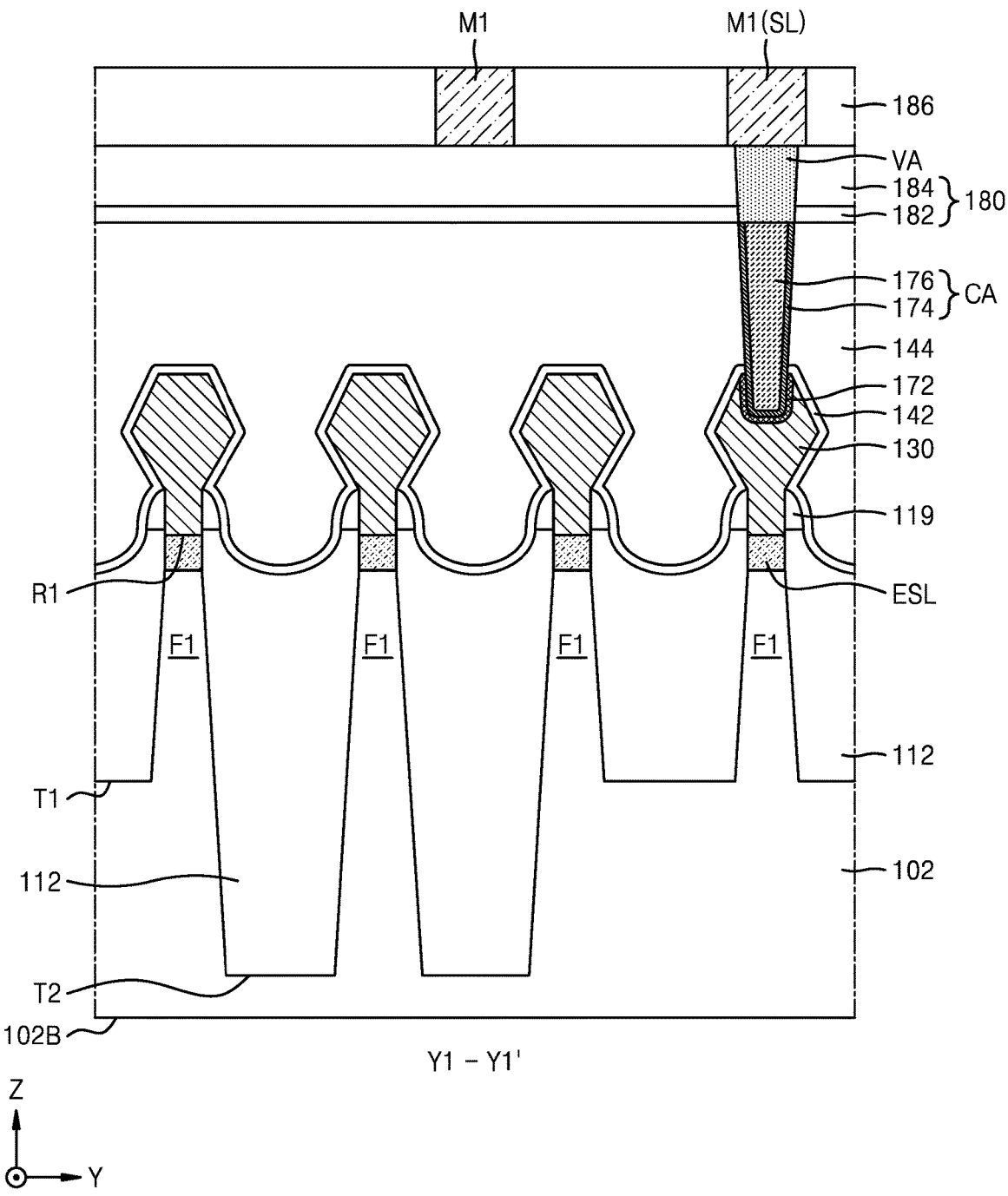
Figure 20C:
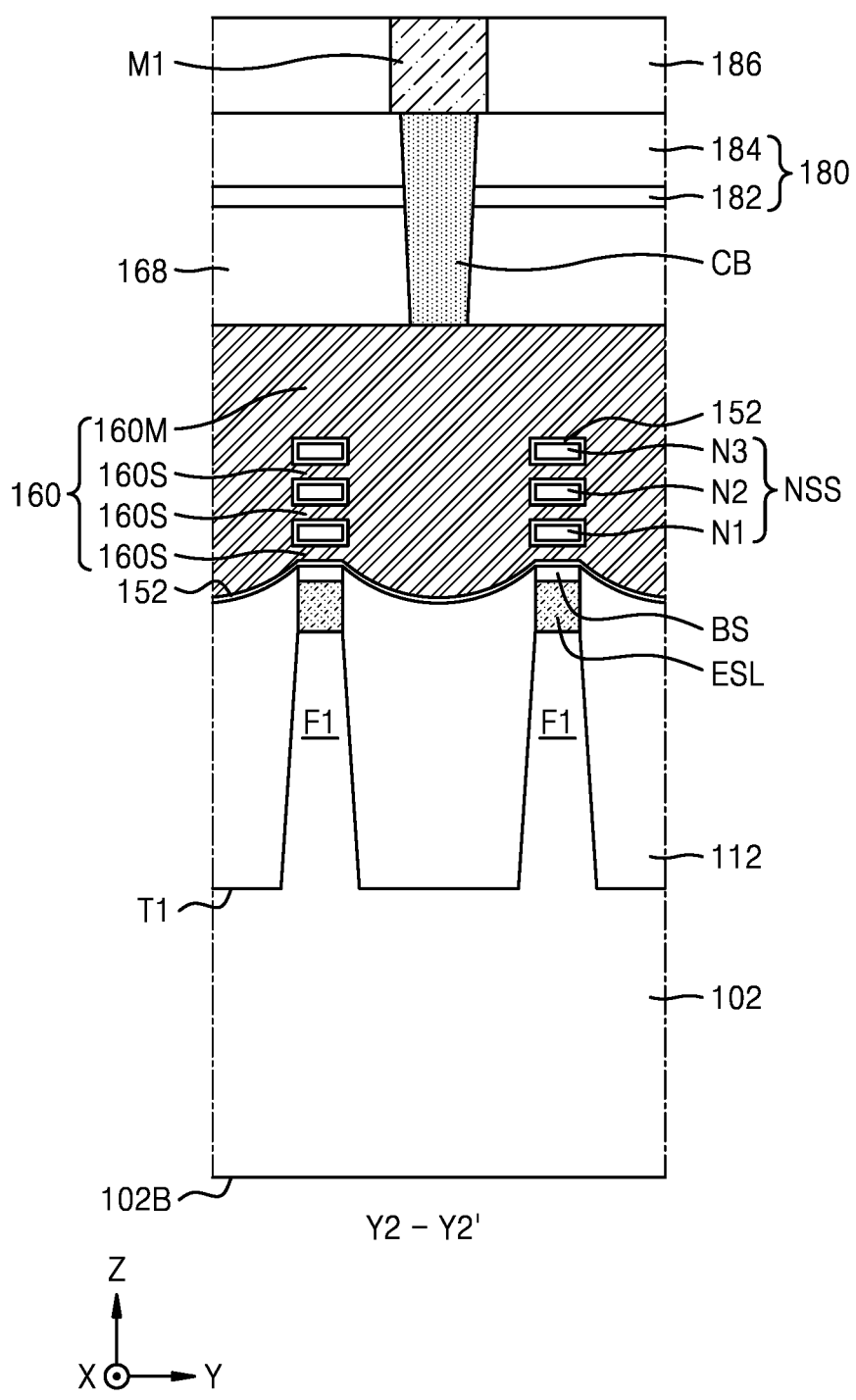
Figure 21A:
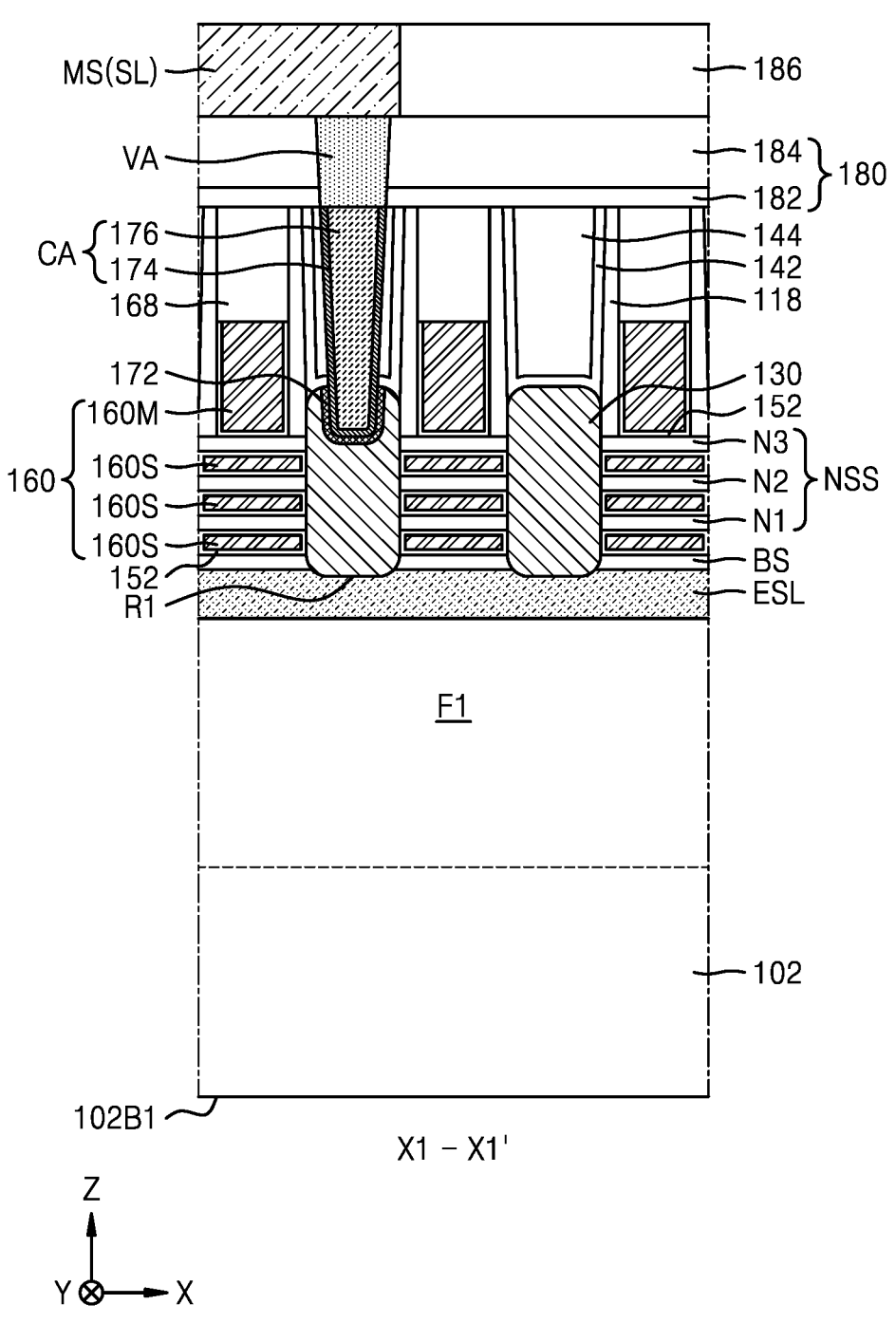
Figure 21B:
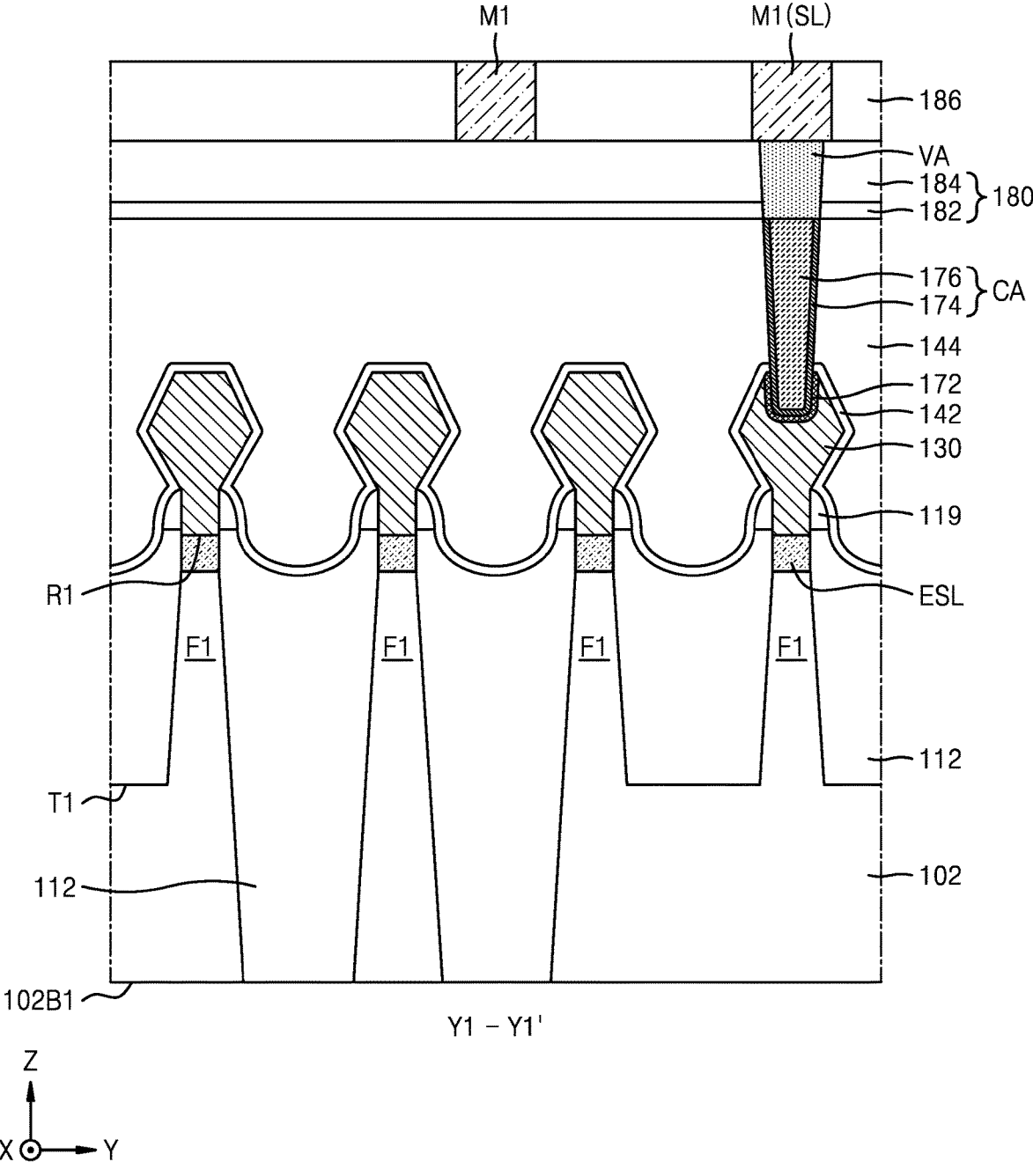
Figure 21C:
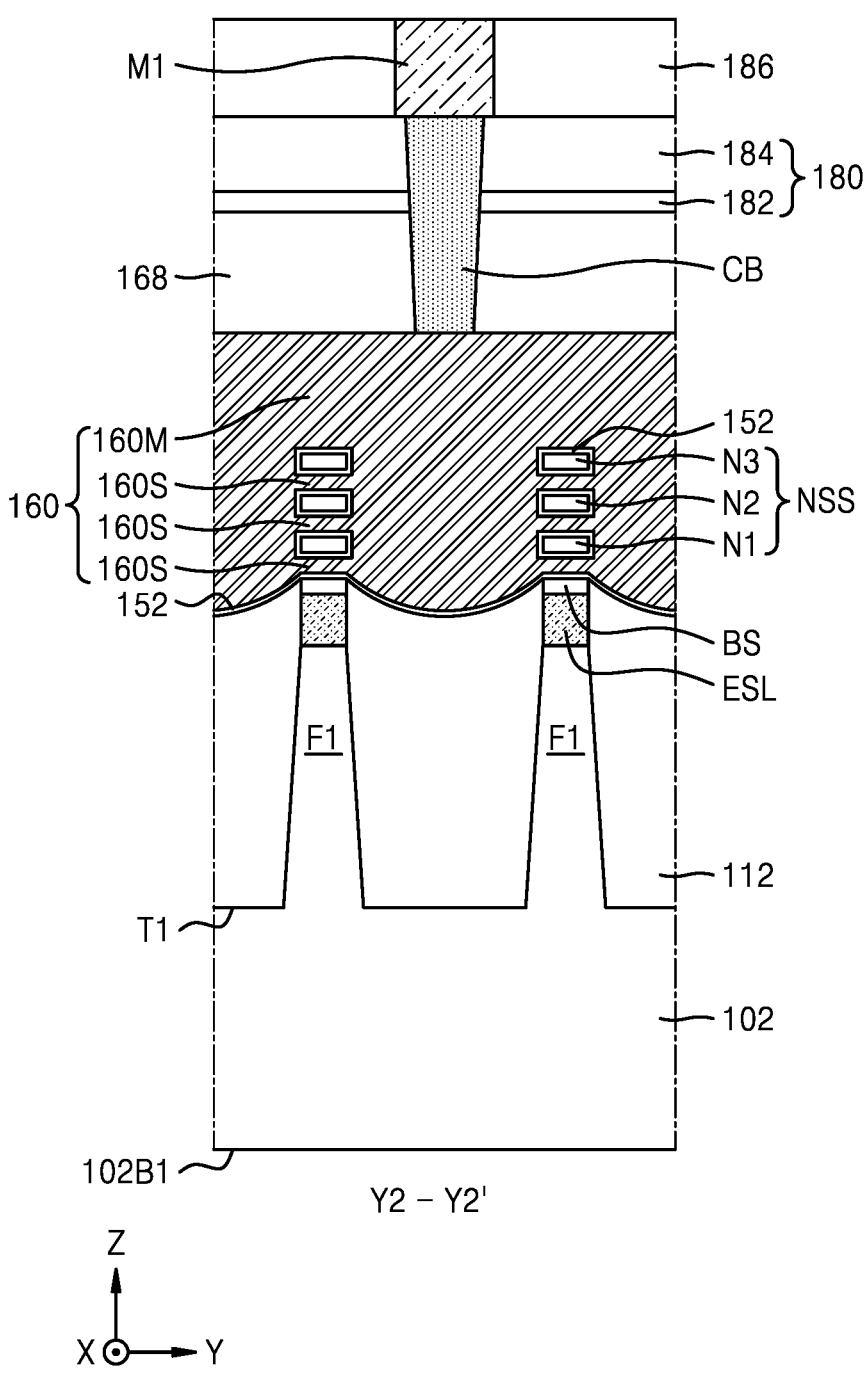
Figure 21D:
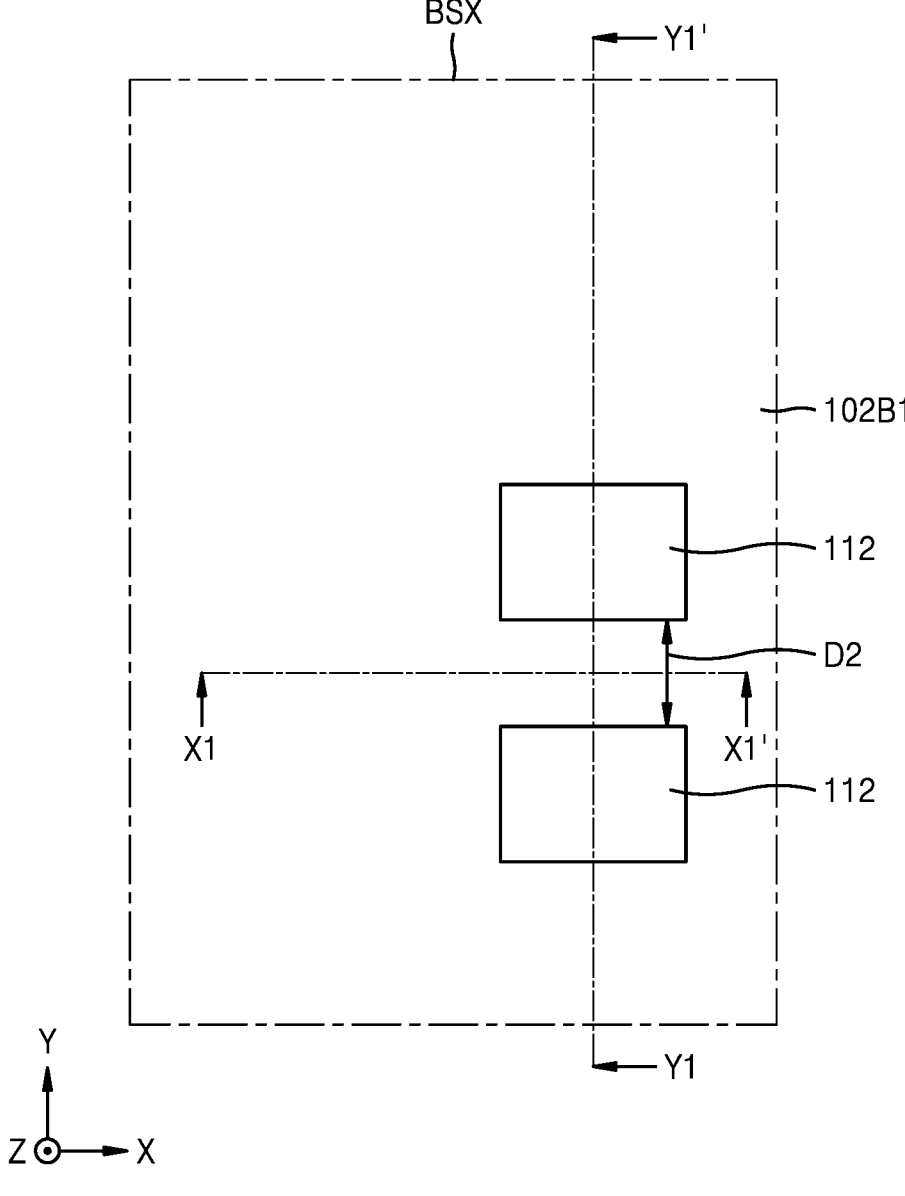

Referring to FIGS. 20A, 20B, and 20C, in the resultant structure of FIGS. 19A and 19B, an etch stop film 182 and an upper insulating film 184 may be sequentially formed to cover a top surface of each of the inter-gate dielectric film 144, a plurality of front-side contact structures CA, and a plurality of capping insulating patterns 168, and thus, an upper insulating structure 180 may be formed.

Afterwards, a plurality of source/drain via contacts VA and a gate contact CB may be formed. The plurality of source/drain via contacts VA may pass through the upper insulating structure 180 in the vertical direction (e.g., Z direction) and be connected to the plurality of front-side contact structures CA. The gate contact CB may pass through the upper insulating structure 180 and the capping insulating pattern 168 in the vertical direction (e.g., Z direction) and be connected to the gate line 160. The source/drain via contact VA and the gate contact CB may be formed simultaneously or by using separate processes. The order of formation of the source/drain via contact VA and the gate contact CB is not specifically limited.

Afterwards, an interlayer insulating film 186 may be formed to cover the upper insulating structure 180, and a plurality of upper wiring layers M1 may be formed to pass through the interlayer insulating film 186. The plurality of upper wiring layers M1 may include an upper wiring layer M1 connected to the source/drain via contact VA and an upper wiring layer M1 connected to the gate contact CB. From among the plurality of upper wiring layers M1, an upper wiring layer M1, which is connected to the front-side contact structure CA through the source/drain via contact VA, may be used as a signal line SL.

Referring to FIGS. 21A, 21B, 21C, and 21D, in the resultant structure of FIGS. 20A, 20B, and 20C, a portion of the substrate 102 may be removed from the backside surface 102B of the substrate 102, and thus, bottom surfaces of portions of the first isolation insulating film 112, which respectively fill the plurality of second trench regions (refer to T2 in FIG. 20B), may be formed. The portion of the substrate 102 may be removed by using, for example, at least one selected from a mechanical grinding process, a chemical mechanical polishing (CMP) process, a wet etching process, and a combination thereof.

After the portion of the substrate 102 is removed, the backside surface 102B1 of the substrate 102 may be coplanar with a surface of each of the exposed portions of the first isolation insulating film 112, and portions of the first isolation insulating film 112, which fill the plurality of first trench regions T1, may be covered by the remaining portion of the substrate 102 without being exposed.

Figure 22:
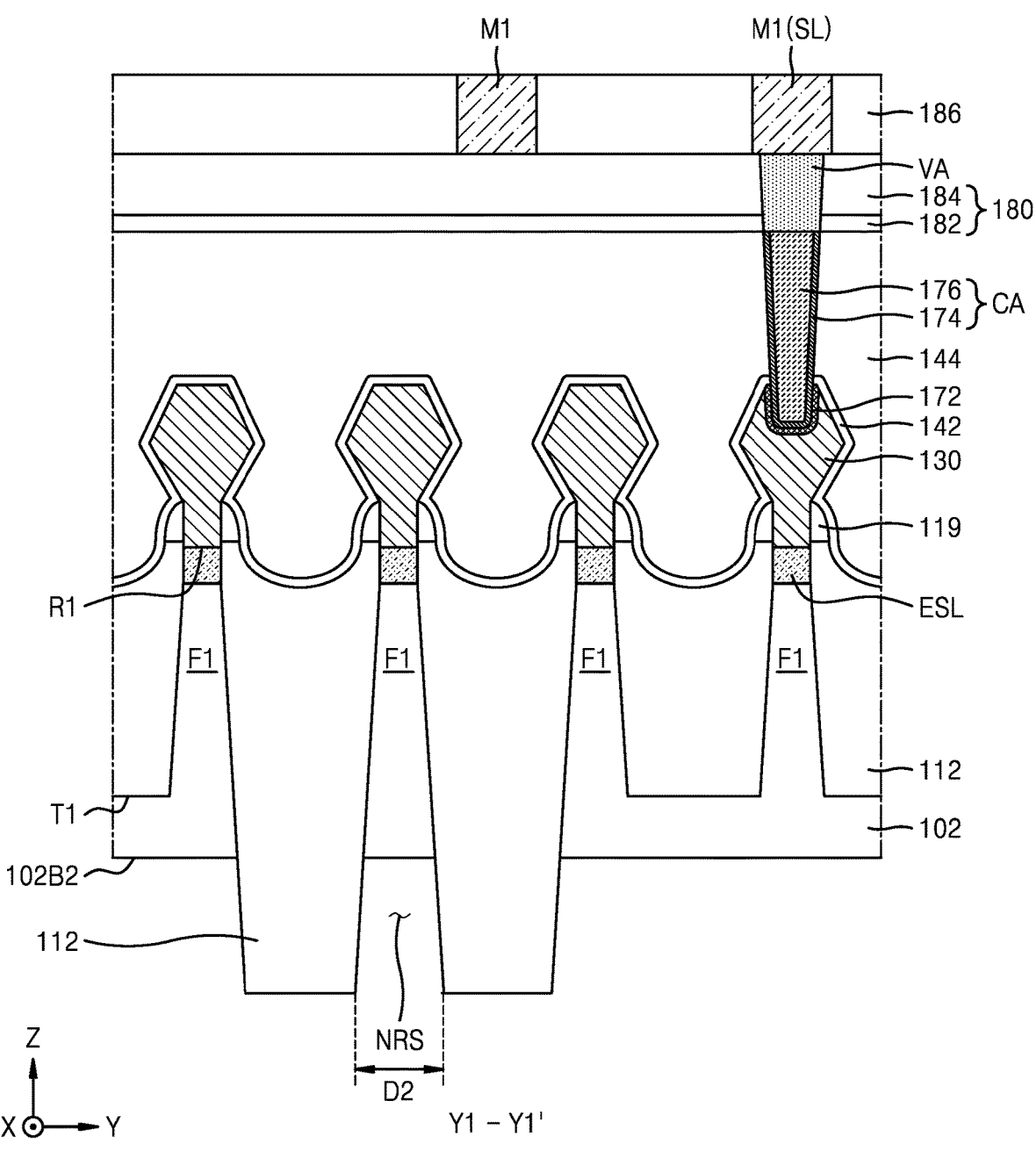

Referring to FIG. 22, in the resultant structure of FIGS. 21A, 21B, 21C, and 21D, a portion of the substrate 102 may be further removed from the backside surface 102B1 of the substrate 102, and thus, portions of the first isolation insulating film 112, which fill the plurality of second trench regions (refer to T2 in FIG. 20B), may protrude beyond the backside surface 102B2 of the substrate 102. A narrow space NRS may remain between the portions of the first isolation insulating film 112, which protrude beyond the backside surface 102B2 of the substrate 102. The narrow space NRS may have a width D2 less than widths of other spaces around the protruding portions of the first isolation insulating film 112 in the second lateral direction (e.g., Y direction).

To further remove a portion of the substrate 102 according to the process described with reference to FIG. 22, a process similar to that described with reference to FIGS. 21A, 21B, 21C, and 21D may be performed. After the portion of the substrate 102 is further removed, the portions of the first isolation insulating film 112, which fill the plurality of first trench regions T1, may be covered by the remaining portion of the substrate 102 without being exposed.

Figure 23:
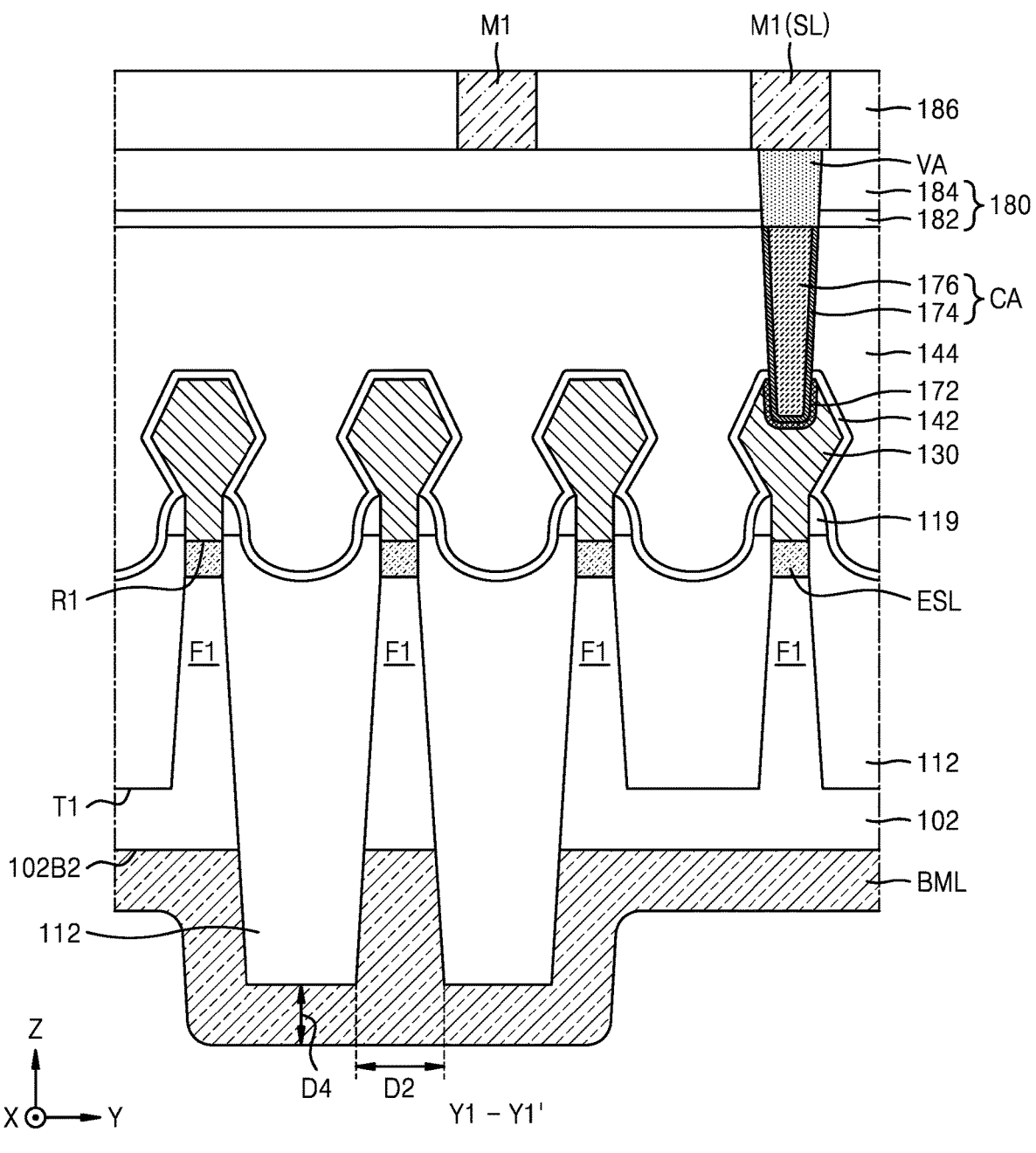
Figure 24A:
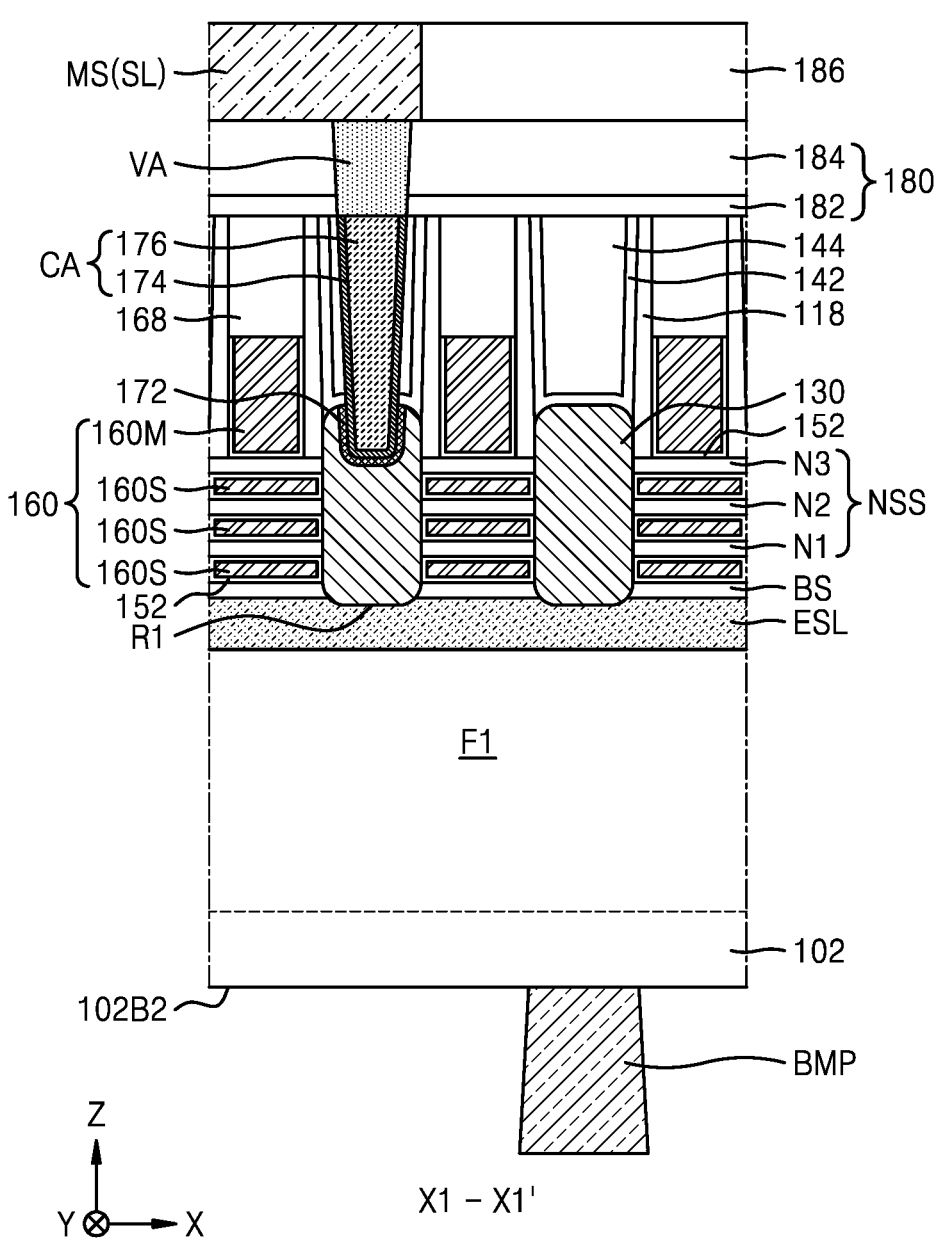
Figure 24B:
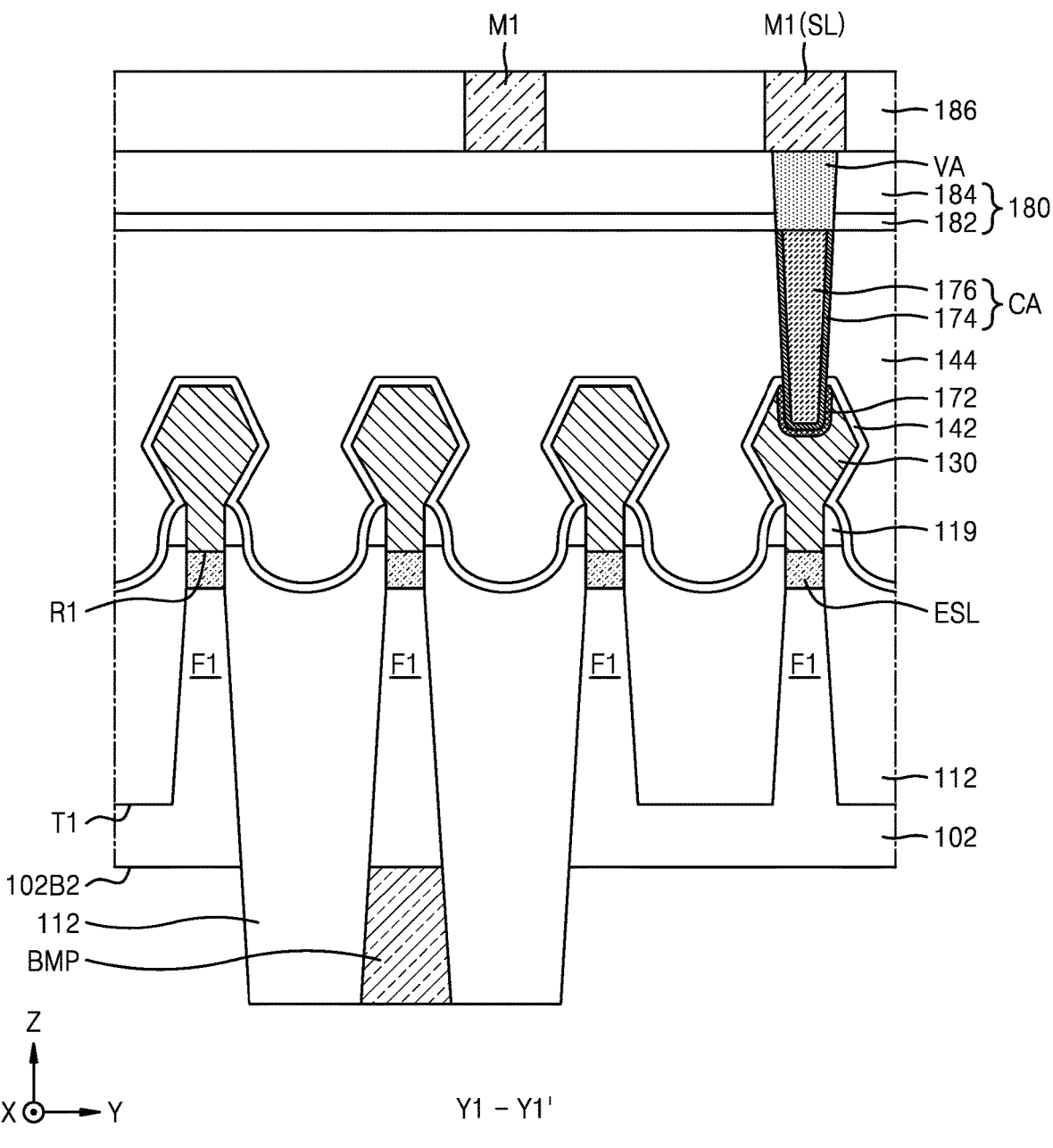
Figure 24C:
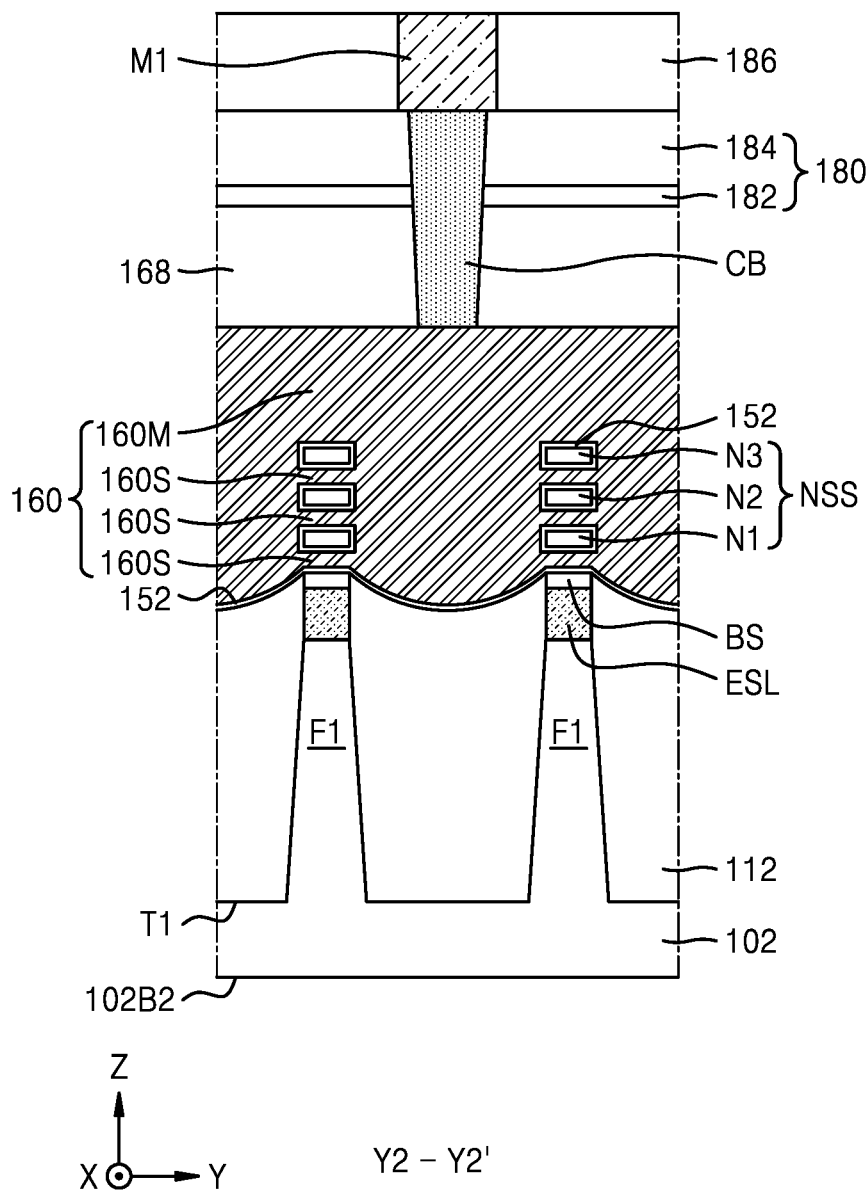
Figure 24D:
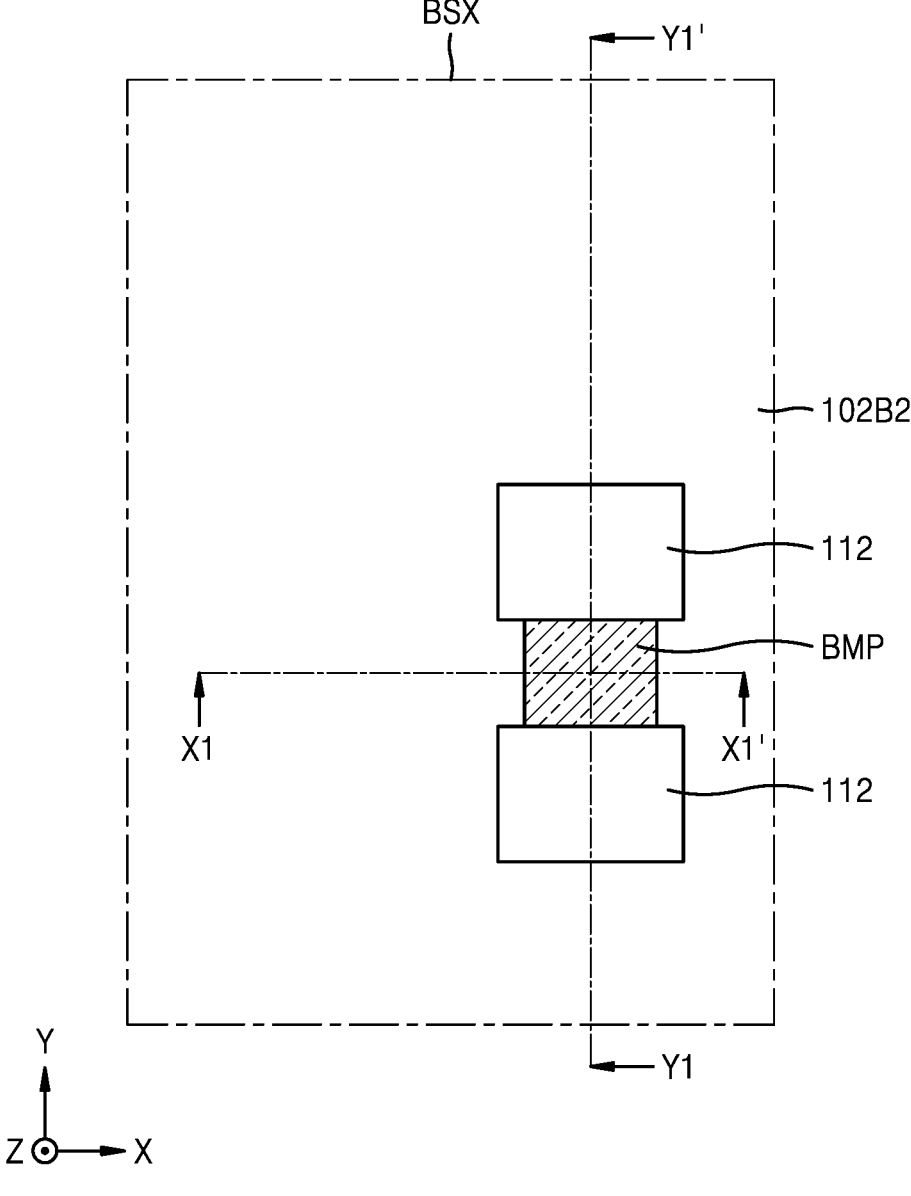

Referring to FIG. 23, in the resultant structure of FIG. 22, a blocking mask layer BML may be formed on the backside surface 102B2 of the substrate 102. A thickness D4 of the blocking mask layer BML may be greater than ½ of the width D2 of the narrow space NRS between the portions of the first isolation insulating film 112, which protrude beyond the backside surface 102B2 of the substrate 102, in the second lateral direction (e.g., Y direction). Accordingly, after the blocking mask layer BML is formed, the narrow space (refer to NRS in FIG. 22) between the portions of the first isolation insulating film 112, which protrude beyond the backside surface 102B2 of the substrate 102, may be filled with the blocking mask layer BML without empty space. In some embodiments, the blocking mask layer BML may include a silicon nitride film, a titanium nitride film, an aluminum oxide film, or a combination thereof, without being limited thereto.

Referring to FIGS. 24A, 24B, 24C, and 24D, a portion of the blocking mask layer BML may be removed from the resultant structure of FIG. 23, and thus, a blocking mask pattern BMP including only a portion of the blocking mask layer BML, which fills the narrow space (refer to NRS in FIG. 22), may be formed. After the blocking mask pattern BMP is formed, the backside surface 102B2 of the substrate 102 may be exposed around the blocking mask pattern BMP and the protruding portions of the first isolation insulating film 112, which cover both side surfaces of the blocking mask pattern BMP.

In some embodiments, a process through which the blocking mask layer BML are removed may be performed by using a wet etching process. For example, an etchant, which includes, for example, a phosphoric acid-containing etchant, a peroxide-containing etchant, an ammonia-containing etchant, a hydrofluoric acid-containing etchant, or a combination thereof, may be used according to a material included in the blocking mask layer BML, without being limited thereto.

Figure 25A:
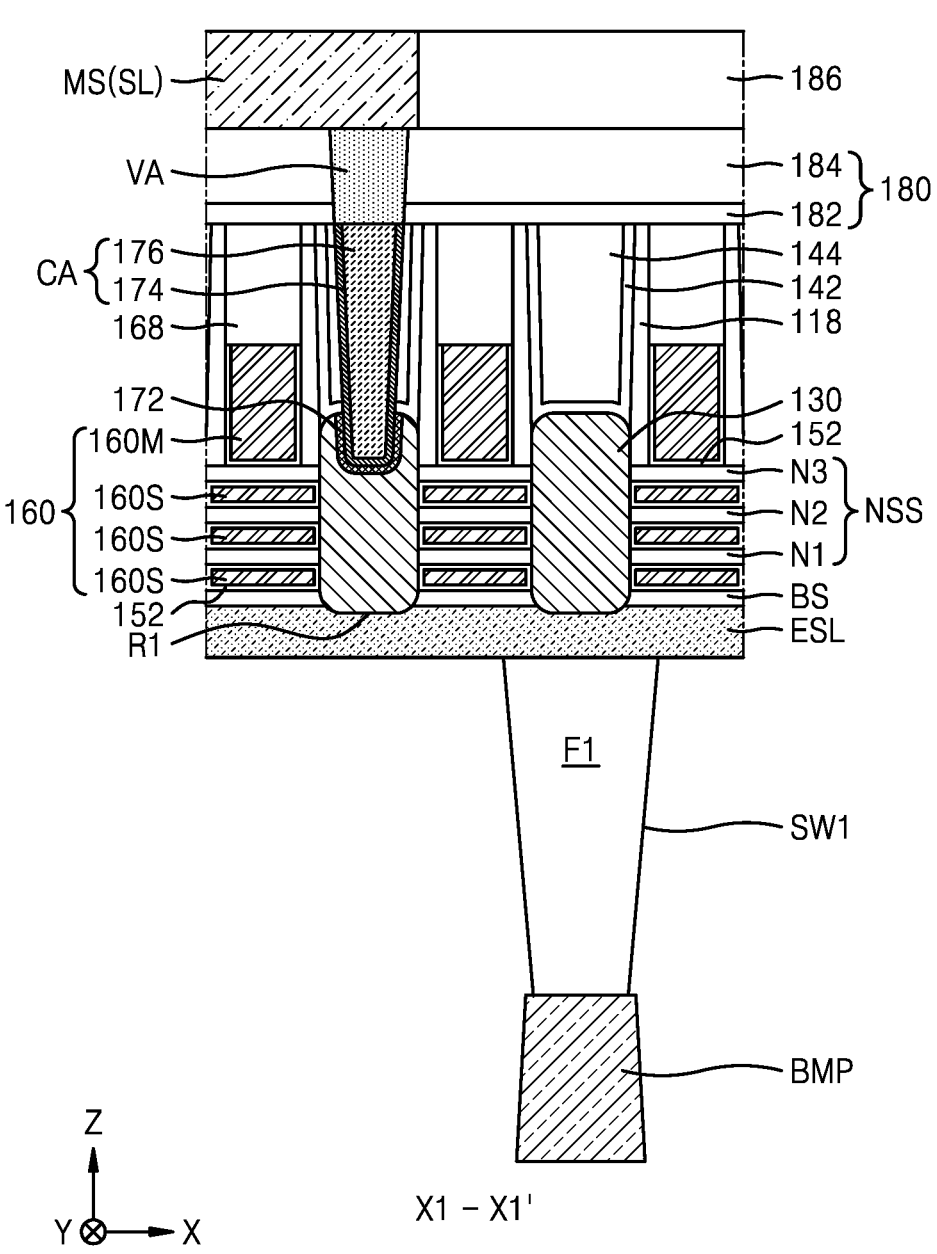
Figure 25B:
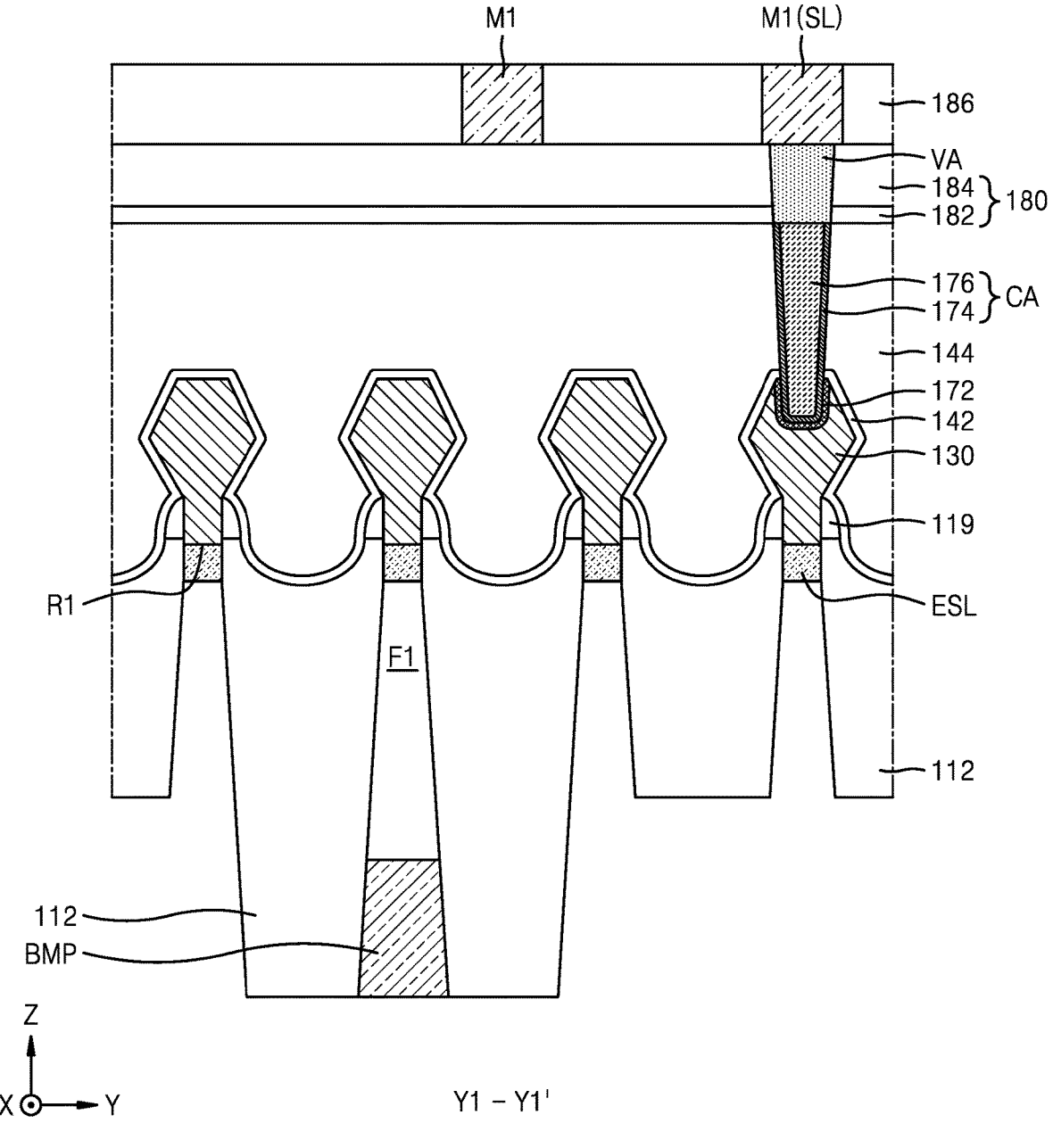
Figure 25C:
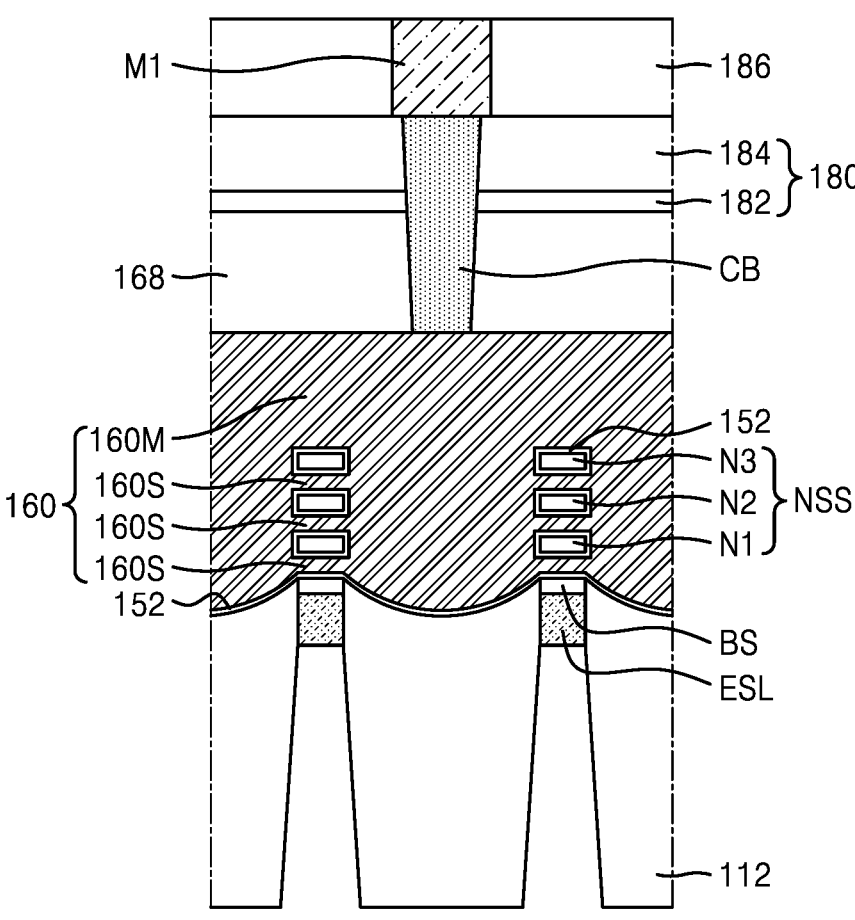
Figure 25C:

Referring to FIGS. 25A, 25B, and 25C, the substrate 102, which is exposed, may be removed by using the etch stop layer ESL as an etch stop point in the resultant structure of FIGS. 24A, 24B, 24C, and 24D. As a result, the substrate 102 and the plurality of fin regions F1 protruding over the substrate 102 may be removed around the blocking mask pattern BMP and the protruding portions of the first isolation insulating film 112, which cover the both side surfaces of the blocking mask pattern BMP. Also, the portions of the first isolation insulating film 112, which fill the first trench regions T1, and the etch stop layer ESL may be exposed. In contrast, a portion of the plurality of fin regions F1, which is covered by the blocking mask pattern BMP may not be removed but remain between the etch stop layer ESL and the blocking mask pattern BMP.

In some embodiments, in the resultant structure of FIGS. 24A, 24B, 24C, and 24D, the substrate 102 and the plurality of fin regions F1 protruding from the substrate 102 may be removed by using, for example, an anisotropic dry etching process. As a result, as shown in FIG. 25A, the fin region F1 that remains between the etch stop layer ESL and the blocking mask pattern BMP may have a shape that has a width in the first lateral direction (e.g., X direction) increasing (e.g., gradually and/or monotonically increasing) toward the source/drain region 130 that overlaps the blocking mask pattern BMP in the vertical direction (e.g., Z direction). Each of both sidewalls SW1 of the fin region F1, which remains between the etch stop layer ESL and the blocking mask pattern BMP, are spaced apart from each other in the first lateral direction (e.g., X direction) and may include an inclined surface. A distance between the inclined surface of the sidewall SW1 of the fin region F1 and a central axis of the fin region F1, which extends in the vertical direction (e.g., Z direction), in the X direction may increase toward the source/drain region 130.

Figure 26A:
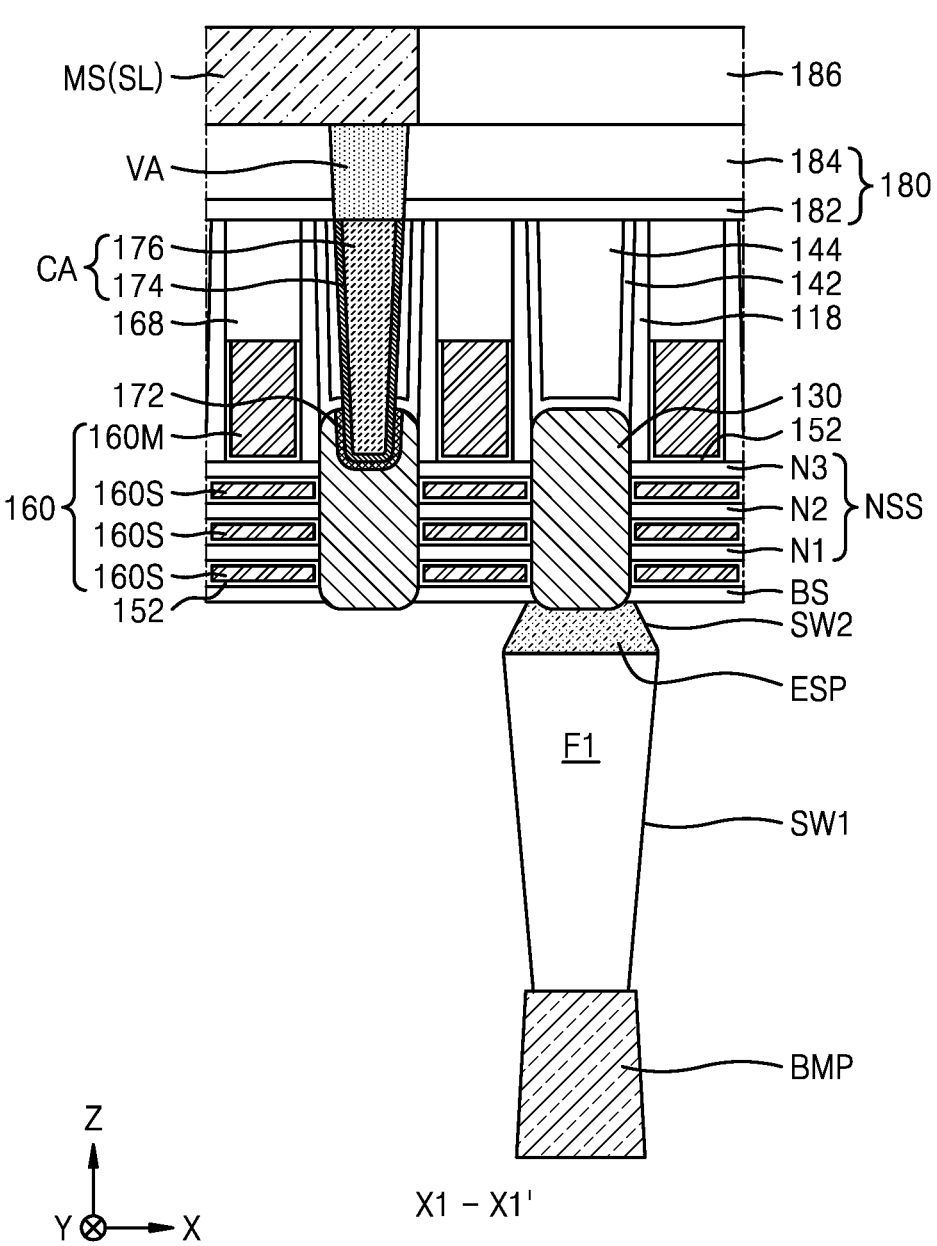
Figure 26B:
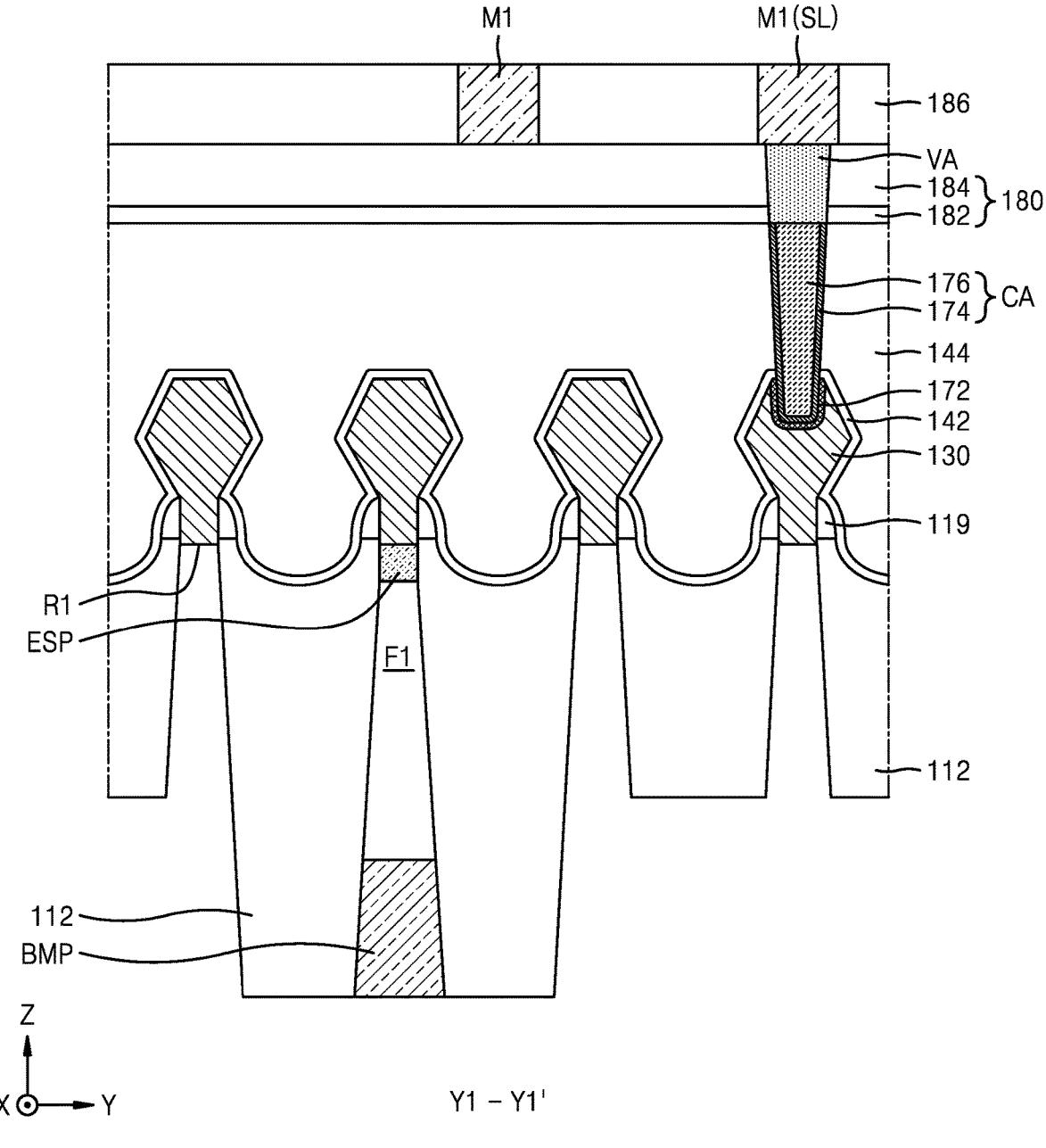
Figure 26C:
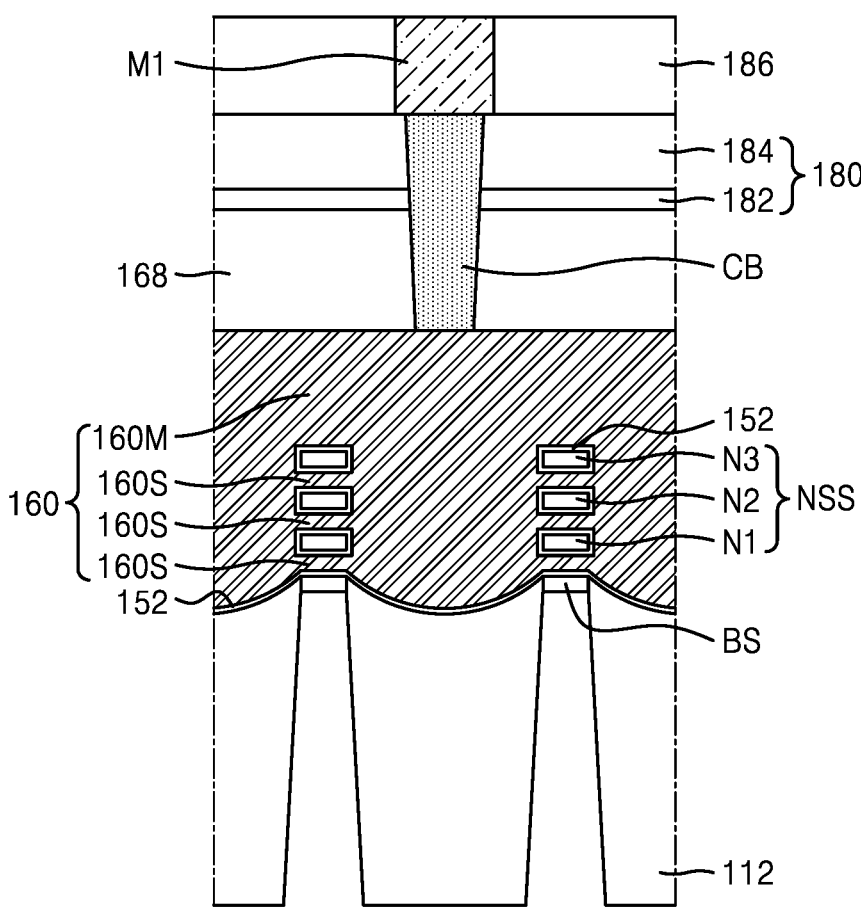
Figure 26C:

Referring to FIGS. 26A, 26B, 26C, the etch stop layer ESL, which is exposed, may be removed from the resultant structure of FIGS. 25A, 25B, and 25C by using an isotropic etching process, and thus, bottom surfaces of a plurality of bottom semiconductor sheets BS and the plurality of source/drain regions 130 may be exposed. In some embodiments, a wet etching process may be performed to isotropically etch the etch stop layer ESL.

Because each of the plurality of bottom semiconductor sheets BS and the plurality of source/drain regions 130 includes a material having a different etch selectivity from a constituent material of the etch stop layer ESL, even when the bottom surface of each of the plurality of bottom semiconductor sheets BS and the plurality of source/drain regions 130 is exposed during the isotropic etching of the etch stop layer ESL, the plurality of bottom semiconductor sheets BS and the plurality of source/drain regions 130 may not be damaged by an isotropic etching atmosphere used to isotropic etch the etch stop layer ESL. During the process of isotropically etching the etch stop layer ESL, the plurality of bottom semiconductor sheets BS and the plurality of source/drain regions 130 may serve as an etch stop layer.

As illustrated in FIGS. 26A and 26B, after the etch stop layer ESL is isotropically etched, an etch stop pattern ESP including a portion of the etch stop layer ESL may remain between the source/drain region 130 and the fin region F1. Due to the isotropic etching atmosphere, the etch stop pattern ESP may have a width (e.g., a width in the X direction) decreasing (e.g., gradually and/or monotonically decreasing) toward the source/drain region 130, and a sidewall SW2 of the etch stop pattern ESP may include an inclined surface.

Figure 27A:
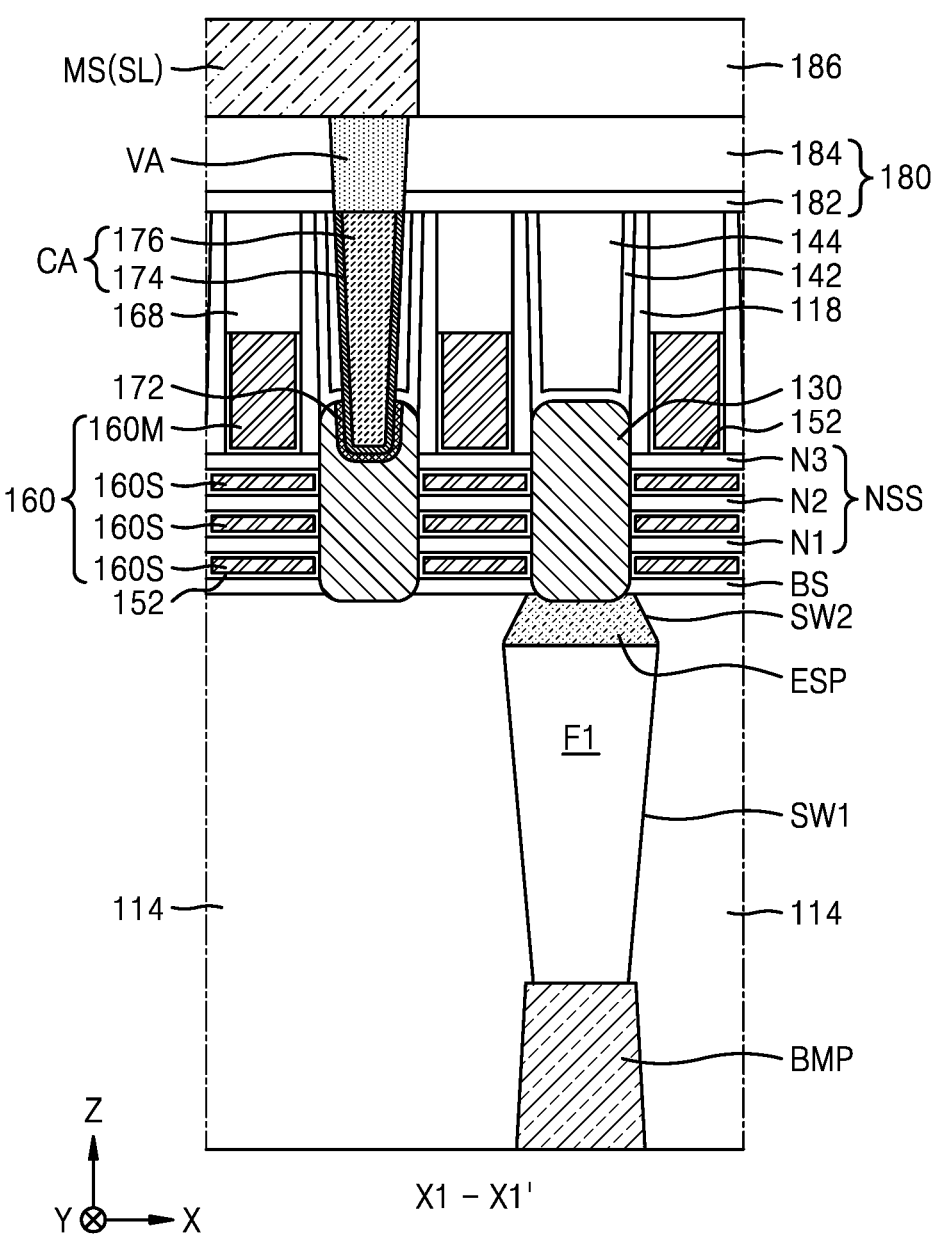
Figure 27B:
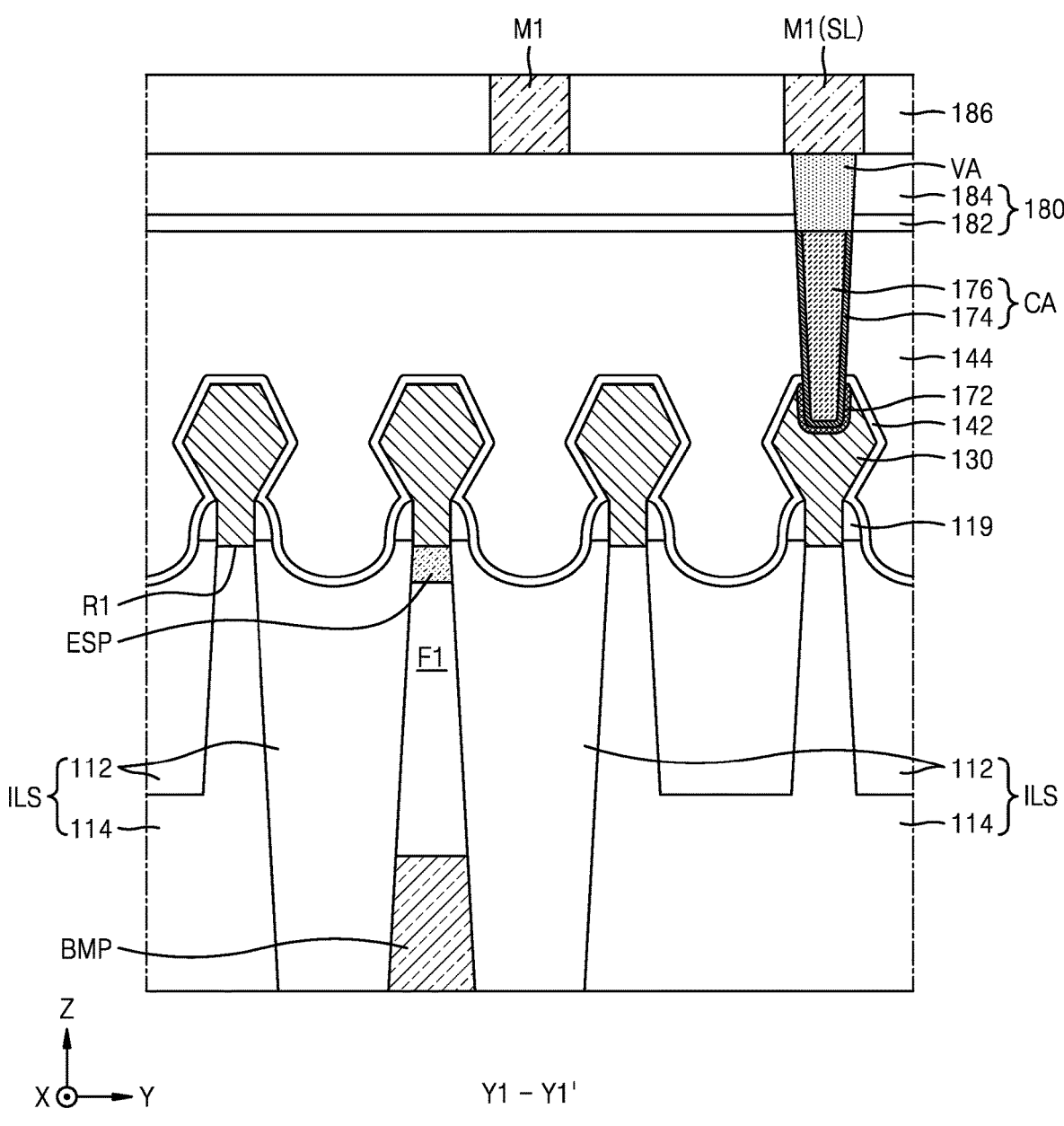
Figure 27C:
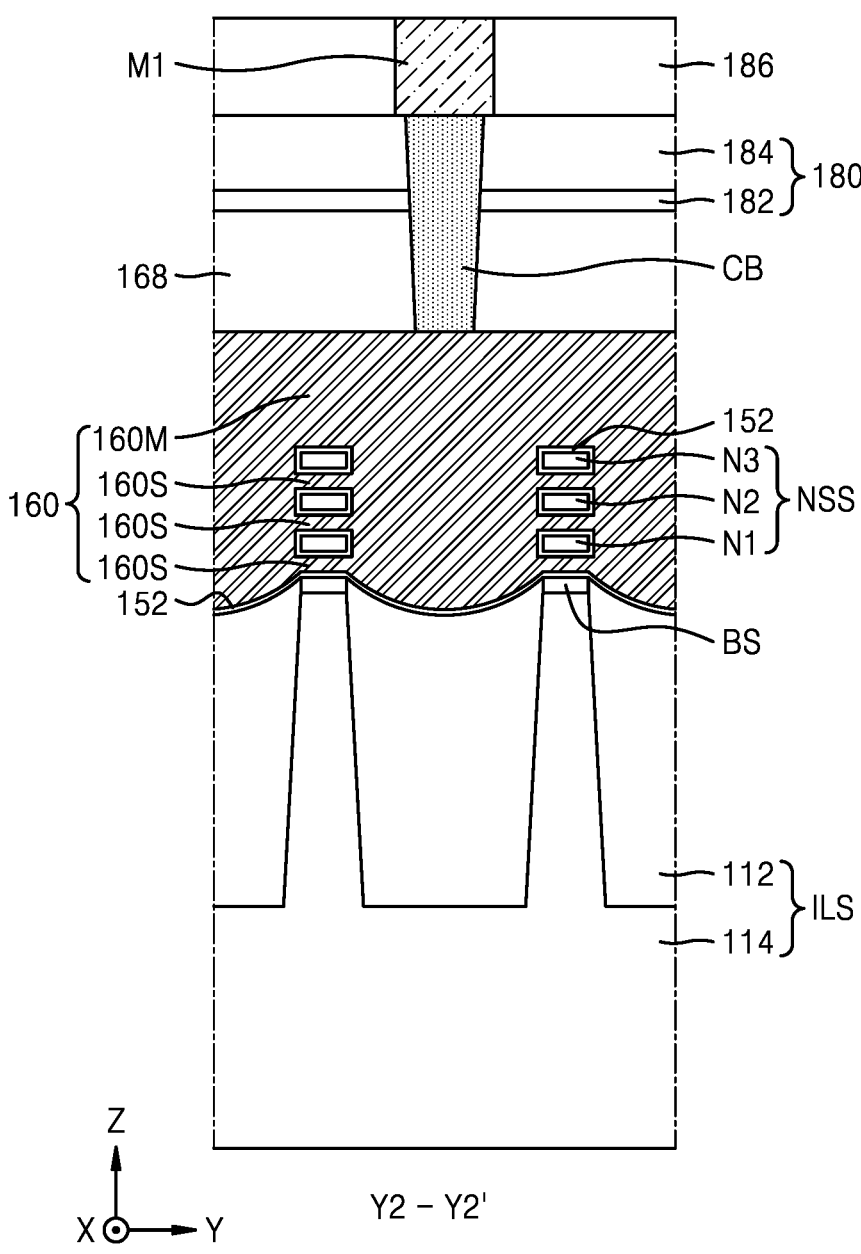

Referring to FIGS. 27A, 27B, and 27C, in the resultant structure of FIGS. 26A, 26B. and 26C, a plurality of second isolation insulating films 114 may be formed to fill spaces that are defined by a plurality of first isolation insulating films 112, the etch stop pattern ESP, the fin region F1, and the blocking mask pattern BMP.

In some embodiments, the formation of the plurality of second isolation insulating films 114 may include forming an insulating film to a sufficient thickness as to fill the spaces defined by the plurality of first isolation insulating films 112, the etch stop pattern ESP, the fin region F1, and the blocking mask pattern BMP in the resultant structure of FIGS. 26A, 26B, and 26C and polishing the obtained resultant structure by, for example, a chemical mechanical polishing (CMP) process using the blocking mask pattern BMP as a polishing stop layer. A constituent material of the insulating film formed to form the plurality of second isolation insulating films 114 may be the same as a constituent material of the plurality of second isolation insulating films 114, which has been described with reference to FIGS. 3A to 3C and 4.

Figure 28A:
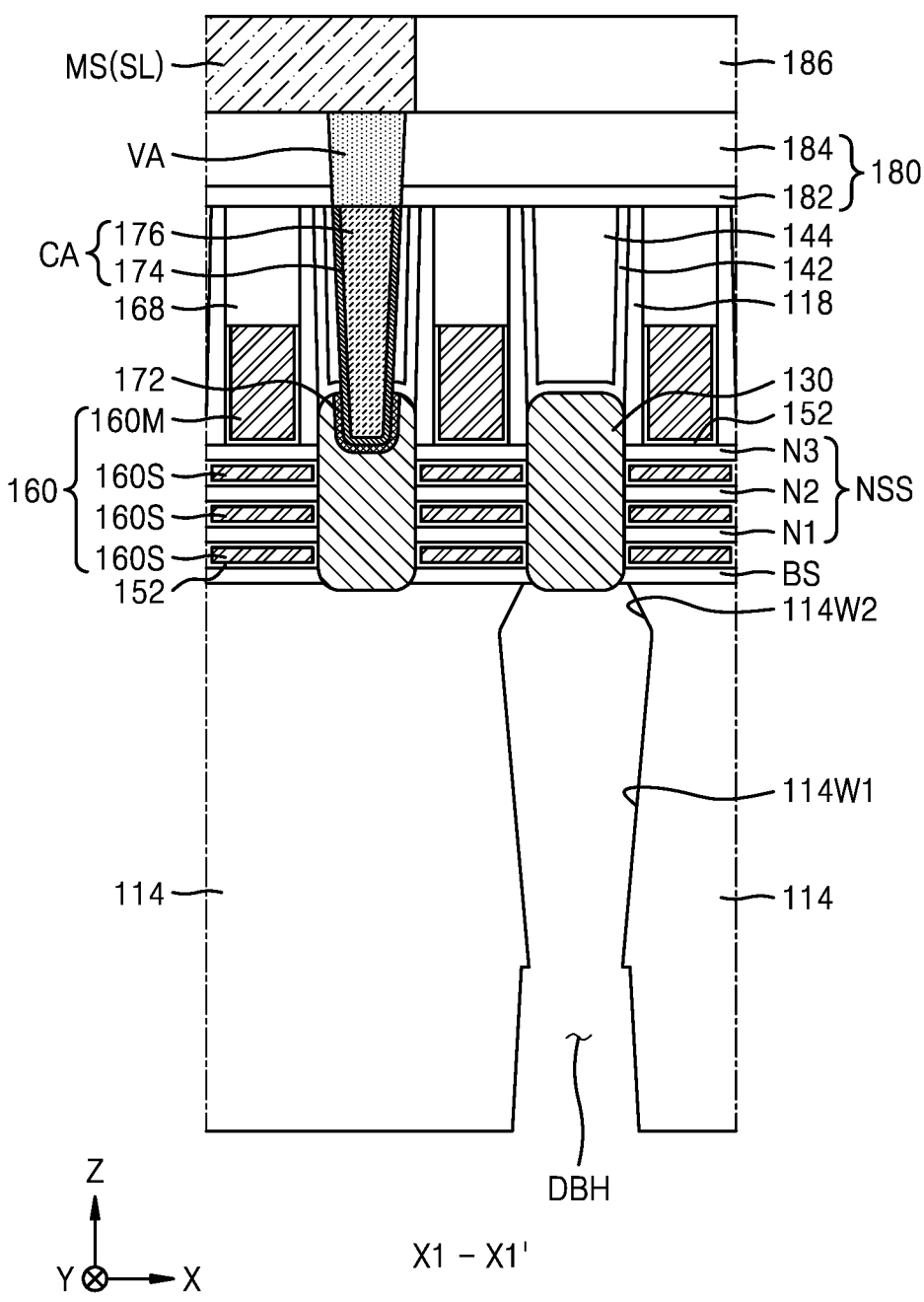
Figure 28B:
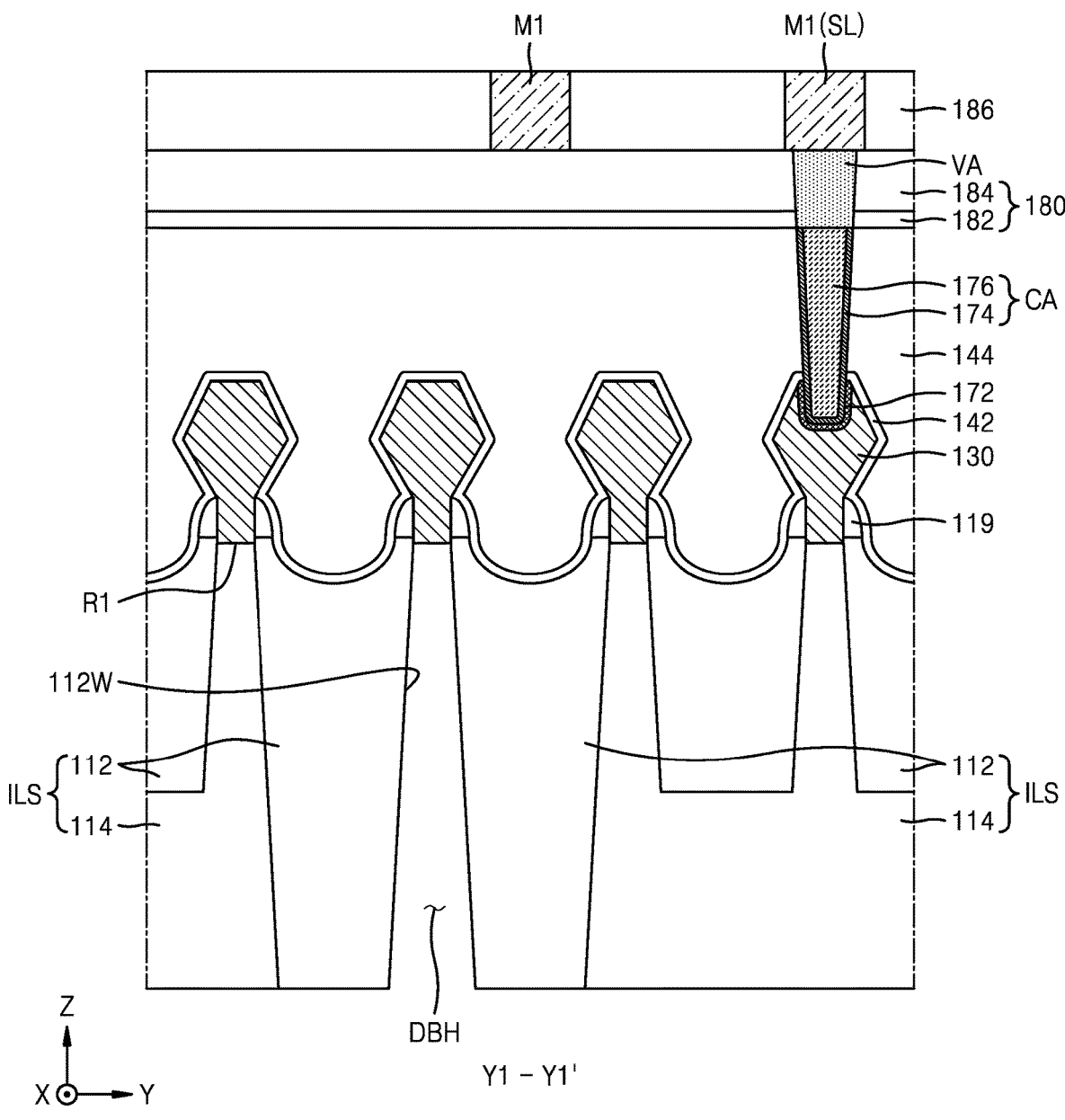

Referring to FIGS. 28A and 28B, the blocking mask pattern BMP, the fin region F1, and the etch stop pattern ESP may be sequentially removed from the resultant structure of FIGS. 27A, 27B, and 27C. Thus, a contact space DBH, which is defined by the plurality of first isolation insulating films 112 and the plurality of second isolation insulating films 114, may be formed. The bottom surface of the source/drain region 130 may be exposed through the contact space DBH.

As shown in FIG. 28A, a sidewall of the second isolation insulating film 114 may be exposed inside the contact space DBH in the first lateral direction (e.g., X direction). The sidewall of the second isolation insulating film 114, which is exposed inside the contact space DBH, may include a first sidewall 114W1 and a second sidewall 114W2 having different slopes from each other. The first sidewall 114W1 of the second isolation insulating film 114 may include an inclined surface. A distance between the inclined surface of the first sidewall 114W1 of the second isolation insulating film 114 and a central axis of the contact space DBH, which extends in the vertical direction (e.g., Z direction), in the X direction may increase toward the source/drain region 130. The second sidewall 114W2 of the second isolation insulating film 114 may include an inclined surface. A distance between the inclined surface of the second sidewall 114W2 of the second isolation insulating film 114 and the central axis of the contact space DBH in the X direction may decrease toward the source/drain region 130.

As shown in FIG. 28B, a sidewall 112W of the first isolation insulating film 112 may be exposed inside the contact space DBH in the second lateral direction (e.g., Y direction). The sidewall 112W of the first isolation insulating film 112, which is exposed inside the contact space DBH, may include an inclined surface. A distance between the inclined surface of the sidewall 112W of the first isolation insulating film 112 and the central axis of the contact space DBH in the Y direction may decrease toward the source/ drain region 130.

Figure 29A:
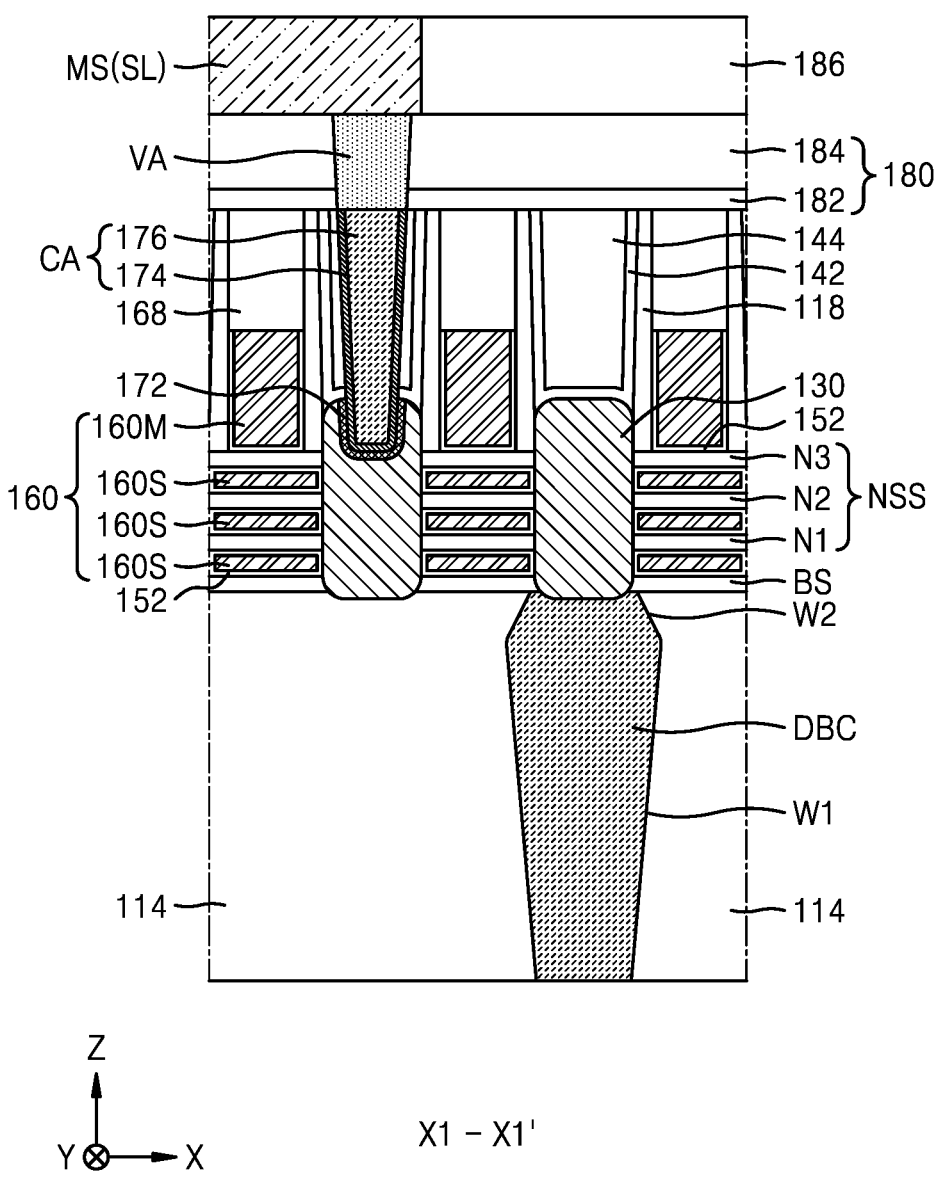
Figure 29B:
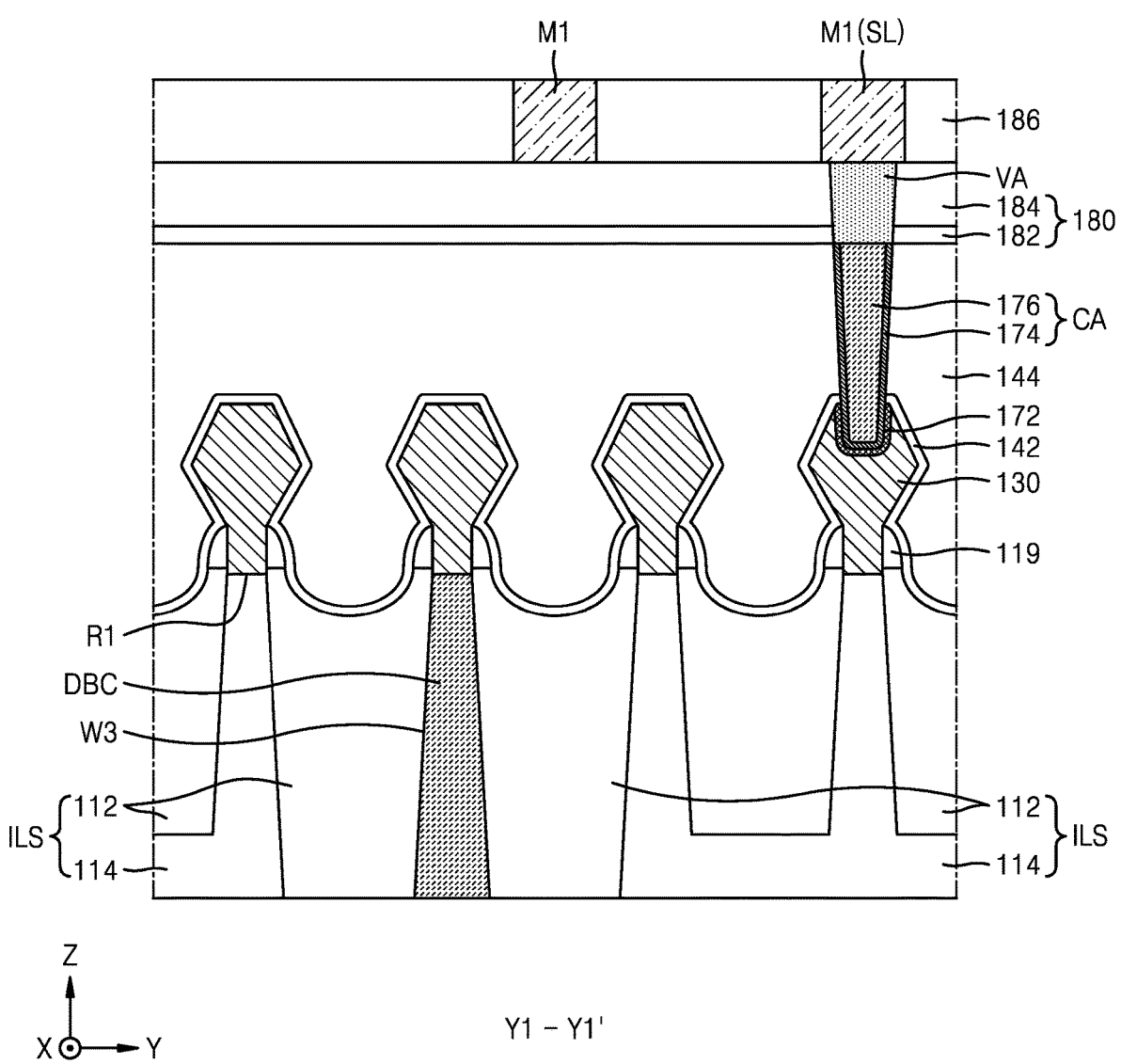

Referring to FIGS. 29A and 29B, in the resultant structure of FIGS. 28A and 28B, a deposition process may be performed to form a conductive structure filling the contact space DBH. The obtained resultant structure may be partially polished to remove a portion of each of the plurality of first isolation insulating films 112 and the plurality of second isolation insulating films 114 and a portion of the conductive structure. Thus, the backside contact structure DBC may remain inside the contact space DBH.

In the first lateral direction (e.g., X direction), a first sidewall W1 and a second sidewall W2 of the backside contact structure DBC may respectively have shapes corresponding to the first sidewall (refer to 114W1 in FIG. 28A) and the second sidewall (refer to 114W2 in FIG. 28A) of the second isolation insulating film 114. Accordingly, as described above with reference to FIGS. 3A and 4, the first sidewall W1 of the backside contact structure DBC may include an inclined surface. A distance between the inclined surface of the first sidewall W1 and a central axis CX of the backside contact structure DBC, which extends in the vertical direction (e.g., Z direction), in the X direction may increase toward the source/drain region 130. Also, the second sidewall W2 of the backside contact structure DBC may include an inclined surface. A distance between the inclined surface of the second sidewall W2 and the central axis CX of the backside contact structure DBC in the X direction may decrease toward the source/drain region 130.

In the second lateral direction (e.g., Y direction), the third sidewall W3 of the backside contact structure DBC may have a shape corresponding to a shape of the sidewall (refer to 112W in FIG. 28B) of the first isolation insulating film 112. Accordingly, as described above with reference to FIGS. 3B and 5, the third sidewall W3 of the backside contact structure DBC may include an inclined surface. A distance between the inclined surface of the third sidewall W3 and the central axis CX of the backside contact structure DBC in the X direction may decrease toward the source/ drain region 130.

Afterwards, as illustrated in FIGS. 3A to 3C, a backside insulating film 109 may be formed to cover the backside contact structure DBC, the plurality of first isolation insulating films 112, and the plurality of second isolation insulating films 114, which are exposed in the resultant structure of FIGS. 29A and 29B. A backside power rail BPW may be formed to pass through the backside insulating film 109 in the vertical direction (e.g., Z direction) and contact one end of the backside contact structure DBC. Thus, the IC device 100 described with reference to FIGS. 2 to 5 may be manufactured.

Although the method of manufacturing the IC device 100 shown in FIGS. 2 to 5 has been described with reference to FIGS. 11A to 29B, it will be understood that the IC devices 200, 300, 400, 500, and 600 shown in FIGS. 6 to 10 and IC devices having variously changed structures may be manufactured by applying various modifications and changes to the processes described with reference to FIGS. 2 to 5 within the scope of the inventive concept.

For example, to manufacture the IC device 200 shown in FIG. 6, the conductive barrier pattern 194 and the contact plug 196 may be sequentially formed inside the contact space DBH in the process described with reference to FIGS. 29A and 29B.

To manufacture the IC device 300 shown in FIG. 7, after the insulating spacer 190 is first formed inside the contact space DBH in the process described with reference to FIGS. 29A and 29B, the conductive barrier pattern 194 and the contact plug 196 may be sequentially formed inside the contact space DBH defined by the insulating spacer 190.

To manufacture the IC device 400 shown in FIG. 8, the contact space DBH may be formed as described with reference to FIGS. 28A and 28B, and thus, the bottom surface of the source/drain region 130 may be exposed through the contact space DBH. Thereafter, a portion of the source/drain region 130 may be etched from the exposed bottom surface of the source/drain region 130, and thus, a concave surface corresponding to the contact surface VS4 of the backside contact structure DBC4 shown in FIG. 8 may be formed in the source/drain region 130, which is exposed. Thereafter, the processes described with reference to FIGS. 29A and 29B may be performed.

In addition, the IC devices 500 and 600 shown in FIGS. 9 and 10 may be manufactured by selectively combining, as needed, the above-described processes of the method of manufacturing the IC device 100, which has been described with reference to FIGS. 2 to 5, and the methods of manufacturing the IC devices 200, 300, and 400 shown in FIGS. 6 to 8.

It is noted that aspects of the invention described with respect to one embodiment, may be incorporated in a different embodiment although not specifically described relative thereto. That is, all embodiments and/or features of any embodiment can be combined in any way and/or combination.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is "covering" or "surrounding" or "filling" another element or region may completely or partially cover or surround or fill the other element or region. Further, the term "and/or" includes any and all combinations of one or more of the associated listed items.

While the inventive concept has been particularly shown and described with reference to some example embodiments thereof, it will be understood that various changes in form and details may be made therein without departing from the scope of the following claims. Accordingly, the above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents and shall not be restricted or limited by the foregoing detailed description

What is claimed is:

1. An integrated circuit device comprising:
an insulating structure;
a source/drain region on the insulating structure;
a pair of bottom semiconductor sheets on the insulating structure, the pair of bottom semiconductor sheets being spaced apart from each other with the source/drain region therebetween in a first horizontal direction;
a pair of channel regions spaced apart from the insulating structure with the pair of bottom semiconductor sheets therebetween;
a pair of gate lines respectively extending on the pair of channel regions on the pair of bottom semiconductor sheets, the pair of gate lines extending longitudinally in a second horizontal direction, wherein the second horizontal direction is perpendicular to the first horizontal direction; and
a backside contact structure extending through the insulating structure in a vertical direction and contacting a bottom surface of the source/drain region, the backside contact structure comprising a first contact portion that has a width in the first horizontal direction increasing toward the source/drain region and a second contact portion that has a width in the first horizontal direction decreasing toward the source/drain region,
wherein the first contact portion directly contacts the second contact portion, and
wherein a width of each of the first contact portion and the second contact portion in the second horizontal direction decrease toward the source/drain region.

2. The integrated circuit device of claim 1, wherein the the second contact portion is in contact with the source/drain region, and
the first contact portion is spaced apart from the source/drain region with the second contact portion therebetween in the vertical direction.

3. The integrated circuit device of claim 1, wherein the first contact portion of the backside contact structure comprises a first sidewall in contact with the insulating structure, the first sidewall comprises a first inclined surface, and a distance between the first inclined surface and a central axis of the backside contact structure in the first horizontal direction increases toward the source/drain region, wherein the central axis of the backside contact structure extends in the vertical direction, and
the second contact portion of the backside contact structure comprises a second sidewall in contact with the insulating structure in the first horizontal direction, the second sidewall comprises a second inclined surface, and a distance between the second inclined surface and the central axis of the backside contact structure in the first horizontal direction decreases toward the source/drain region.

4. The integrated circuit device of claim 1, wherein the first contact portion of the backside contact structure comprises a first sidewall in contact with the insulating structure,
the second contact portion of the backside contact structure comprises a second sidewall in contact with the insulating structure,
the backside contact structure comprises a top surface facing the source/drain region and a bottom surface opposite the top surface thereof, and
in the vertical direction, a distance from the bottom surface of the backside contact structure to an interface between the first sidewall and the second sidewall is greater than a distance from the top surface of the backside contact structure to the interface between the first sidewall and the second sidewall.

5. The integrated circuit device of claim 1, wherein the insulating structure comprises:
a pair of first isolation insulating films in contact with both sidewalls of the backside contact structure in the second horizontal direction; and
a pair of second isolation insulating films in contact with both sidewalls of the backside contact structure in the first horizontal direction, the pair of second isolation insulating films extending longitudinally in the first horizontal direction,
wherein a top surface of each of the pair of second isolation insulating films is in contact with a bottom surface of a respective one of the pair of bottom semiconductor sheets.

6. The integrated circuit device of claim 1, further comprising:
a backside insulating film spaced apart from the pair of bottom semiconductor sheets with the insulating structure therebetween in the vertical direction; and
a backside power rail that is connected to the backside contact structure and extends through the backside insulating film in the vertical direction.

7. The integrated circuit device of claim 1, further comprising a pair of gate dielectric films between the pair of gate lines and the pair of channel regions,
wherein each of the pair of gate dielectric films comprises a portion between a respective one of the pair of gate lines and a respective one of the pair of bottom semiconductor sheets.

8. The integrated circuit device of claim 1, wherein each of the pair of channel regions comprises at least one nanosheet, and
each of the pair of gate lines extends on the at least one nanosheet.

9. The integrated circuit device of claim 1, wherein the source/drain region comprises a blocking layer in contact with the backside contact structure and a main body layer spaced apart from the backside contact structure, and
the blocking layer and the main body layer comprise silicon germanium (SiGe) layers having different Ge content ratios from each other, and a Ge content ratio of the blocking layer is lower than a Ge content ratio of the main body layer.

10. The integrated circuit device of claim 1, wherein the source/drain region comprises a silicon carbide (SiC) layer, and the backside contact structure is in contact with the SiC layer.

11. An integrated circuit device comprising:
an insulating structure;
a plurality of bottom semiconductor sheets on the insulating structure, the plurality of bottom semiconductor sheets being spaced apart from each other;
a plurality of channel regions on the plurality of bottom semiconductor sheets, the plurality of channel regions overlapping the plurality of bottom semiconductor sheets in a vertical direction, respectively;
a plurality of source/drain regions respectively on a pair of bottom semiconductor sheets of the plurality of bottom semiconductor sheets, the pair of bottom semiconductor sheets being adjacent to each other in a first horizontal direction, and each of the plurality of source/drain regions being in contact with a respective one of the plurality of channel regions;

a plurality of gate lines extending on the plurality of channel regions; and a backside contact structure extending through the insulating structure in the vertical direction and contacting a bottom surface of a first source/drain region of the plurality of source/drain regions, the backside contact structure comprising a first contact portion that has a width in the first horizontal direction increasing toward the first source/drain region and a second contact portion that has a width in the first horizontal direction decreasing toward the first source/drain region, wherein the first contact portion is spaced apart from the first source/drain region with the second contact portion therebetween in the vertical direction, wherein an interface between the first contact portion and the second contact portion is spaced apart from the first source/drain region in the vertical direction.

12. The integrated circuit device of claim 11, further comprising a front-side contact structure that is connected to a second source/drain region of the plurality of source/drain regions and is spaced apart from the first source/drain region, wherein the front-side contact structure is spaced apart from the insulating structure with the second source/drain region therebetween in the vertical direction.

13. The integrated circuit device of claim 11, wherein each of the plurality of channel regions comprises at least one nanosheet, wherein each of the plurality of gate lines comprises:

a main gate portion on the at least one nanosheet; and a sub-gate portion between a respective one of the plurality of bottom semiconductor sheets and the at least one nanosheet.

14. The integrated circuit device of claim 11, wherein the first contact portion directly contacts the second contact portion, and a width of each of the first contact portion and the second contact portion in a second horizontal direction decreases toward the first source/drain region, and the second horizontal direction is perpendicular to the first horizontal direction.

15. The integrated circuit device of claim 11, wherein the first contact portion of the backside contact structure comprises a first sidewall in contact with the insulating structure, and the first sidewall comprises a first inclined surface, and a distance between the first inclined surface and a central axis of the backside contact structure in the first horizontal direction increases toward the first source/drain region, wherein the central axis of the backside contact structure extends in the vertical direction, and the second contact portion of the backside contact structure comprises a second sidewall in contact with the insulating structure in the first horizontal direction, the second sidewall comprises a second inclined surface, and a distance between the second inclined surface and the central axis of the backside contact structure in the first horizontal direction decreases toward the first source/drain region.

16. The integrated circuit device of claim 11, wherein the first contact portion of the backside contact structure comprises a first sidewall in contact with the insulating structure, the second contact portion of the backside contact structure comprises a second sidewall in contact with the insulating structure, the interface between the first contact portion and the second contact portion comprises an interface between the first sidewall and the second sidewall, the backside contact structure comprises a top surface facing the first source/drain region and a bottom surface opposite the top surface thereof, and in the vertical direction, a distance from the bottom surface of the backside contact structure and the interface between the first sidewall and the second sidewall is greater than a distance from the top surface of the backside contact structure and the interface between the first sidewall and the second sidewall.

17. The integrated circuit device of claim 11, further comprising:

a backside insulating film spaced apart from the plurality of bottom semiconductor sheets with the insulating structure therebetween in the vertical direction; and a backside power rail that is connected to the backside contact structure and extends through the backside insulating film in the vertical direction.

18. An integrated circuit device comprising:

an insulating structure;

a plurality of source/drain regions on the insulating structure;

a plurality of nanosheet stacks, each of the plurality of nanosheet stacks comprising at least one nanosheet connected to at least one source/drain region of the plurality of source/drain regions;

a plurality of bottom semiconductor sheets between the insulating structure and the plurality of nanosheet stacks, the plurality of bottom semiconductor sheets being spaced apart from each other;

a plurality of gate lines on the plurality of bottom semiconductor sheets, each of the plurality of gate lines extending on the at least one nanosheet of a respective one of the plurality of nanosheet stacks; and a backside contact structure extending through the insulating structure in a vertical direction, the backside contact structure being in contact with a bottom surface of a first source/drain region of the plurality of source/drain regions, and the backside contact structure comprising a first contact portion that has a width in a first horizontal direction increasing toward the first source/drain region and a second contact portion that has a width in the first horizontal direction decreasing toward the first source/drain region, wherein the backside contact structure has a greatest width in the first horizontal direction at an interface between the first contact portion and the second contact portion, wherein a bottom surface of a second source/drain region that is one of the plurality of source/drain regions and is spaced apart from the first source/drain region is in contact with the insulating structure.

19. The integrated circuit device of claim 18, wherein the first contact portion of the backside contact structure comprises a first sidewall in contact with the insulating structure, the first sidewall comprises a first inclined surface, and a distance between the first inclined surface and a central axis of the backside contact structure in the first horizontal direction increases toward the first source/drain region, wherein the central axis of the backside contact structure extends in the vertical direction, and the second contact portion of the backside contact structure comprises a second sidewall in contact with the insulating structure, the second sidewall comprises a second inclined surface, and a distance between the second inclined surface and the central axis of the backside contact structure in the first horizontal direction decreases toward the first source/drain region, and a width of each of the first contact portion and the second contact portion in a second horizontal direction decrease toward the first source/drain region, wherein the second horizontal direction is perpendicular to the first horizontal direction.

* * * * *